(12) United States Patent
Ahn et al.

(10) Patent No.: US 11,296,727 B2
(45) Date of Patent: *Apr. 5, 2022

(54) METHOD AND APPARATUS FOR CHANNEL ENCODING AND DECODING IN COMMUNICATION OR BROADCASTING SYSTEM

(71) Applicant: Samsung Electronics Co., Ltd., Suwon-si (KR)

(72) Inventors: Seokki Ahn, Suwon-si (KR); Kyungjoong Kim, Suwon-si (KR); Seho Myung, Seoul (KR); Hongsil Jeong, Suwon-si (KR); Min Jang, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/859,953

(22) Filed: Apr. 27, 2020

(65) Prior Publication Data

US 2020/0259507 A1 Aug. 13, 2020

Related U.S. Application Data

(63) Continuation of application No. 15/971,877, filed on May 4, 2018, now Pat. No. 10,680,652.

(30) Foreign Application Priority Data

May 4, 2017 (KR) .......... 10-2017-0057072
Jun. 8, 2017 (KR) .......... 10-2017-0071906
Jun. 14, 2017 (KR) .......... 10-2017-0075159

(51) Int. Cl.
*H03M 13/00* (2006.01)
*H03M 13/25* (2006.01)
(Continued)

(52) U.S. Cl.
CPC ....... *H03M 13/255* (2013.01); *H03M 13/036* (2013.01); *H03M 13/116* (2013.01);
(Continued)

(58) Field of Classification Search
CPC ............ H03M 13/255; H03M 13/036; H03M 13/1111; H03M 13/116; H03M 13/1188;
(Continued)

(56) References Cited

U.S. PATENT DOCUMENTS 8,261,152 B2 9/2012 Myung et al.
9,503,124 B2 11/2016 Sunwoo et al.
(Continued)

FOREIGN PATENT DOCUMENTS

CN 1960190 A 5/2007
CN 101686061 A 3/2010
(Continued)

OTHER PUBLICATIONS

ISA/KR, International Search Report for International Application No. PCT/KR2018/005220, dated Aug. 22, 2018, 4 pages.
(Continued)

*Primary Examiner* — Christine T. Tu

(57) ABSTRACT

The present disclosure relates to a pre-5th-Generation (5G) or 5G communication system to be provided for supporting higher data rates Beyond 4th-Generation (4G) communication system such as Long Term Evolution (LTE). A channel encoding method in a communication or broadcasting system includes identifying an input bit size, determining a block size (Z), determining an LDPC sequence for LDPC encoding, and performing the LDPC encoding based on the LDPC sequence and the block size.

24 Claims, 81 Drawing Sheets

(51) Int. Cl.
*H04L 1/00* (2006.01)
*H03M 13/29* (2006.01)
*H03M 13/11* (2006.01)
*H03M 13/03* (2006.01)
*H03M 13/09* (2006.01)

(52) U.S. Cl.
CPC .... *H03M 13/1111* (2013.01); *H03M 13/1188* (2013.01); *H03M 13/2906* (2013.01); *H03M 13/618* (2013.01); *H03M 13/6356* (2013.01); *H03M 13/6393* (2013.01); *H03M 13/6516* (2013.01); *H04L 1/0009* (2013.01); *H04L 1/0041* (2013.01); *H04L 1/0045* (2013.01); *H04L 1/0057* (2013.01); *H04L 1/0068* (2013.01); *H04L 1/0075* (2013.01); *H03M 13/09* (2013.01)

(58) Field of Classification Search
CPC .......... H03M 13/2906; H03M 13/618; H03M 13/6356; H03M 13/6393; H03M 13/6516; H03M 13/09; H04L 1/0009; H04L 1/0041; H04L 1/0045; H04L 1/0057; H04L 1/0068; H04L 1/0075
See application file for complete search history.

(56) References Cited

U.S. PATENT DOCUMENTS

| | | | |
|---|---|---|---|
| 10,361,724 | B2 | 7/2019 | Yamamoto et al. |
| 10,484,134 | B2* | 11/2019 | Kim ...................... H04L 1/0057 |
| 10,623,139 | B2* | 4/2020 | Myung ................. H04L 1/0058 |
| 10,680,652 | B2* | 6/2020 | Ahn ................... H03M 13/1188 |
| 2006/0020872 | A1 | 1/2006 | Richardson et al. |
| 2008/0276156 | A1* | 11/2008 | Gunnam ............. H03M 13/116 714/801 |
| 2009/0070652 | A1 | 3/2009 | Myung et al. |
| 2010/0269009 | A1 | 10/2010 | Okamura et al. |
| 2011/0103580 | A1 | 5/2011 | Hazay et al. |
| 2011/0239077 | A1 | 9/2011 | Bai et al. |
| 2011/0289375 | A1 | 11/2011 | Jiang et al. |
| 2012/0173948 | A1 | 7/2012 | Myung et al. |
| 2013/0239164 | A1 | 9/2013 | Kolze et al. |
| 2014/0122961 | A1 | 5/2014 | Jeong et al. |
| 2014/0372825 | A1 | 12/2014 | Jeong et al. |
| 2015/0046765 | A1* | 2/2015 | Shinohara ......... H03M 13/2906 714/752 |
| 2018/0041228 | A1 | 2/2018 | Park et al. |
| 2019/0190544 | A1* | 6/2019 | Li ........................ H04L 1/0009 |

FOREIGN PATENT DOCUMENTS

| | | |
|---|---|---|
| CN | 101904101 A | 12/2010 |
| KR | 10-0905813 B1 | 7/2009 |
| KR | 10-2012-0078931 A | 7/2012 |
| KR | 10-1413783 B1 | 7/2014 |
| WO | 2016137254 A1 | 9/2016 |

OTHER PUBLICATIONS

The First Office Action dated Jun. 2, 2021, in connection with Chinese Application No. 201880029572.9, 20 pages.
Decision of Patent dated Jun. 11, 2021, in connection with Korean Application No. 10-2017-0075159, 4 pages.
Examination report dated Jan. 25, 2022, in connecton with Indian Application No. 201947044627, 5 pages.

* cited by examiner

FIG. 11A

| | | | | | | | | | | | | | | |
|---|---|---|---|---|---|---|---|---|---|---|---|---|---|---|
| 142 | | 196 | | | 77 | | 26 | | 197 | 1 | 0 | | | |
| 75 | 64 | | | | | | 76 | | | 0 | 0 | | | |
| 213 | 97 | | | | 205 | | | | 242 | | 0 | 0 | | |
| | 238 | 202 | 232 | 2 | 117 | 199 | | 175 | | 0 | | | 0 | 0 |
| 41 | | 251 | | 65 | 31 | 2 | 63 | 253 | | | | | 0 | 0 |
| 68 | 171 | | 222 | | | | | 182 | 182 | | | | 0 | 0 |
| 3 | 212 | | 180 | 4 | | | | | 1 | | | | | 0 |
| | 243 | | | | | 81 | | 255 | | | | | | |
| 46 | | | | 94 | | | 220 | 3 | | | | | | |
| 3 | 43 | 32 | | 5 | | | | | | | | | | |
| 218 | | | 189 | | | 63 | | | | | | | | |
| 84 | 106 | | | | 2 | | 99 | | | | | | | |
| 185 | 254 | | | 29 | | | | 60 | | | | | | |
| | 200 | | 60 | | | | | | 31 | | | | | |
| 187 | 232 | | | | | | | | | | | 128 | | |
| 185 | | | | 74 | | | | 46 | | 50 | | | | |
| 251 | | | | | | 207 | | | 59 | | | | | |
| | 242 | | | | | | | 243 | | | | 35 | | |
| 67 | | 67 | | | | 162 | | | | | | | | |
| 227 | | | 208 | | | | 49 | | | 209 | | | | |
| 192 | 208 | | | 226 | | | | | | | | | | |
| 211 | | | 33 | | | | | | | | | 194 | | |
| | 255 | | | | | | | | | | | | 230 | |
| 3 | | | | | | 9 | 61 | | | | | | | |
| 120 | | | | | | | | | 191 | | | | 17 | |
| 153 | | | | | | | 198 | | 3 | | | | | |
| 214 | | | | | | | | | 89 | | | 198 | | |
| | 253 | | | | | 63 | | | | | | 155 | | |
| 90 | | | | 95 | | | 98 | | | | | | | |
| 63 | | | | | | | | | | | | | | 58 |
| | | | | | | 27 | | | 29 | | 131 | | | |
| | 119 | | | | | | 255 | | | | | | | |
| | | | | | | 114 | | | 59 | | | 194 | | |
| 12 | 127 | | | | | | | | | | | | | |
| | | 251 | | | 157 | | | | | | | 26 | | |
| | 188 | | | 93 | | | | | | | | | | |
| | | | | | | | 23 | | 2 | | 1 | | | |
| 217 | | | 204 | | | | | | | | | | | |
| | | | | | 255 | | | | | | | 217 | 230 | |
| | | | | | | 63 | | 103 | | 14 | | | | |
| | 190 | | | | | | | | 90 | | | | | |
| | | | 74 | | | | 45 | | 54 | | | | | |

FIG. 12A

| | | | | | | | | | | | | | | | | | |
|---|---|---|---|---|---|---|---|---|---|---|---|---|---|---|---|---|---|
| 14 | | | 4 | 5 | | 1 | 0 | | | | | | | | | | |
| 11 | | | | 9 | 12 | | 0 | 0 | | | | | | | | | |
| | 6 | | 0 | 6 | | 0 | | 0 | 0 | | | | | | | | |
| | | 11 | 15 | | | | | 0 | 0 | | | | | | | | |
| 0 | 13 | 8 | | | 5 | 1 | | | 0 | | | | | | | | |
| | 5 | | 1 | | 1 | | | | | 0 | | | | | | | |
| 2 | | | | | | | | | 0 | | 0 | | | | | | |
| | | | | 13 | | | | 13 | | 1 | | 0 | | | | | |
| | | | | 9 | | | | 14 | | 0 | | | 0 | | | | |
| 2 | | | | | | | | 15 | | 13 | | | | 0 | | | |
| 1 | | 0 | | | 3 | | | | | | | | | 0 | | | |
| | | | | | 11 | 5 | | | | | | | | | 0 | | |
| | | 9 | 11 | | | | | | | | | | | | | 0 | |
| | | | | | 15 | | | | 13 | | | | | | | | 0 |
| 11 | | | | | 15 | | | | | | | | | | | | |
| | | 15 | | | | 13 | | | | | | | | | | | |
| 0 | 1 | | | | | | | | | | | | | | | | |
| | | 14 | | | 7 | | | | | | | | | | | | |
| | 6 | | | | | | | 10 | | | | | | | | | |
| 1 | 4 | | | | | | | | | | | | | | | | |
| | | | | | | 9 | | | | | | | | | | | |
| | | | | | | 15 | 7 | | | | | | | | | | |
| | 4 | | | 4 | | | | | | | | | | | | | |
| | | | 1 | | | 14 | | | | | | | | | | | |
| 7 | | | | | | 0 | | | | | | | | | | | |
| 12 | | | | | 15 | | | | | | | | | | | | |
| | | | 13 | | 15 | | | | | | | | | | | | |
| | | 2 | | 7 | | | | | | | | | | | | | |
| 15 | | | | 1 | | | | | | | | | | | | | |
| 2 | | | 14 | | | | | | | | | | | | | | |
| 7 | | | | 15 | | | | | | | | | | | | | |
| 13 | | | | | 12 | | | | | | | | | | | | |
| | | | | | 2 | 15 | | | | | | | | | | | |
| 15 | | | 0 | | | | 13 | | | | | | | | | | |
| | 10 | | | 6 | | | | | | | | | | | | | |
| | | | | 15 | 8 | | | | | | | | | | | | |
| | | | 12 | | | | 15 | | | | | | | | | | |
| | | | | 6 | | | 12 | | | | | | | | | | |
| | | | | | 15 | 10 | | | | | | | | | | | |
| | | | | | 9 | 2 | | | | | | | | | | | |
| | | 12 | | 2 | | | | | | | | | | | | | |
| | 5 | 0 | | | | | | | | | | | | | | | |
| | 11 | | | | | 4 | | | | | | | | | | | |
| | | 7 | | 8 | | | | | | | | | | | | | |
| 15 | 13 | | | | | | | | | | | | | | | | |
| 2 | | | 7 | | 4 | | | | | | | | | | | | |
| | | 12 | | | 13 | | | | | | | | | | | | |
| 2 | | 0 | | | | | | | | | | | | | | | |
| | | 0 | | 3 | 8 | | | | | | | | | | | | |

FIG. 13A

| C1 | C2 | C3 | C4 | C5 | C6 | C7 | C8 | C9 | C10 | C11 | C12 | C13 | C14 | C15 | C16 |
|---|---|---|---|---|---|---|---|---|---|---|---|---|---|---|---|
| 6 |  | 7 |  | 1 | 1 | 0 |  |  |  |  |  |  |  |  |  |
| 15 |  |  | 15 |  |  | 0 | 0 |  |  |  |  |  |  |  |  |
|  | 10 |  |  | 5 | 0 |  | 0 | 0 |  |  |  |  |  |  |  |
|  |  | 8 |  | 6 |  |  |  | 0 | 0 |  |  |  |  |  |  |
| 14 |  | 8 | 11 |  | 1 |  |  |  | 0 |  |  |  |  |  |  |
| 5 |  |  |  |  |  | 4 |  |  | 0 |  |  |  |  |  |  |
| 1 |  |  |  |  |  | 6 |  | 13 |  |  | 0 |  |  |  |  |
|  |  |  | 0 | 9 |  |  |  |  |  |  | 0 |  |  |  |  |
|  |  |  |  | 11 |  |  | 9 |  |  |  |  | 0 |  |  |  |
|  |  |  |  | 4 |  | 13 |  |  |  |  |  |  | 0 |  |  |
|  | 11 |  |  |  | 2 |  |  |  | 13 |  |  |  |  | 0 |  |
| 5 |  |  |  |  | 5 |  |  |  |  |  |  |  | 0 |  |  |
|  |  | 13 |  |  | 12 |  |  |  |  |  |  |  |  | 0 |  |
|  |  |  | 5 |  |  | 8 |  |  |  |  |  |  |  |  | 0 |
|  |  |  |  | 7 |  |  | 3 |  |  |  |  |  |  |  | 0 |
|  |  | 3 |  |  |  | 6 |  |  |  |  |  |  |  |  |  |
|  |  |  | 2 |  |  |  | 2 |  |  |  |  |  |  |  |  |
|  |  |  | 10 |  |  |  |  | 7 |  |  |  |  |  |  |  |
|  | 5 |  |  |  |  |  |  |  |  |  |  |  |  |  |  |
|  |  | 12 |  |  | 3 |  |  |  |  |  |  |  |  |  |  |
|  |  |  |  | 5 |  |  |  | 10 |  |  |  |  |  |  |  |
|  |  |  |  |  |  | 15 |  | 10 |  |  |  |  |  |  |  |
|  |  |  |  |  |  |  | 9 | 5 |  |  |  |  |  |  |  |
|  |  |  |  |  |  |  |  | 7 | 15 |  |  |  |  |  |  |
|  |  |  |  |  |  | 9 | 13 | 7 |  |  |  |  |  |  |  |
|  |  | 2 | 8 |  |  |  |  |  |  |  |  |  |  |  |  |
|  |  | 14 |  |  | 8 |  |  |  |  |  |  |  |  |  |  |
|  |  | 1 | 6 |  |  |  |  |  |  |  |  |  |  |  |  |
| 1 |  |  | 8 |  |  |  |  |  |  |  |  |  |  |  |  |
| 7 |  |  |  |  |  |  | 0 |  |  |  |  |  |  |  |  |
| 4 | 2 |  |  |  |  |  |  |  |  |  |  |  |  |  |  |
| 15 | 5 | 14 |  |  |  |  |  |  |  |  |  |  |  |  |  |
| 2 |  |  |  |  | 11 |  |  |  |  |  |  |  |  |  |  |
| 6 |  |  |  |  |  | 11 |  |  |  |  |  |  |  |  |  |
|  |  |  |  |  |  | 11 | 1 |  |  |  |  |  |  |  |  |
|  |  |  |  |  | 12 |  | 9 |  |  |  |  |  |  |  |  |
|  |  | 7 |  | 5 |  |  |  |  |  |  |  |  |  |  |  |
| 15 |  |  |  |  | 5 |  |  |  |  |  |  |  |  |  |  |
|  |  |  |  |  | 5 |  | 4 |  |  |  |  |  |  |  |  |
|  |  |  | 8 |  | 3 |  |  |  |  |  |  |  |  |  |  |
| 3 |  |  | -1 |  |  |  |  |  |  |  |  |  |  |  |  |
|  | 7 |  | 0 |  |  |  |  |  |  |  |  |  |  |  |  |
|  | 2 |  |  |  |  | 3 |  |  |  |  |  |  |  |  |  |
|  |  |  | 6 | 9 |  |  |  |  |  |  |  |  |  |  |  |
|  |  |  |  |  | 9 | 14 |  |  |  |  |  |  |  |  |  |
|  |  | 4 |  | 12 |  |  |  |  |  |  |  |  |  |  |  |
|  |  |  | 7 |  | 12 |  |  |  |  |  |  |  |  |  |  |
|  |  |  |  |  | 4 | 7 |  |  |  |  |  |  |  |  |  |
|  |  |  |  | 2 | 3 |  |  |  |  |  |  |  |  |  |  |
|  | 13 |  |  | 7 |  | 12 |  |  |  |  |  |  |  |  |  |

| 157 |     | 77  | 187 | 94  | 180 | 112 | 163 |     | 155 | 1   | 0   |     |     |     |     |
|-----|-----|-----|-----|-----|-----|-----|-----|-----|-----|-----|-----|-----|-----|-----|-----|
| 10  | 24  |     |     |     |     |     | 17  |     |     | 0   | 0   |     |     |     |     |
| 24  | 104 |     |     |     | 56  |     | 88  | 46  | 0   |     | 0   | 0   |     |     |     |
| 69  |     | 11  | 14  | 92  | 53  |     | 88  | 66  | 26  |     |     | 0   | 0   |     |     |
| 18  |     | 102 | 173 | 45  | 112 | 168 | 45  |     |     | 1   |     |     | 0   |     |     |
| 157 | 101 |     |     |     |     |     |     |     | 135 |     |     |     | 0   |     |     |
| 188 | 91  |     |     |     | 185 |     |     | 98  | 175 |     |     |     |     | 0   |     |
|     | 79  |     | 24  | 86  |     |     |     | 107 |     |     |     |     |     |     |     |
| 150 | 36  | 129 |     |     |     |     | 107 |     | 106 |     |     |     |     |     |     |
| 110 |     |     |     | 76  | 189 |     |     |     |     |     |     |     |     |     |     |
| 147 | 16  |     |     |     | 151 |     |     |     | 186 |     |     |     |     |     |     |
|     | 24  | 64  |     |     | 100 |     |     |     |     |     |     |     |     |     |     |
| 74  |     |     | 185 |     | 67  |     |     | 89  |     |     |     |     |     |     |     |
| 88  | 58  |     | 181 |     |     |     |     |     |     |     |     |     |     |     |     |
| 29  |     |     |     | 47  |     |     | 63  |     | 34  |     |     |     |     |     |     |
| 189 |     |     | 172 |     |     |     |     |     | 85  |     |     |     |     |     |     |
|     | 73  | 21  |     |     |     |     | 145 |     |     |     |     |     |     |     |     |
| 125 | 112 |     |     |     |     |     | 120 |     |     |     | 37  |     |     |     |     |
| 3   |     |     | 10  |     |     |     |     |     | 98  |     |     |     |     |     |     |
|     | 9   |     |     |     |     | 154 |     |     |     |     | 58  |     |     |     |     |
|     | 136 |     |     | 84  |     |     |     |     | 5   |     |     |     |     |     |     |
| 118 |     |     |     | 89  |     | 147 |     |     |     |     |     |     |     |     |     |
|     | 98  |     | 100 |     |     |     |     |     |     |     | 161 |     |     |     |     |
| 37  |     |     |     |     |     |     |     |     | 143 |     |     |     |     |     |     |
|     | 131 |     |     |     |     |     |     |     | 138 | 157 |     |     |     |     |     |
| 118 |     |     |     | 41  |     | 87  |     |     |     |     |     |     |     |     |     |
|     |     |     | 188 |     |     |     |     |     |     | 146 |     |     |     |     |     |
|     | 190 | 15  |     |     |     |     |     |     | 12  |     |     |     |     |     |     |
| 112 |     | 180 |     |     |     |     |     |     |     |     |     |     |     |     |     |
|     | 41  |     |     |     | 191 |     |     |     | 76  |     |     |     |     |     |     |
|     |     |     |     |     |     | 139 | 33  | 132 |     |     |     |     |     |     |     |
|     | 110 | 8   |     |     | 127 |     |     |     |     |     |     |     |     |     |     |
|     |     |     |     | 102 |     |     | 4   | 69  |     |     |     |     |     |     |     |
|     | 150 |     | 92  |     |     |     |     |     |     |     |     |     |     |     |     |
|     | 82  |     |     |     |     | 146 |     | 14  |     |     |     |     |     |     |     |
|     | 51  |     |     |     |     |     |     |     | 41  |     |     |     |     |     |     |
|     | 154 |     | 83  |     |     |     |     | 48  |     |     |     |     |     |     |     |
|     | 61  |     |     | 2   | 165 | 81  |     |     |     |     |     |     |     |     |     |
| 151 |     |     | 132 |     |     |     |     |     |     |     |     |     |     |     |     |
|     |     |     |     |     |     |     |     | 63  | 152 | 86  |     |     |     |     |     |
|     | 0   |     |     |     |     |     | 151 |     |     |     |     |     |     |     |     |
|     |     | 79  |     |     | 144 |     | 33  |     |     |     |     |     |     |     |     |

FIG. 18A

| | | | | | | | | | | | | | | | |
|---|---|---|---|---|---|---|---|---|---|---|---|---|---|---|---|
| 120 | | 128 | 50 | 174 | 48 | 66 | 8 | | 119 | 1 | 0 | | | | |
| 163 | 42 | | | | | | | 101 | | | 0 | 0 | | | |
| 165 | 24 | | | | 170 | | 0 | 74 | 0 | | | 0 | 0 | | |
| 13 | | 145 | 172 | 47 | 94 | | 40 | 80 | 37 | | | | 0 | 0 | |
| 86 | | 47 | 39 | 51 | 89 | 23 | 21 | | | 1 | | | | 0 | |
| 17 | 102 | | | | | | | | | 68 | | | | | 0 |
| 139 | 123 | | | | | 90 | | | 62 | 61 | | | | | 0 |
| | 61 | | 43 | 152 | | | | | 1 | | | | | | |
| 86 | 145 | 27 | | | | | | 74 | | 116 | | | | | |
| 22 | | | | | 128 | 170 | | | | | | | | | |
| 121 | 60 | | | | | 127 | | | | | 82 | | | | |
| | 88 | 27 | | | 34 | | | | | | | | | | |
| 143 | | | 167 | | | 139 | | | 48 | | | | | | |
| 19 | 121 | | 154 | | | | | | | | | | | | |
| 87 | | | | 159 | | | 170 | 122 | | | | | | | |
| 21 | | | 0 | | | | | | | 5 | | | | | |
| | 66 | 166 | | | | | 151 | | | | | | | | |
| 105 | 71 | | | | | | | 6 | | | | 7 | | | |
| 5 | | 42 | | | | | | | | 141 | | | | | |
| | 79 | | | | | 2 | | | | | | 25 | | | |
| | 9 | | | 9 | | | | | | 136 | | | | | |
| 172 | | | | | 63 | | 38 | | | | | | | | |
| | 151 | | 159 | | | | | | | | | 138 | | | |
| 42 | | | | | | | | | 88 | | | | | | |
| | 69 | | | | | | | | | 21 | 123 | | | | |
| 116 | | | | 47 | | 43 | | | | | | | | | |
| | | 167 | | | | | | | | | | 0 | | | |
| | 150 | 9 | | | | | | | | 169 | | | | | |
| 170 | | 110 | | | | | | | | | | | | | |
| | 133 | | | | | 168 | | | | 24 | | | | | |
| | | | | | | | 7 | 34 | 3 | | | | | | |
| | 41 | 10 | | | 107 | | | | | | | | | | |
| | | | | 44 | | | 40 | 82 | | | | | | | |
| | 133 | | | 175 | | | | | | | | | | | |
| | | 43 | | | | | 18 | 105 | | | | | | | |
| | 155 | | | | | | | | 41 | | | | | | |
| | | 168 | 83 | | | | | 79 | | | | | | | |
| | 158 | | | 85 | 156 | 145 | | | | | | | | | |
| 150 | | | 134 | | | | | | | | | | | | |
| | | | | | | | | 13 | 30 | 3 | | | | | |
| | 143 | | | | | | 44 | | | | | | | | |
| | | 12 | | | 110 | | | 41 | | | | | | | |

FIG. 19A

| 114 |     | 31  | 151 | 159 | 14  | 8   | 115 |     | 138 | 1   | 0   |     |     |     |     |
|-----|-----|-----|-----|-----|-----|-----|-----|-----|-----|-----|-----|-----|-----|-----|-----|
| 109 | 128 |     |     |     |     |     |     | 154 |     | 0   | 0   |     |     |     |     |
| 17  | 125 |     |     |     | 23  |     | 75  | 85  | 0   |     | 0   | 0   |     |     |     |
| 60  |     | 39  | 124 | 3   | 144 |     | 71  | 59  | 143 |     |     | 0   | 0   |     |     |
| 73  |     | 45  | 112 | 45  | 111 | 106 | 150 |     | 1   |     |     |     | 0   |     |     |
| 112 | 155 |     |     |     |     |     |     |     | 104 |     |     |     |     | 0   |     |
| 151 | 73  |     |     |     | 26  |     |     |     | 129 | 17  |     |     |     |     | 0   |
|     | 48  |     | 5   | 5   |     |     |     | 80  |     |     |     |     |     |     |     |
| 149 | 153 | 39  |     |     |     |     | 16  |     | 150 |     |     |     |     |     |     |
| 22  |     |     |     |     | 3   | 121 |     |     |     |     |     |     |     |     |     |
| 100 | 26  |     |     |     |     | 108 |     |     |     | 89  |     |     |     |     |     |
|     | 52  | 24  |     |     | 74  |     |     |     |     |     |     |     |     |     |     |
| 99  |     |     | 65  |     |     | 106 |     | 85  |     |     |     |     |     |     |     |
| 41  | 21  |     | 31  |     |     |     |     |     |     |     |     |     |     |     |     |
| 44  |     |     |     |     | 120 |     | 113 |     | 65  |     |     |     |     |     |     |
| 38  |     |     |     | 17  |     |     |     |     |     | 155 |     |     |     |     |     |
|     | 42  | 79  |     |     |     |     | 24  |     |     |     |     |     |     |     |     |
| 105 | 130 |     |     |     |     |     |     | 157 |     |     | 2   |     |     | 13  |     |
| 148 |     |     | 102 |     |     |     |     |     |     |     | 2   |     |     |     |     |
|     | 150 |     |     |     |     |     | 31  |     |     |     |     |     | 158 |     |     |
|     | 16  |     |     | 53  |     |     |     |     |     | 4   |     |     |     |     |     |
| 17  |     |     |     |     | 129 |     |     | 158 |     |     |     |     |     |     |     |
|     | 68  |     | 36  |     |     |     |     |     |     |     |     |     | 35  |     |     |
| 149 |     |     |     |     |     |     |     |     |     |     | 37  |     |     |     |     |
|     | 86  |     |     |     |     |     |     |     |     | 11  | 150 |     |     |     |     |
| 154 |     |     |     | 129 |     |     | 5   |     |     |     |     |     |     |     |     |
|     |     |     | 89  |     |     |     |     |     |     |     |     |     | 22  |     |     |
|     | 21  | 82  |     |     |     |     |     |     |     | 154 |     |     |     |     |     |
| 155 |     |     | 103 |     |     |     |     |     |     |     |     |     |     |     |     |
|     | 12  |     |     |     |     | 113 |     |     |     |     | 1   |     |     |     |     |
|     |     |     |     |     |     |     | 151 |     | 34  | 140 |     |     |     |     |     |
|     | 70  |     | 81  |     |     | 6   |     |     |     |     |     |     |     |     |     |
|     |     |     |     |     | 156 |     |     |     | 155 | 46  |     |     |     |     |     |
|     | 127 |     |     |     | 19  |     |     |     |     |     |     |     |     |     |     |
|     |     | 120 |     |     |     |     |     | 20  |     | 123 |     |     |     |     |     |
|     | 76  |     |     |     |     |     |     |     |     |     | 130 |     |     |     |     |
|     |     | 116 |     | 109 |     |     |     |     |     | 54  |     |     |     |     |     |
|     | 76  |     |     |     | 97  | 59  | 12  |     |     |     |     |     |     |     |     |
| 154 |     |     | 111 |     |     |     |     |     |     |     |     |     |     |     |     |
|     |     |     |     |     |     |     |     |     |     | 32  | 13  | 38  |     |     |     |
|     | 158 |     |     |     |     |     |     |     | 34  |     |     |     |     |     |     |
|     |     |     | 14  |     |     |     | 64  |     |     | 2   |     |     |     |     |     |

FIG. 20A

| | | | | | | | | | | | | | | |
|---|---|---|---|---|---|---|---|---|---|---|---|---|---|---|
| 9 | | 24 | 86 | 28 | 21 | 91 | 130 | | 28 | 1 | 0 | | | |
| 37 | 52 | | | | | | 100 | | | 0 | 0 | | | |
| 93 | 50 | | | | 108 | | 65 | 90 | 0 | | 0 | 0 | | |
| 108 | | 100 | 111 | 96 | 4 | | 64 | 111 | 79 | | | 0 | 0 | |
| 95 | | 134 | 114 | 8 | 141 | 104 | 135 | | | 1 | | | 0 | |
| 97 | 35 | | | | | | | | 119 | | | | 0 | |
| 139 | 70 | | | | 14 | | | 112 | 138 | | | | | 0 |
| | 40 | | 9 | 107 | | | | 7 | | | | | | |
| 125 | 12 | 36 | | | | | 138 | | 36 | | | | | |
| 128 | | | | 25 | 7 | | | | | | | | | |
| 135 | 40 | | | | | 115 | | | 118 | | | | | |
| | 122 | 129 | | | 136 | | | | | | | | | |
| 75 | | | 74 | | | 2 | | 45 | | | | | | |
| 122 | 37 | | 142 | | | | | | | | | | | |
| 128 | | | | 74 | | | 60 | | 65 | | | | | |
| 16 | | | 0 | | | | | | 34 | | | | | |
| | 33 | 109 | | | | | 116 | | | | | | | |
| 35 | 83 | | | | | | | 138 | | | | 135 | | |
| 122 | | | 111 | | | | | | | 12 | | | | |
| | 34 | | | | | | 111 | | | | | 39 | | |
| | 79 | | | 143 | | | | | | 28 | | | | |
| 136 | | | | | 106 | | 121 | | | | | | | |
| | 123 | | 43 | | | | | | | | | 126 | | |
| 115 | | | | | | | | | | 41 | | | | |
| | 34 | | | | | | | | | 70 | 43 | | | |
| 94 | | | | 143 | | 23 | | | | | | | | |
| | | | 43 | | | | | | | | | 6 | | |
| | 85 | 0 | | | | | | | 133 | | | | | |
| 34 | | 115 | | | | | | | | | | | | |
| | 65 | | | | 12 | | | | | 8 | | | | |
| | | | | | | 32 | | 43 | 122 | | | | | |
| | 89 | 20 | | | 70 | | | | | | | | | |
| | | | | 22 | | | 109 | 7 | | | | | | |
| | 19 | | | 5 | | | | | | | | | | |
| | 113 | | | | | 118 | | 65 | | | | | | |
| | 2 | | | | | | | | 30 | | | | | |
| | 140 | 129 | | | | | | 61 | | | | | | |
| | 95 | | | | 65 | 99 | 66 | | | | | | | |
| 115 | | | 128 | | | | | | | | | | | |
| | | | | | | | | | 109 | 107 | 27 | | | |
| | 132 | | | | | | 131 | | | | | | | |
| | | 108 | | | 124 | | | 12 | | | | | | |

FIG. 21A

| 231 |  | 58 | 96 | 220 | 183 | 111 | 37 |  | 241 | 1 | 0 |  |  |  |  |
|---|---|---|---|---|---|---|---|---|---|---|---|---|---|---|---|
| 134 | 188 |  |  |  |  |  | 26 |  |  | 0 | 0 |  |  |  |  |
| 210 | 63 |  |  |  | 246 |  | 196 | 96 | 0 |  | 0 | 0 |  |  |  |
| 95 |  | 252 | 155 | 241 | 139 |  | 19 | 59 | 222 |  |  | 0 | 0 |  |  |
| 43 |  | 173 | 61 | 56 | 193 | 218 | 94 |  |  | 1 |  |  | 0 |  |  |
| 152 | 57 |  |  |  |  |  |  |  | 108 |  |  |  | 0 |  |  |
| 35 | 134 |  |  |  | 42 |  |  | 246 | 48 |  |  |  |  |  | 0 |
|  | 139 |  | 36 | 38 |  |  |  |  | 242 |  |  |  |  |  |  |
| 251 | 75 | 128 |  |  |  |  | 2 |  | 75 |  |  |  |  |  |  |
| 233 |  |  |  | 190 | 138 |  |  |  |  |  |  |  |  |  |  |
| 63 | 241 |  |  |  |  | 59 |  |  |  | 55 |  |  |  |  |  |
|  | 145 | 200 |  |  | 187 |  |  |  |  |  |  |  |  |  |  |
| 81 |  |  | 218 |  | 206 |  |  |  | 120 |  |  |  |  |  |  |
| 197 | 250 |  | 164 |  |  |  |  |  |  |  |  |  |  |  |  |
| 2 |  |  |  | 221 |  | 35 |  | 222 |  |  |  |  |  |  |  |
| 125 |  |  | 24 |  |  |  |  |  |  | 238 |  |  |  |  |  |
|  | 143 | 128 |  |  |  | 49 |  |  |  |  |  |  |  |  |  |
| 4 | 247 |  |  |  |  |  |  | 249 |  |  |  | 54 |  |  |  |
| 121 |  |  | 236 |  |  |  |  |  |  | 248 |  |  |  |  |  |
|  | 210 |  |  |  |  | 5 |  |  |  |  |  | 32 |  |  |  |
|  | 237 |  |  | 133 |  |  |  |  |  | 152 |  |  |  |  |  |
| 106 |  |  |  |  | 63 |  | 48 |  |  |  |  |  |  |  |  |
|  | 200 |  | 167 |  |  |  |  |  |  |  |  | 34 |  |  |  |
| 77 |  |  |  |  |  |  |  |  |  | 49 |  |  |  |  |  |
|  | 188 |  |  |  |  |  |  |  |  | 249 |  | 162 |  |  |  |
| 159 |  |  |  | 38 |  | 101 |  |  |  |  |  |  |  |  |  |
|  |  |  |  | 195 |  |  |  |  |  |  |  | 223 |  |  |  |
|  | 107 | 59 |  |  |  |  |  |  |  | 188 |  |  |  |  |  |
| 76 |  | 66 |  |  |  |  |  |  |  |  |  |  |  |  |  |
|  | 49 |  |  |  |  | 220 |  |  |  |  | 61 |  |  |  |  |
|  |  |  |  |  |  |  | 205 |  | 37 |  | 108 |  |  |  |  |
|  | 65 | 121 |  |  |  | 200 |  |  |  |  |  |  |  |  |  |
|  |  |  |  |  | 7 |  |  |  | 186 |  | 48 |  |  |  |  |
|  | 194 |  |  | 87 |  |  |  |  |  |  |  |  |  |  |  |
|  |  | 195 |  |  |  |  |  | 235 |  |  | 54 |  |  |  |  |
|  |  | 20 |  |  |  |  |  |  |  |  | 3 |  |  |  |  |
|  |  | 190 |  | 78 |  |  |  |  |  | 181 |  |  |  |  |  |
|  | 235 |  |  |  | 38 | 233 | 35 |  |  |  |  |  |  |  |  |
| 71 |  |  | 209 |  |  |  |  |  |  |  |  |  |  |  |  |
|  |  |  |  |  |  |  |  |  |  | 220 | 0 | 6 |  |  |  |
|  |  | 47 |  |  |  |  |  |  | 216 |  |  |  |  |  |  |
|  |  |  | 200 |  |  |  | 132 |  |  | 113 |  |  |  |  |  |

FIG. 22A

| | | | | | | | | | | | | | | | |
|---|---|---|---|---|---|---|---|---|---|---|---|---|---|---|---|
| 73 | | 236 | 79 | 84 | 69 | 7 | 67 | | 165 | 1 | 0 | | | | |
| 84 | 13 | | | | | | | 10 | | | 0 | 0 | | | |
| 227 | 101 | | | | 182 | | 154 | 115 | 0 | | | 0 | 0 | | |
| 210 | | 33 | 128 | 230 | 120 | | 162 | 215 | 72 | | | | 0 | 0 | |
| 213 | | 74 | 192 | 0 | 73 | 138 | 109 | | | 1 | | | | 0 | |
| 163 | 40 | | | | | | | | | 72 | | | | 0 | |
| 3 | 9 | | | | 200 | | | 226 | 235 | | | | | | 0 |
| | 149 | | 9 | 9 | | | | | 23 | | | | | | |
| 171 | 38 | 66 | | | | | | 111 | | 89 | | | | | |
| 23 | | | | 65 | 45 | | | | | | | | | | |
| 20 | 175 | | | | | | 0 | | | | | 121 | | | |
| | 204 | 8 | | | 210 | | | | | | | | | | |
| 119 | | | 94 | | | 229 | | | 87 | | | | | | |
| 84 | 182 | | 118 | | | | | | | | | | | | |
| 207 | | | | 89 | | | 12 | | 191 | | | | | | |
| 171 | | | 90 | | | | | | | 54 | | | | | |
| | 156 | 187 | | | | | 160 | | | | | | | | |
| 8 | 99 | | | | | | | 177 | | | | 183 | | | |
| 60 | | 142 | | | | | | | | 1 | | | | | |
| | 136 | | | | | 229 | | | | | | 18 | | | |
| | 71 | | | 205 | | | | | | 78 | | | | | |
| 26 | | | | 179 | | | 226 | | | | | | | | |
| | 34 | | 196 | | | | | | | | | 2 | | | |
| 2 | | | | | | | | | | 188 | | | | | |
| | 135 | | | | | | | | | 213 | | 60 | | | |
| 36 | | | 115 | | 12 | | | | | | | | | | |
| | | 238 | | | | | | | | | 9 | | | | |
| | 87 | 110 | | | | | | | 201 | | | | | | |
| 9 | | 185 | | | | | | | | | | | | | |
| | 208 | | | | 32 | | | | 106 | | | | | | |
| | | | | | | 112 | 127 | 125 | | | | | | | |
| | 86 | 12 | | | 47 | | | | | | | | | | |
| | | | | 74 | | | 85 | 199 | | | | | | | |
| | 53 | | 6 | | | | | | | | | | | | |
| | 185 | | | | | 124 | | 38 | | | | | | | |
| | 13 | | | | | | | 39 | | | | | | | |
| | 193 | 47 | | | | | 18 | | | | | | | | |
| | 9 | | | 11 | 122 | 8 | | | | | | | | | |
| 64 | | | 197 | | | | | | | | | | | | |
| | | | | | | | | 208 | 47 | 136 | | | | | |
| | 58 | | | | | | 211 | | | | | | | | |
| | | 236 | | | 117 | | 46 | | | | | | | | |

FIG. 23A

| 213 |     | 121 | 50  | 167 | 154 | 109 | 119 |     | 152 | 1   | 0   |     |     |     |     |
|-----|-----|-----|-----|-----|-----|-----|-----|-----|-----|-----|-----|-----|-----|-----|-----|
| 156 | 198 |     |     |     |     |     | 17  |     |     |     | 0   | 0   |     |     |     |
| 123 | 92  |     |     |     | 102 |     | 215 | 172 | 0   |     |     | 0   | 0   |     |     |
| 87  |     | 66  | 123 | 192 | 222 |     | 109 | 50  | 0   |     |     |     | 0   | 0   |     |
| 33  |     | 0   | 100 | 68  | 165 | 140 | 117 |     |     | 1   |     |     |     | 0   |     |
| 183 | 150 |     |     |     |     |     |     |     |     | 215 |     |     |     |     | 0   |
| 48  | 49  |     |     |     | 102 |     |     |     | 203 | 40  |     |     |     |     |     | 0 |
|     | 219 |     | 13  | 220 |     |     |     |     | 38  |     |     |     |     |     |     |
| 137 | 1   | 91  |     |     |     |     |     | 181 |     | 2   |     |     |     |     |     |
| 151 |     |     |     |     | 211 | 50  |     |     |     |     |     |     |     |     |     |
| 115 | 6   |     |     |     |     |     | 208 |     |     |     |     | 42  |     |     |     |
|     | 99  | 74  |     |     |     | 44  |     |     |     |     |     |     |     |     |     |
| 140 |     |     |     | 201 |     |     | 220 |     |     |     | 179 |     |     |     |     |
| 130 | 10  |     | 188 |     |     |     |     |     |     |     |     |     |     |     |     |
| 215 |     |     |     |     | 46  |     |     | 13  |     | 85  |     |     |     |     |     |
| 156 |     |     |     | 211 |     |     |     |     |     |     |     | 104 |     |     |     |
|     | 30  | 43  |     |     |     |     |     | 40  |     |     |     |     |     |     |     |
| 2   | 46  |     |     |     |     |     |     |     | 43  |     |     |     |     | 168 |     |
| 208 |     |     | 33  |     |     |     |     |     |     |     |     | 181 |     |     |     |
|     | 141 |     |     |     |     |     |     | 101 |     |     |     |     |     | 187 |     |
|     | 3   |     |     |     | 54  |     |     |     |     |     |     | 31  |     |     |     |
| 150 |     |     |     |     |     | 11  |     |     | 32  |     |     |     |     |     |     |
|     | 168 |     |     | 190 |     |     |     |     |     |     |     |     |     | 159 |     |
| 170 |     |     |     |     |     |     |     |     |     |     |     | 34  |     |     |     |
|     | 165 |     |     |     |     |     |     |     |     |     |     | 29  |     | 9   |     |
| 114 |     |     |     |     | 170 |     |     | 0   |     |     |     |     |     |     |     |
|     |     |     |     | 152 |     |     |     |     |     |     |     |     |     | 201 |     |
|     | 69  | 144 |     |     |     |     |     |     |     |     |     | 178 |     |     |     |
| 211 |     |     | 91  |     |     |     |     |     |     |     |     |     |     |     |     |
|     | 113 |     |     |     |     |     | 3   |     |     |     |     | 169 |     |     |     |
|     |     |     |     |     |     |     |     | 47  |     | 68  |     | 116 |     |     |     |
|     | 174 |     | 112 |     |     |     | 220 |     |     |     |     |     |     |     |     |
|     |     |     |     |     |     | 132 |     |     |     | 169 |     | 38  |     |     |     |
|     | 52  |     |     |     | 185 |     |     |     |     |     |     |     |     |     |     |
|     |     | 26  |     |     |     |     |     |     | 159 |     |     | 181 |     |     |     |
|     | 63  |     |     |     |     |     |     |     |     |     |     | 127 |     |     |     |
|     |     |     | 3   |     | 96  |     |     |     |     |     |     | 119 |     |     |     |
|     | 92  |     |     |     |     | 48  | 191 | 144 |     |     |     |     |     |     |     |
| 120 |     |     |     | 174 |     |     |     |     |     |     |     |     |     |     |     |
|     |     |     |     |     |     |     |     |     |     |     |     | 41  | 52  | 12  |     |
|     | 177 |     |     |     |     |     |     |     |     | 212 |     |     |     |     |     |
|     |     |     | 221 |     |     |     | 189 |     |     |     |     | 26  |     |     |     |

FIG. 24A

| 100 |  | 103 | 201 | 5 | 109 | 7 | 164 |  | 130 | 1 | 0 |  |  |  |  |
|---|---|---|---|---|---|---|---|---|---|---|---|---|---|---|---|
| 96 | 76 |  |  |  |  |  | 111 |  |  | 0 | 0 |  |  |  |  |
| 197 | 48 |  |  |  | 93 |  | 68 | 20 | 0 |  | 0 | 0 |  |  |  |
| 108 |  | 17 | 166 | 150 | 112 |  | 123 | 32 | 74 |  |  | 0 | 0 |  |  |
| 9 |  | 133 | 147 | 37 | 78 | 116 | 197 |  |  | 1 |  |  | 0 |  |  |
| 45 | 197 |  |  |  |  |  |  |  | 68 |  |  |  |  | 0 |  |
| 107 | 80 |  |  |  | 129 |  |  | 55 | 76 |  |  |  |  |  | 0 |
|  | 187 |  | 79 | 66 |  |  |  | 114 |  |  |  |  |  |  |  |
| 127 | 51 | 168 |  |  |  |  | 101 |  | 9 |  |  |  |  |  |  |
| 100 |  |  |  | 207 | 125 |  |  |  |  |  |  |  |  |  |  |
| 182 | 164 |  |  |  |  | 14 |  |  |  | 52 |  |  |  |  |  |
|  | 128 | 203 |  |  | 148 |  |  |  |  |  |  |  |  |  |  |
| 79 |  |  | 39 |  |  | 19 |  | 136 |  |  |  |  |  |  |  |
| 22 | 205 |  | 169 |  |  |  |  |  |  |  |  |  |  |  |  |
| 66 |  |  |  | 206 |  | 85 |  | 83 |  |  |  |  |  |  |  |
| 53 |  |  | 3 |  |  |  |  |  |  | 166 |  |  |  |  |  |
|  | 83 | 203 |  |  |  | 35 |  |  |  |  |  |  |  |  |  |
| 44 | 168 |  |  |  |  |  |  | 106 |  |  |  | 24 |  |  |  |
| 113 |  |  | 46 |  |  |  |  |  |  | 206 |  |  |  |  |  |
|  | 144 |  |  |  |  | 162 |  |  |  |  |  | 193 |  |  |  |
|  | 172 |  |  | 207 |  |  |  |  |  | 146 |  |  |  |  |  |
| 108 |  |  |  | 200 |  |  | 125 |  |  |  |  |  |  |  |  |
|  | 128 |  | 159 |  |  |  |  |  |  |  |  | 171 |  |  |  |
| 161 |  |  |  |  |  |  |  |  |  | 113 |  |  |  |  |  |
|  | 68 |  |  |  |  |  |  |  |  | 162 |  | 90 |  |  |  |
| 73 |  |  |  | 91 |  | 10 |  |  |  |  |  |  |  |  |  |
|  |  |  | 200 |  |  |  |  |  |  |  |  | 130 |  |  |  |
|  | 52 | 22 |  |  |  |  |  |  |  | 199 |  |  |  |  |  |
| 158 |  | 189 |  |  |  |  |  |  |  |  |  |  |  |  |  |
|  | 77 |  |  |  | 42 |  |  |  |  | 145 |  |  |  |  |  |
|  |  |  |  |  |  | 57 |  | 85 |  | 16 |  |  |  |  |  |
|  | 160 | 42 |  |  | 24 |  |  |  |  |  |  |  |  |  |  |
|  |  |  |  | 130 |  |  |  | 23 |  | 53 |  |  |  |  |  |
|  | 43 |  |  | 192 |  |  |  |  |  |  |  |  |  |  |  |
|  | 204 |  |  |  |  |  | 20 |  |  | 126 |  |  |  |  |  |
|  | 199 |  |  |  |  |  |  |  |  |  | 53 |  |  |  |  |
|  | 94 |  | 42 |  |  |  |  |  |  | 171 |  |  |  |  |  |
|  | 6 |  |  |  | 83 | 195 | 165 |  |  |  |  |  |  |  |  |
| 185 |  |  | 196 |  |  |  |  |  |  |  |  |  |  |  |  |
|  |  |  |  |  |  |  |  |  |  | 3 | 8 | 25 |  |  |  |
|  | 168 |  |  |  |  |  |  |  |  | 154 |  |  |  |  |  |
|  |  | 163 |  |  |  | 205 |  |  |  | 58 |  |  |  |  |  |

FIG. 25

| 25A | 25B | 25C |
| 25D | 25E | 25F |
| 25G | 25H | 25I |

FIG. 25A

| 1 | 1 | 1 | 1 | 0 | 0 | 1 | 0 | 0 | 1 | 1 | 1 | 0 | 0 | 0 | 0 |
|---|---|---|---|---|---|---|---|---|---|---|---|---|---|---|---|
| 1 | 0 | 0 | 1 | 1 | 1 | 1 | 1 | 1 | 1 | 0 | 1 | 1 | 0 | 0 | 0 |
| 1 | 1 | 0 | 1 | 1 | 0 | 0 | 0 | 1 | 0 | 1 | 0 | 1 | 1 | 0 | 0 |
| 0 | 1 | 1 | 0 | 1 | 1 | 1 | 1 | 1 | 1 | 0 | 0 | 1 | 0 | 0 | 0 |
| 1 | 1 | 0 | 0 | 0 | 0 | 0 | 0 | 0 | 0 | 1 | 0 | 0 | 1 | 0 | 0 |
| 1 | 1 | 0 | 0 | 0 | 1 | 0 | 1 | 0 | 0 | 0 | 1 | 0 | 0 | 0 | 1 | 0 |
| 1 | 0 | 0 | 0 | 0 | 1 | 0 | 1 | 0 | 1 | 0 | 1 | 0 | 0 | 0 | 0 | 1 |

FIG. 25B

| 0 | 0 | 0 | 0 | 0 | 0 | 0 | 0 | 0 | 0 | 0 | 0 | 0 | 0 |
|---|---|---|---|---|---|---|---|---|---|---|---|---|---|
| 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 |

FIG. 25C

| 0 | 0 | 0 | 0 | 0 | 0 | 0 | 0 | 0 | 0 | 0 | 0 | 0 | 0 | 0 | 0 | 0 | 0 |
|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |

FIG. 25D

| 0 | 1 | 0 | 0 | 0 | 1 | 0 | 1 | 0 | 0 | 0 | 1 | 0 | 1 | 0 | 0 | 0 |
|---|---|---|---|---|---|---|---|---|---|---|---|---|---|---|---|---|
| 1 | 1 | 0 | 0 | 0 | 0 | 0 | 0 | 0 | 0 | 0 | 0 | 1 | 0 | 0 | 0 | 0 |
| 0 | 1 | 0 | 0 | 0 | 0 | 0 | 0 | 1 | 0 | 1 | 1 | 0 | 0 | 0 | 0 | 0 |
| 1 | 1 | 0 | 0 | 0 | 0 | 1 | 1 | 0 | 0 | 0 | 0 | 0 | 0 | 0 | 0 | 0 |
| 1 | 0 | 0 | 0 | 0 | 0 | 0 | 1 | 0 | 1 | 0 | 0 | 0 | 1 | 0 | 0 | 0 |
| 0 | 1 | 0 | 1 | 0 | 0 | 0 | 0 | 0 | 0 | 0 | 1 | 0 | 0 | 0 | 0 | 0 |
| 1 | 1 | 0 | 0 | 0 | 0 | 0 | 0 | 1 | 0 | 0 | 0 | 0 | 1 | 0 | 0 | 0 |
| 0 | 1 | 0 | 0 | 0 | 0 | 1 | 0 | 0 | 0 | 0 | 1 | 0 | 1 | 0 | 0 | 0 |
| 1 | 0 | 0 | 0 | 0 | 0 | 0 | 0 | 0 | 0 | 1 | 1 | 0 | 0 | 0 | 0 | 0 |
| 0 | 1 | 0 | 0 | 0 | 0 | 0 | 0 | 0 | 1 | 0 | 1 | 1 | 0 | 0 | 0 | 0 |
| 0 | 1 | 0 | 0 | 0 | 1 | 0 | 0 | 0 | 0 | 0 | 1 | 1 | 0 | 0 | 0 | 0 |
| 1 | 0 | 0 | 0 | 0 | 0 | 1 | 1 | 0 | 0 | 0 | 0 | 0 | 0 | 0 | 0 | 0 |
| 1 | 1 | 0 | 0 | 0 | 0 | 0 | 0 | 0 | 0 | 1 | 0 | 0 | 0 | 0 | 0 | 0 |
| 0 | 1 | 0 | 0 | 1 | 0 | 0 | 0 | 0 | 0 | 0 | 1 | 0 | 0 | 0 | 0 | 0 |
| 1 | 0 | 0 | 0 | 0 | 0 | 0 | 0 | 1 | 0 | 0 | 0 | 0 | 1 | 0 | 0 | 0 |

FIG. 25E

| 1 | 0 | 0 | 0 | 0 | 0 | 0 | 0 | 0 | 0 | 0 | 0 | 0 | 0 | 0 |
|---|---|---|---|---|---|---|---|---|---|---|---|---|---|---|
| 0 | 1 | 0 | 0 | 0 | 0 | 0 | 0 | 0 | 0 | 0 | 0 | 0 | 0 | 0 |
| 0 | 0 | 1 | 0 | 0 | 0 | 0 | 0 | 0 | 0 | 0 | 0 | 0 | 0 | 0 |
| 0 | 0 | 0 | 1 | 0 | 0 | 0 | 0 | 0 | 0 | 0 | 0 | 0 | 0 | 0 |
| 0 | 0 | 0 | 0 | 1 | 0 | 0 | 0 | 0 | 0 | 0 | 0 | 0 | 0 | 0 |
| 0 | 0 | 0 | 0 | 0 | 1 | 0 | 0 | 0 | 0 | 0 | 0 | 0 | 0 | 0 |
| 0 | 0 | 0 | 0 | 0 | 0 | 1 | 0 | 0 | 0 | 0 | 0 | 0 | 0 | 0 |
| 0 | 0 | 0 | 0 | 0 | 0 | 0 | 1 | 0 | 0 | 0 | 0 | 0 | 0 | 0 |
| 0 | 0 | 0 | 0 | 0 | 0 | 0 | 0 | 1 | 0 | 0 | 0 | 0 | 0 | 0 |
| 0 | 0 | 0 | 0 | 0 | 0 | 0 | 0 | 0 | 1 | 0 | 0 | 0 | 0 | 0 |
| 0 | 0 | 0 | 0 | 0 | 0 | 0 | 0 | 0 | 0 | 1 | 0 | 0 | 0 | 0 |
| 0 | 0 | 0 | 0 | 0 | 0 | 0 | 0 | 0 | 0 | 0 | 1 | 0 | 0 | 0 |
| 0 | 0 | 0 | 0 | 0 | 0 | 0 | 0 | 0 | 0 | 0 | 0 | 1 | 0 | 0 |
| 0 | 0 | 0 | 0 | 0 | 0 | 0 | 0 | 0 | 0 | 0 | 0 | 0 | 1 | 0 |
| 0 | 0 | 0 | 0 | 0 | 0 | 0 | 0 | 0 | 0 | 0 | 0 | 0 | 0 | 1 |

FIG. 25F

| 0 | 0 | 0 | 0 | 0 | 0 | 0 | 0 | 0 | 0 | 0 | 0 | 0 | 0 | 0 | 0 | 0 | 0 | 0 |
|---|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 |

FIG. 25G

| 0 | 1 | 1 | 0 | 0 | 0 | 0 | 0 | 0 | 0 | 0 | 0 | 0 | 0 | 0 | 0 |
|---|---|---|---|---|---|---|---|---|---|---|---|---|---|---|---|
| 1 | 0 | 0 | 1 | 0 | 1 | 0 | 0 | 0 | 0 | 0 | 0 | 0 | 0 | 0 | 0 |
| 0 | 1 | 1 | 0 | 0 | 0 | 0 | 0 | 1 | 0 | 0 | 0 | 0 | 0 | 0 | 0 |
| 1 | 0 | 0 | 0 | 1 | 0 | 0 | 0 | 0 | 0 | 0 | 0 | 0 | 0 | 0 | 0 |
| 0 | 0 | 1 | 0 | 0 | 0 | 0 | 1 | 0 | 0 | 0 | 1 | 1 | 0 | 0 | 0 |
| 1 | 0 | 0 | 0 | 0 | 0 | 1 | 0 | 0 | 0 | 0 | 0 | 0 | 0 | 0 | 0 |
| 0 | 1 | 1 | 0 | 0 | 1 | 0 | 0 | 0 | 0 | 0 | 0 | 0 | 0 | 0 | 0 |
| 1 | 0 | 0 | 0 | 1 | 0 | 0 | 0 | 0 | 0 | 0 | 0 | 0 | 0 | 0 | 0 |
| 0 | 0 | 1 | 0 | 0 | 1 | 0 | 1 | 0 | 1 | 0 | 0 | 0 | 0 | 0 | 0 |
| 0 | 1 | 0 | 0 | 0 | 0 | 0 | 0 | 0 | 0 | 0 | 0 | 1 | 0 | 0 | 0 |
| 0 | 0 | 1 | 0 | 0 | 1 | 0 | 1 | 1 | 0 | 0 | 0 | 0 | 0 | 0 | 0 |
| 0 | 1 | 0 | 0 | 0 | 0 | 0 | 0 | 0 | 0 | 0 | 1 | 0 | 0 | 0 | 0 |
| 1 | 0 | 0 | 1 | 0 | 0 | 0 | 0 | 0 | 0 | 0 | 0 | 0 | 0 | 0 | 0 |
| 0 | 0 | 1 | 0 | 0 | 1 | 0 | 1 | 0 | 0 | 0 | 0 | 0 | 0 | 0 | 0 |
| 0 | 1 | 0 | 0 | 0 | 0 | 0 | 0 | 1 | 0 | 0 | 0 | 0 | 0 | 0 | 0 |
| 0 | 0 | 1 | 0 | 0 | 1 | 0 | 1 | 0 | 0 | 0 | 0 | 0 | 0 | 0 | 0 |
| 1 | 0 | 0 | 0 | 0 | 0 | 0 | 1 | 0 | 0 | 1 | 0 | 0 | 0 | 0 | 0 |
| 0 | 0 | 1 | 0 | 0 | 1 | 0 | 1 | 0 | 0 | 0 | 0 | 0 | 0 | 0 | 0 |
| 1 | 0 | 0 | 0 | 1 | 0 | 0 | 0 | 0 | 0 | 0 | 0 | 0 | 0 | 0 | 0 |
| 0 | 0 | 1 | 0 | 0 | 0 | 0 | 0 | 0 | 0 | 0 | 1 | 1 | 0 | 0 | 0 |

FIG. 25H

| 0 | 0 | 0 | 0 | 0 | 0 | 0 | 0 | 0 | 0 | 0 | 0 | 0 | 0 | 0 |
|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 |

FIG. 25I

| 1 | 0 | 0 | 0 | 0 | 0 | 0 | 0 | 0 | 0 | 0 | 0 | 0 | 0 | 0 | 0 | 0 | 0 | 0 | 0 |
|---|---|---|---|---|---|---|---|---|---|---|---|---|---|---|---|---|---|---|---|
| 0 | 1 | 0 | 0 | 0 | 0 | 0 | 0 | 0 | 0 | 0 | 0 | 0 | 0 | 0 | 0 | 0 | 0 | 0 | 0 |
| 0 | 0 | 1 | 0 | 0 | 0 | 0 | 0 | 0 | 0 | 0 | 0 | 0 | 0 | 0 | 0 | 0 | 0 | 0 | 0 |
| 0 | 0 | 0 | 1 | 0 | 0 | 0 | 0 | 0 | 0 | 0 | 0 | 0 | 0 | 0 | 0 | 0 | 0 | 0 | 0 |
| 0 | 0 | 0 | 0 | 1 | 0 | 0 | 0 | 0 | 0 | 0 | 0 | 0 | 0 | 0 | 0 | 0 | 0 | 0 | 0 |
| 0 | 0 | 0 | 0 | 0 | 1 | 0 | 0 | 0 | 0 | 0 | 0 | 0 | 0 | 0 | 0 | 0 | 0 | 0 | 0 |
| 0 | 0 | 0 | 0 | 0 | 0 | 1 | 0 | 0 | 0 | 0 | 0 | 0 | 0 | 0 | 0 | 0 | 0 | 0 | 0 |
| 0 | 0 | 0 | 0 | 0 | 0 | 0 | 1 | 0 | 0 | 0 | 0 | 0 | 0 | 0 | 0 | 0 | 0 | 0 | 0 |
| 0 | 0 | 0 | 0 | 0 | 0 | 0 | 0 | 1 | 0 | 0 | 0 | 0 | 0 | 0 | 0 | 0 | 0 | 0 | 0 |
| 0 | 0 | 0 | 0 | 0 | 0 | 0 | 0 | 0 | 1 | 0 | 0 | 0 | 0 | 0 | 0 | 0 | 0 | 0 | 0 |
| 0 | 0 | 0 | 0 | 0 | 0 | 0 | 0 | 0 | 0 | 1 | 0 | 0 | 0 | 0 | 0 | 0 | 0 | 0 | 0 |
| 0 | 0 | 0 | 0 | 0 | 0 | 0 | 0 | 0 | 0 | 0 | 1 | 0 | 0 | 0 | 0 | 0 | 0 | 0 | 0 |
| 0 | 0 | 0 | 0 | 0 | 0 | 0 | 0 | 0 | 0 | 0 | 0 | 1 | 0 | 0 | 0 | 0 | 0 | 0 | 0 |
| 0 | 0 | 0 | 0 | 0 | 0 | 0 | 0 | 0 | 0 | 0 | 0 | 0 | 1 | 0 | 0 | 0 | 0 | 0 | 0 |
| 0 | 0 | 0 | 0 | 0 | 0 | 0 | 0 | 0 | 0 | 0 | 0 | 0 | 0 | 1 | 0 | 0 | 0 | 0 | 0 |
| 0 | 0 | 0 | 0 | 0 | 0 | 0 | 0 | 0 | 0 | 0 | 0 | 0 | 0 | 0 | 1 | 0 | 0 | 0 | 0 |
| 0 | 0 | 0 | 0 | 0 | 0 | 0 | 0 | 0 | 0 | 0 | 0 | 0 | 0 | 0 | 0 | 1 | 0 | 0 | 0 |
| 0 | 0 | 0 | 0 | 0 | 0 | 0 | 0 | 0 | 0 | 0 | 0 | 0 | 0 | 0 | 0 | 0 | 1 | 0 | 0 |
| 0 | 0 | 0 | 0 | 0 | 0 | 0 | 0 | 0 | 0 | 0 | 0 | 0 | 0 | 0 | 0 | 0 | 0 | 1 | 0 |
| 0 | 0 | 0 | 0 | 0 | 0 | 0 | 0 | 0 | 0 | 0 | 0 | 0 | 0 | 0 | 0 | 0 | 0 | 0 | 1 |

FIG. 26

| 26A | 26B | 26C |
| 26D | 26E | 26F |
| 26G | 26H | 26I |

FIG. 26A

| 121 | 9   | 19  | 93  |     |     | 168 |     |     | 51  | 0   | 0   |     |     |     |     |
|-----|-----|-----|-----|-----|-----|-----|-----|-----|-----|-----|-----|-----|-----|-----|-----|
| 116 |     |     | 149 | 111 | 2   | 21  | 184 | 140 | 69  |     | 0   | 0   |     |     |     |
| 108 | 180 |     | 147 | 77  |     |     |     | 64  |     | 1   |     | 0   | 0   |     |     |
|     | 115 | 81  |     | 163 | 187 | 56  | 73  | 14  | 22  | 0   |     |     | 0   |     |     |
| 145 | 122 |     |     |     |     |     |     |     |     |     | 67  |     |     | 0   |     |
| 124 | 121 |     |     |     | 4   |     | 37  |     |     |     | 145 |     |     |     | 0   |
| 141 |     |     |     |     | 185 |     | 124 |     | 171 |     | 151 |     |     |     |     | 0 |

FIG. 26D

|   | 185 |   |   | 150 |   | 190 |   |   | 165 |   | 134 |   |   |   |
|---|---|---|---|---|---|---|---|---|---|---|---|---|---|---|
| 83 | 178 |   |   |   |   |   |   |   |   | 186 |   |   |   |   |
|   | 73 |   |   |   |   | 87 |   | 175 | 123 |   |   |   |   |   |
| 16 | 158 |   |   |   | 179 | 173 |   |   |   |   |   |   |   |   |
| 130 |   |   |   |   |   | 104 |   | 174 |   |   | 52 |   |   |   |
|   | 179 |   | 39 |   |   |   |   |   |   | 139 |   |   |   |   |
| 128 | 23 |   |   |   |   |   | 105 |   |   |   | 111 |   |   |   |
|   | 88 |   |   |   | 95 |   |   |   |   | 85 | 187 |   |   |   |
| 108 |   |   |   |   |   |   |   |   | 60 | 98 |   |   |   |   |
|   | 130 |   |   |   |   |   |   | 12 |   | 35 | 176 |   |   |   |
|   | 134 |   |   | 19 |   |   |   |   |   | 0 | 127 |   |   |   |
| 1 |   |   |   |   |   | 78 | 163 |   |   |   |   |   |   |   |
| 97 | 54 |   |   |   |   |   |   |   | 27 |   |   |   |   |   |
|   | 94 |   | 28 |   |   |   |   |   |   | 185 |   |   |   |   |
| 83 |   |   |   |   |   |   | 79 |   |   |   | 116 |   |   |   |

FIG. 26G

| | | | | | | | | | | | | | | |
|---|---|---|---|---|---|---|---|---|---|---|---|---|---|---|
| | 22 | 67 | | | | | | | | | | | | |
| 97 | | | 43 | | 106 | | | | | | | | | |
| | | 102 | 104 | | | | | | 169 | | | | | |
| 171 | | | | | 121 | | | | | | | | | |
| | | 183 | | | | 148 | | | | 43 | 160 | | | |
| 108 | | | | | 176 | | | | | | | | | |
| | | 118 | 161 | | 191 | | | | | | | | | |
| 22 | | | | 22 | | | | | | | | | | |
| | | 135 | | | 74 | 154 | | 6 | | | | | | |
| | 137 | | | | | | | | | 35 | | | | |
| | | 62 | | | 186 | 141 | 46 | | | | | | | |
| | 175 | | | | | | | | 181 | | | | | |
| 14 | | | 20 | | | | | | | | | | | |
| | | 28 | | | 50 | 121 | | | | | | | | |
| | 135 | | | | | | | | 162 | | | | | |
| | | 58 | | | 15 | 94 | | | | | | | | |
| 63 | | | | | | | 172 | | 72 | | | | | |
| | | 105 | | | 137 | 14 | | | | | | | | |
| 17 | | | | 53 | | | | | | | | | | |
| | | 47 | | | | | | | | 38 | 25 | | | |

FIG. 27

| | | | | | | | | | | | | | | | |
|---|---|---|---|---|---|---|---|---|---|---|---|---|---|---|---|
| 121 | 74 | 89 | 122 | | | 141 | | | 137 | 0 | 0 | | | | |
| 118 | | | 0 | 25 | 171 | 133 | 79 | 173 | 121 | | 0 | 0 | | | |
| 42 | 121 | | 95 | 8 | | | 29 | | 1 | | | 0 | 0 | | |
| | 64 | 110 | | 143 | 78 | 90 | 9 | 55 | 90 | 0 | | | 0 | | |
| 31 | 48 | | | | | | | | | 162 | | | 0 | | |
| 28 | 29 | | | | 99 | | 142 | | | 80 | | | | 0 | |
| 17 | | | | | 38 | | 63 | | 26 | 167 | | | | | 0 |
| | 44 | | | | 68 | | 59 | | | 110 | | 86 | | | |
| 104 | 58 | | | | | | | | | | 53 | | | | |
| | 136 | | | | | | 135 | | 133 | 142 | | | | | |
| 153 | 15 | | | | 109 | 86 | | | | | | | | | |
| 4 | | | | | | 34 | | 168 | | | | 156 | | | |
| | 98 | | 60 | | | | | | | 172 | | | | | |
| 98 | 3 | | | | | | 89 | | | | | 108 | | | |
| | 30 | | | | 131 | | | | | 127 | 112 | | | | |
| 38 | | | | | | | | | 64 | 77 | | | | | |
| | 110 | | | | | | | | 42 | 10 | 82 | | | | |
| | 48 | | | | 66 | | | | | 61 | 161 | | | | |
| 90 | | | | | 47 | 63 | | | | | | | | | |
| 175 | 87 | | | | | | | | 59 | | | | | | |
| | 88 | | 150 | | | | | | | 12 | | | | | |
| 5 | | | | | | | 79 | | | | 137 | | | | |
| | 43 | 127 | | | | | | | | | | | | | |
| 78 | | | 32 | | 169 | | | | | | | | | | |
| | 1 | 150 | | | | | | 13 | | | | | | | |
| 39 | | | | | 21 | | | | | | | | | | |
| | | 23 | | | | | 82 | | | | 121 | 156 | | | |
| 74 | | | | | 166 | | | | | | | | | | |
| | 22 | 19 | | | 42 | | | | | | | | | | |
| 91 | | | | 133 | | | | | | | | | | | |
| | | 16 | | | 140 | | 56 | | 158 | | | | | | |
| | 165 | | | | | | | | | | | 23 | | | |
| | | 173 | | | 119 | | 164 | 75 | | | | | | | |
| | 172 | | | | | | | | | | 64 | | | | |
| 43 | | | 17 | | | | | | | | | | | | |
| | | 22 | | | 79 | 58 | | | | | | | | | |
| | 146 | | | | | | | | 23 | | | | | | |
| | | 95 | | | 148 | 99 | | | | | | | | | |
| 65 | | | | | | | 23 | | | 149 | | | | | |
| | | 8 | | | 12 | 152 | | | | | | | | | |
| 155 | | | | 19 | | | | | | | | | | | |
| | | 35 | | | | | | | | 31 | 107 | | | | |

| | | | | | | | | | | | | | | | |
|---|---|---|---|---|---|---|---|---|---|---|---|---|---|---|---|
| 109 | 223 | 171 | 209 | | | 4 | | | 0 | 0 | 0 | | | | |
| 36 | | | 236 | 40 | 226 | 226 | 157 | 11 | 204 | | 0 | 0 | | | |
| 15 | 131 | | 70 | 84 | | | | 170 | | 1 | | 0 | 0 | | |
| | 135 | 193 | | 97 | 158 | 177 | 11 | 96 | 223 | 0 | | | 0 | | |
| 117 | 19 | | | | | | | | | 78 | | | 0 | | |
| 40 | 119 | | | | 116 | | 133 | | | 102 | | | | 0 | |
| 6 | | | | | 37 | | 77 | | 213 | 138 | | | | | 0 |
| | 156 | | | | 215 | | 29 | | | 120 | | 243 | | | |
| 76 | 167 | | | | | | | | | | 210 | | | | |
| | 241 | | | | | | | 44 | | 22 | 51 | | | | |
| 244 | 221 | | | | 206 | 250 | | | | | | | | | |
| 194 | | | | | | 174 | | 95 | | | | 199 | | | |
| | 66 | | 134 | | | | | | | 255 | | | | | |
| 98 | 159 | | | | | | 68 | | | | | 17 | | | |
| | 245 | | | | 185 | | | | | 91 | | 249 | | | |
| 53 | | | | | | | | | 237 | 103 | | | | | |
| | 19 | | | | | | | | 214 | 151 | 241 | | | | |
| | 185 | | | 237 | | | | | | 41 | 122 | | | | |
| 111 | | | | 211 | 225 | | | | | | | | | | |
| 150 | 38 | | | | | | | | 66 | | | | | | |
| | 191 | | 250 | | | | | | | 214 | | | | | |
| 2 | | | | | | 232 | | | | | 76 | | | | |
| | 147 | 134 | | | | | | | | | | | | | |
| 25 | | | 235 | | 194 | | | | | | | | | | |
| | 6 | 11 | | | | | | 173 | | | | | | | |
| 11 | | | | 0 | | | | | | | | | | | |
| | | 6 | | | | 232 | | | | | 226 | 202 | | | |
| 232 | | | | | 19 | | | | | | | | | | |
| | 193 | 23 | | 142 | | | | | | | | | | | |
| 0 | | | 112 | | | | | | | | | | | | |
| | | 31 | | 245 | | 12 | | 2 | | | | | | | |
| | 0 | | | | | | | | | | 152 | | | | |
| | 243 | | 23 | 165 | 119 | | | | | | | | | | |
| | 235 | | | | | | | | | 97 | | | | | |
| 124 | | 6 | | | | | | | | | | | | | |
| | 179 | | 56 | 237 | | | | | | | | | | | |
| | 221 | | | | | | | 14 | | | | | | | |
| | 170 | | 189 | 13 | | | | | | | | | | | |
| 172 | | | | | 9 | | | 224 | | | | | | | |
| | 248 | | 87 | 166 | | | | | | | | | | | |
| 246 | | 133 | | | | | | | | | | | | | |
| | 18 | | | | | | | 245 | 69 | | | | | | |

FIG. 31

| 56 | 19 | 221 | 119 |  | 219 |  |  | 33 | 0 | 0 |  |  |  |  |
|---|---|---|---|---|---|---|---|---|---|---|---|---|---|---|
| 119 |  |  | 5 | 115 | 64 | 208 | 120 | 95 | 131 |  | 0 | 0 |  |  |
| 156 | 156 |  | 161 | 84 |  |  | 145 |  | 1 |  | 0 | 0 |  |  |
|  | 26 | 64 |  | 118 | 197 | 186 | 106 | 127 | 186 | 0 |  |  | 0 |  |
| 171 | 69 |  |  |  |  |  |  |  |  | 168 |  |  | 0 |  |
| 120 | 154 |  |  |  | 27 |  | 212 |  |  | 202 |  |  |  | 0 |
| 89 |  |  |  |  | 2 |  | 20 |  | 5 | 218 |  |  |  | 0 |
|  | 239 |  |  |  | 75 |  | 165 |  |  |  | 24 |  | 20 |  |
| 229 | 144 |  |  |  |  |  |  |  |  |  |  | 159 |  |  |
|  | 234 |  |  |  |  |  |  |  | 2 |  | 67 | 129 |  |  |
| 178 | 155 |  |  |  |  | 217 | 237 |  |  |  |  |  |  |  |
| 187 |  |  |  |  |  |  | 185 |  | 180 |  |  |  | 22 |  |
|  | 171 |  | 118 |  |  |  |  |  |  |  | 221 |  |  |  |
| 154 | 14 |  |  |  |  |  |  | 104 |  |  |  |  | 61 |  |
|  | 105 |  |  |  |  | 146 |  |  |  |  | 38 |  | 76 |  |
| 231 |  |  |  |  |  |  |  |  |  | 149 | 173 |  |  |  |
|  | 145 |  |  |  |  |  |  |  | 196 |  | 16 | 168 |  |  |
|  | 206 |  |  |  | 170 |  |  |  |  |  | 43 | 234 |  |  |
| 61 |  |  |  |  | 36 | 109 |  |  |  |  |  |  |  |  |
| 16 | 153 |  |  |  |  |  |  |  | 85 |  |  |  |  |  |
|  | 108 |  | 39 |  |  |  |  |  |  |  | 31 |  |  |  |
| 118 |  |  |  |  |  |  |  | 97 |  |  |  |  | 44 |  |
|  | 17 | 188 |  |  |  |  |  |  |  |  |  |  |  |  |
| 16 |  |  |  | 52 |  | 101 |  |  |  |  |  |  |  |  |
|  | 199 | 137 |  |  |  |  |  |  | 194 |  |  |  |  |  |
| 17 |  |  |  |  |  | 115 |  |  |  |  |  |  |  |  |
|  | 239 |  |  |  |  |  | 173 |  |  |  |  | 193 | 116 |  |
| 18 |  |  |  |  |  | 171 |  |  |  |  |  |  |  |  |
|  | 88 | 128 |  |  | 66 |  |  |  |  |  |  |  |  |  |
| 181 |  |  |  | 13 |  |  |  |  |  |  |  |  |  |  |
|  | 231 |  |  |  | 177 |  | 12 |  | 17 |  |  |  |  |  |
|  | 6 |  |  |  |  |  |  |  |  |  |  | 204 |  |  |
|  | 89 |  |  |  | 188 |  | 187 | 5 |  |  |  |  |  |  |
|  | 184 |  |  |  |  |  |  |  |  |  | 149 |  |  |  |
| 14 |  |  | 81 |  |  |  |  |  |  |  |  |  |  |  |
|  | 125 |  |  |  | 226 |  | 216 |  |  |  |  |  |  |  |
|  | 33 |  |  |  |  |  |  |  |  | 24 |  |  |  |  |
|  | 178 |  |  |  | 74 |  | 151 |  |  |  |  |  |  |  |
| 127 |  |  |  |  |  |  | 213 |  |  |  | 46 |  |  |  |
|  | 226 |  |  |  | 120 |  | 96 |  |  |  |  |  |  |  |
| 111 |  |  |  | 239 |  |  |  |  |  |  |  |  |  |  |
|  | 10 |  |  |  |  |  |  |  |  |  | 18 | 119 |  |  |

FIG. 32

| | | | | | | | | | | | | | | | |
|---|---|---|---|---|---|---|---|---|---|---|---|---|---|---|---|
| 191 | 100 | 49 | 135 | | | 36 | | | 80 | 0 | 0 | | | | |
| 119 | | | 26 | 219 | 57 | 199 | 89 | 25 | 42 | | 0 | 0 | | | |
| 19 | 25 | | 6 | 131 | | | | 55 | | 1 | | 0 | 0 | | |
| | 103 | 90 | | 140 | 4 | 38 | 53 | 29 | 36 | 0 | | | 0 | | |
| 172 | 35 | | | | | | | | | 17 | | | 0 | | |
| 96 | 121 | | | | 80 | | 207 | | | 183 | | | | 0 | |
| 6 | | | | | 143 | | 86 | | 15 | 98 | | | | | 0 |
| | 16 | | | | 18 | | 28 | | | 69 | | 50 | | | |
| 17 | 19 | | | | | | | | | | 77 | | | | |
| | 207 | | | | | | | 199 | | 87 | 39 | | | | |
| 34 | 202 | | | | | 29 | 174 | | | | | | | | |
| 176 | | | | | | | 19 | | 222 | | | 201 | | | |
| | 33 | | 100 | | | | | | | 55 | | | | | |
| 3 | 155 | | | | | | 114 | | | | | 195 | | | |
| | 168 | | | | 14 | | | | | 198 | | 14 | | | |
| 77 | | | | | | | | | 81 | 212 | | | | | |
| | 26 | | | | | | | 31 | | 193 | 20 | | | | |
| | 40 | | | 89 | | | | | | 27 | 194 | | | | |
| 33 | | | | | 132 | 194 | | | | | | | | | |
| 148 | 170 | | | | | | | | 170 | | | | | | |
| | 23 | | 182 | | | | | | | 212 | | | | | |
| 19 | | | | | | | 122 | | | | | 66 | | | |
| | 0 | 31 | | | | | | | | | | | | | |
| 49 | | | 134 | | 16 | | | | | | | | | | |
| | 64 | 72 | | | | | | 180 | | | | | | | |
| 221 | | | | | 33 | | | | | | | | | | |
| | | 27 | | | | | 87 | | | | | 157 | 187 | | |
| 201 | | | | | | 72 | | | | | | | | | |
| | 219 | 202 | | | 68 | | | | | | | | | | |
| 153 | | | | 196 | | | | | | | | | | | |
| | | 68 | | | 217 | | 131 | | 93 | | | | | | |
| | 193 | | | | | | | | | | | 141 | | | |
| | | 13 | | | 65 | | 29 | 122 | | | | | | | |
| | 169 | | | | | | | | | | | 120 | | | |
| 163 | | | 147 | | | | | | | | | | | | |
| | | 61 | | | 162 | | 92 | | | | | | | | |
| | 104 | | | | | | | | 49 | | | | | | |
| | | 152 | | | 205 | | 22 | | | | | | | | |
| 104 | | | | | | | 51 | | | | | 147 | | | |
| | | 107 | | | 134 | | 164 | | | | | | | | |
| 219 | | | | 78 | | | | | | | | | | | |
| | | 134 | | | | | | | | | | 134 | 167 | | |

FIG. 33

| 153 | 19 | 47 | 79 | | | 19 | | | 90 | 0 | 0 | | | | |
|---|---|---|---|---|---|---|---|---|---|---|---|---|---|---|---|
| 58 | | | 201 | 157 | 100 | 42 | 46 | 15 | 19 | | 0 | 0 | | | |
| 48 | 160 | | 172 | 169 | | | 169 | | 1 | | 0 | 0 | | | |
| | 38 | 2 | | 196 | 50 | 192 | 81 | 98 | 85 | 0 | | | 0 | | |
| 169 | 94 | | | | | | | | 8 | | 0 | | | | |
| 20 | 76 | | | 102 | | 136 | | | 186 | | | 0 | | | |
| 121 | | | | 160 | | 180 | | 161 | 172 | | | | | | 0 |
| | 104 | | | 109 | | 109 | | | 106 | | 81 | | | | |
| 107 | 133 | | | | | | | | | 197 | | | | | |
| | 49 | | | | | 4 | | 164 | 128 | | | | | | |
| 165 | 172 | | | | 11 | 148 | | | | | | | | | |
| 85 | | | | | 111 | | 161 | | | 113 | | | | | |
| | 84 | | 128 | | | | | | 198 | | | | | | |
| 54 | 129 | | | | | 10 | | | | 59 | | | | | |
| | 165 | | | | 77 | | | | 125 | 131 | | | | | |
| 74 | | | | | | | | | 72 | 48 | | | | | |
| | 160 | | | | | | | 134 | | 194 | 93 | | | | |
| | 194 | | | 78 | | | | | | 158 | 91 | | | | |
| 193 | | | | | 19 | 14 | | | | | | | | | |
| 71 | 134 | | | | | | | | 39 | | | | | | |
| | 5 | | 49 | | | | | | | 159 | | | | | |
| 61 | | | | | | 48 | | | | | 82 | | | | |
| | 162 | 39 | | | | | | | | | | | | | |
| 37 | | 201 | | 174 | | | | | | | | | | | |
| | 191 | 176 | | | | | | | 178 | | | | | | |
| 191 | | | | 9 | | | | | | | | | | | |
| | 94 | | | | | 83 | | | | 142 | 198 | | | | |
| 188 | | | | 176 | | | | | | | | | | | |
| | 44 | 68 | | 33 | | | | | | | | | | | |
| 10 | | 91 | | | | | | | | | | | | | |
| | 62 | | | 17 | | 135 | | 39 | | | | | | | |
| | 187 | | | | | | | | | 58 | | | | | |
| | 25 | | | 99 | 54 | 18 | | | | | | | | | |
| | 107 | | | | | | | | | 24 | | | | | |
| 80 | | 168 | | | | | | | | | | | | | |
| | 121 | | 173 | 16 | | | | | | | | | | | |
| | 187 | | | | | | | 75 | | | | | | | |
| | 69 | | 51 | 132 | | | | | | | | | | | |
| 111 | | | | | 31 | | | 151 | | | | | | | |
| | 195 | | 161 | 165 | | | | | | | | | | | |
| 105 | | 187 | | | | | | | | | | | | | |
| | 187 | | | | | | | | 29 | 8 | | | | | |

METHOD AND APPARATUS FOR CHANNEL ENCODING AND DECODING IN COMMUNICATION OR BROADCASTING SYSTEM

CROSS-REFERENCE TO RELATED APPLICATIONS

This application is a continuation of application Ser. No. 15/971,877, filed May 4, 2018, which claims priority under 35 U.S.C. § 119 to Korean Patent Application Nos. 10-2017-0057072, filed on May 4, 2017, 10-2017-0071906 filed on Jun. 8, 2017, and 10-2017-0075159 filed on Jun. 14, 2017, in the Korean Intellectual Property Office, the disclosure of which is incorporated by reference herein in its entirety.

BACKGROUND

1. Field

The present disclosure relates to a method and apparatus for channel encoding and decoding in a communication or broadcasting system.

2. Description of Related Art

To meet the demand for wireless data traffic having increased since deployment of 4G communication systems, efforts have been made to develop an improved 5G or pre-5G communication system. Therefore, the 5G or pre-5G communication system is also called a 'Beyond 4G Network' or a 'Post LTE System'.

The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems.

In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like.

In the 5G system, Hybrid FSK and QAM Modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

In communication or broadcasting systems, the link performance may be degraded significantly due to various noises of a channel, fading phenomena, and inter-symbol interference (ISI). Therefor, in order to realize high-speed digital communication or broadcasting systems, such as next generation mobile communication, digital broadcasting, and mobile Internet, that require high data throughput and reliability, it is desirable to develop techniques for overcoming noises, fading, and ISI. As one of such techniques, an error-correcting code capable of efficiently restoring the distortion of information and improving the reliability of communication has been studied in these days.

SUMMARY

The present disclosure provides LDPC encoding and decoding methods and apparatuses capable of supporting various input lengths and coding rates.

The present disclosure proposes a method for designing a dedicated LDPC code suitable for a case where the number of information bits is small and a coding rate is fixed.

According to the present disclosure, a channel encoding method of a transmitter in a communication system comprises performing low density parity check (LDPC) encoding for a bit sequence based on first information, the first information being identified based on second information and third information; and transmitting the encoded bit sequence to a receiver, and wherein the second information indicates information on non-zero blocks in the first information, and wherein the third information indicates information on values associated with the non-zero blocks.

The channel encoding method may further comprise determining a size of the bit sequence to which the LDPC encoding is to be applied; determining a block size (Z), based on the bit sequence size.

The second information may include thirty-two rows corresponding to a sequence given below.
0 1 2 3 6 9 10 11
0 3 4 5 6 7 8 9 11 12
0 1 3 4 8 10 12 13
1 2 4 5 6 7 8 9 10 13
0 1 11 14
0 1 5 7 11 15
0 5 7 9 11 16
1 5 7 11 13 17
0 1 12 18
1 8 10 11 19
0 1 6 7 20
0 7 9 13 21
1 3 11 22
0 1 8 13 23
1 6 11 13 24
0 10 11 25
1 9 11 12 26
1 5 11 12 27
0 6 7 28
0 1 10 29
1 4 11 30
0 8 13 31
1 2 32
0 3 5 33
1 2 9 34
0 5 35
2 7 12 13 36
0 6 37
1 2 5 38
0 4 39
2 5 7 9 40
1 13 41

The block size (Z) may be determined as one of values given below.
Z1'={3, 6, 12, 24, 48, 96, 192, 384}
Z2'={11, 22, 44, 88, 176, 352}
Z3'={5, 10, 20, 40, 80, 160, 320}
Z4'={9, 18, 36, 72, 144, 288}
Z5'={2, 4, 8, 16, 32, 64, 128, 256}
Z6'={15, 30, 60, 120, 240}
Z7'={7, 14, 28, 56, 112, 224}
Z8'={13, 26, 52, 104, 208} a non-zero block may be a circulant permutation matrix determined based on a result of a modulo operation between the block size (Z) and the exponent value indicated by the third information. The second information may be capable of indicating positions of blocks of up to 42 rows and 52 columns.

In addition, a channel decoding method of a receiver in a communication system comprises performing low density parity check (LDPC) decoding for a demodulated received signal based on first information, the first information being identified based on second information and third information, and wherein the second information indicates information on non-zero blocks in the first information, and wherein the third information indicates information on values associated with the non-zero blocks.

In addition, a transmitter performing channel encoding in a communication system comprises a controller configured to control to: perform low density parity check (LDPC) encoding for a bit sequence based on first information, the first information being identified based on second information and third information, and a transceiver configured to transmit the encoded bit sequence to a receiver, wherein the second information indicates information on non-zero blocks in the first information, and wherein the third information indicates information on values associated with the non-zero blocks.

In addition, a receiver performing channel decoding in a communication system comprises a transceiver configured to receive a signal from a transmitter; and a controller configured to: perform low density parity check (LDPC) decoding for a demodulated received signal based on first information, the first information being identified based on second information and third information, and wherein the second information indicates information on non-zero blocks in the first information, and wherein the third information indicates information on values associated with the non-zero blocks.

According to the present disclosure, it is possible to efficiently perform LDPC encoding for variable lengths and variable rates.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIGS. 11, 11A, and 11B are diagrams illustrating an example of an LDPC code exponential matrix according to an embodiment of the present disclosure.

FIGS. 12, 12A, and 12B are diagrams illustrating another example of an LDPC code exponential matrix according to an embodiment of the present disclosure.

FIGS. 13, 13A, and 13B are diagrams illustrating still another example of an LDPC code exponential matrix according to an embodiment of the present disclosure.

FIGS. 14, 14A, and 14B are diagrams illustrating yet another example of an LDPC code exponential matrix according to an embodiment of the present disclosure.

Figure 15A:
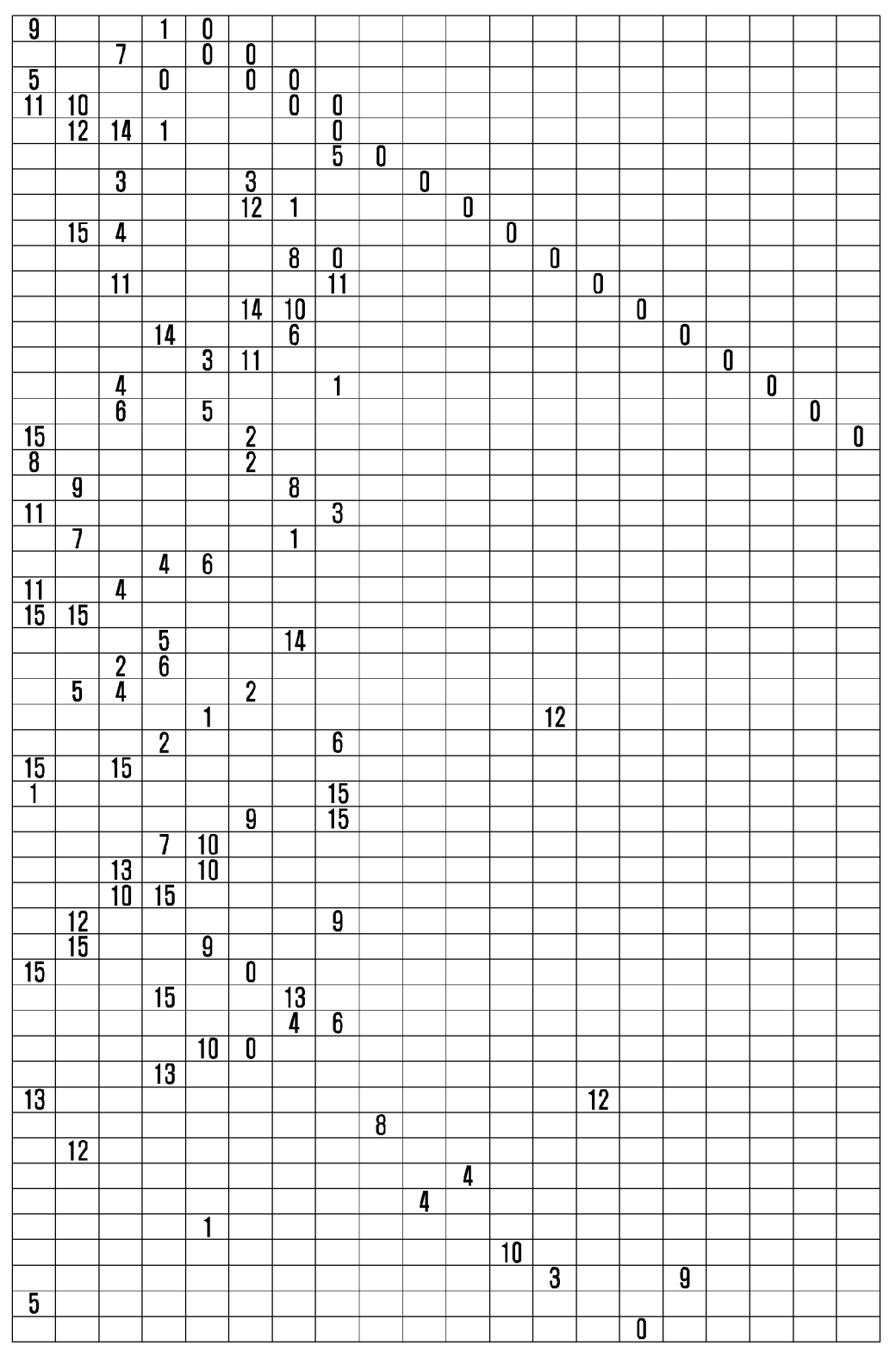

FIGS. 15, 15A, and 15B are diagrams illustrating further another example of an LDPC code exponential matrix according to an embodiment of the present disclosure.

FIGS. 16, 16A, and 16B are diagrams illustrating an example of an LDPC code base matrix according to an embodiment of the present disclosure.

FIGS. 17, 17A, and 17B are diagrams illustrating further another example of an LDPC code exponential matrix according to an embodiment of the present disclosure.

FIGS. 18, 18A, and 18B are diagrams illustrating further another example of an LDPC code exponential matrix according to an embodiment of the present disclosure.

FIGS. 19, 19A, and 19B are diagrams illustrating further another example of an LDPC code exponential matrix according to an embodiment of the present disclosure.

FIGS. 20, 20A, and 20B are diagrams illustrating further another example of an LDPC code exponential matrix according to an embodiment of the present disclosure.

FIGS. 21, 21A, and 21B are diagrams illustrating further another example of an LDPC code exponential matrix according to an embodiment of the present disclosure.

FIGS. 22, 22A, and 22B are diagrams illustrating further another example of an LDPC code exponential matrix according to an embodiment of the present disclosure.

FIGS. 23, 23A, and 23B are diagrams illustrating further another example of an LDPC code exponential matrix according to an embodiment of the present disclosure.

FIGS. 24, 24A, and 24B are diagrams illustrating further another example of an LDPC code exponential matrix according to an embodiment of the present disclosure.

FIGS. 25 and 25A to 25I are diagrams illustrating another example of an LDPC code base matrix according to an embodiment of the present disclosure.

Figure 26:
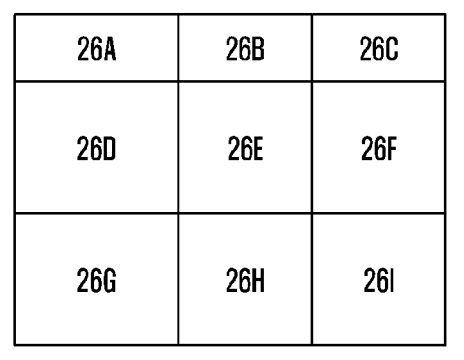

FIGS. 26 and 26A to 26I are diagrams illustrating further another example of an LDPC code exponential matrix according to an embodiment of the present disclosure.

FIG. 27 is a diagram illustrating further another example of an LDPC code exponential matrix according to an embodiment of the present disclosure.

Figure 28:
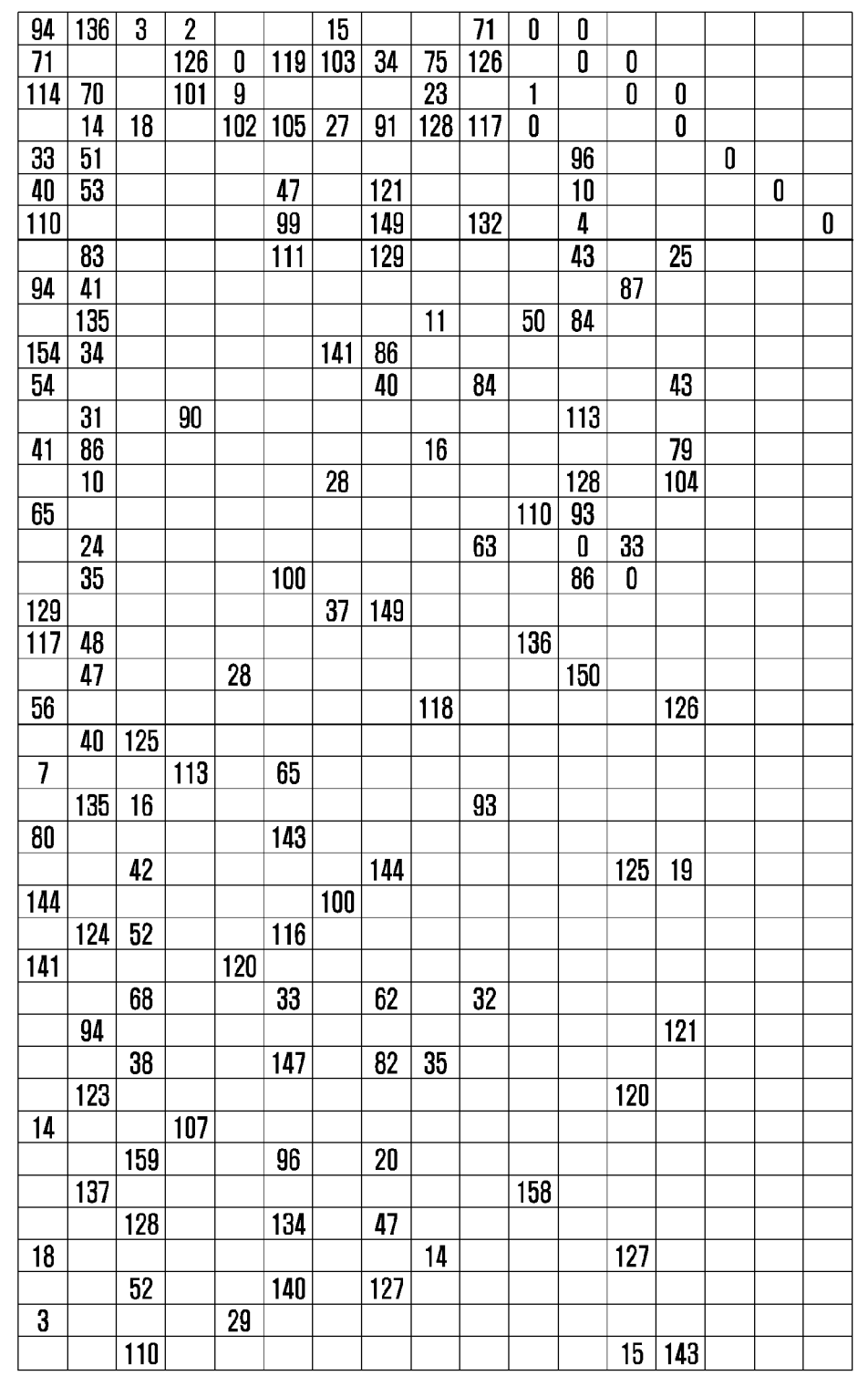

FIG. 28 is a diagram illustrating further another example of an LDPC code exponential matrix according to an embodiment of the present disclosure.

Figure 29:
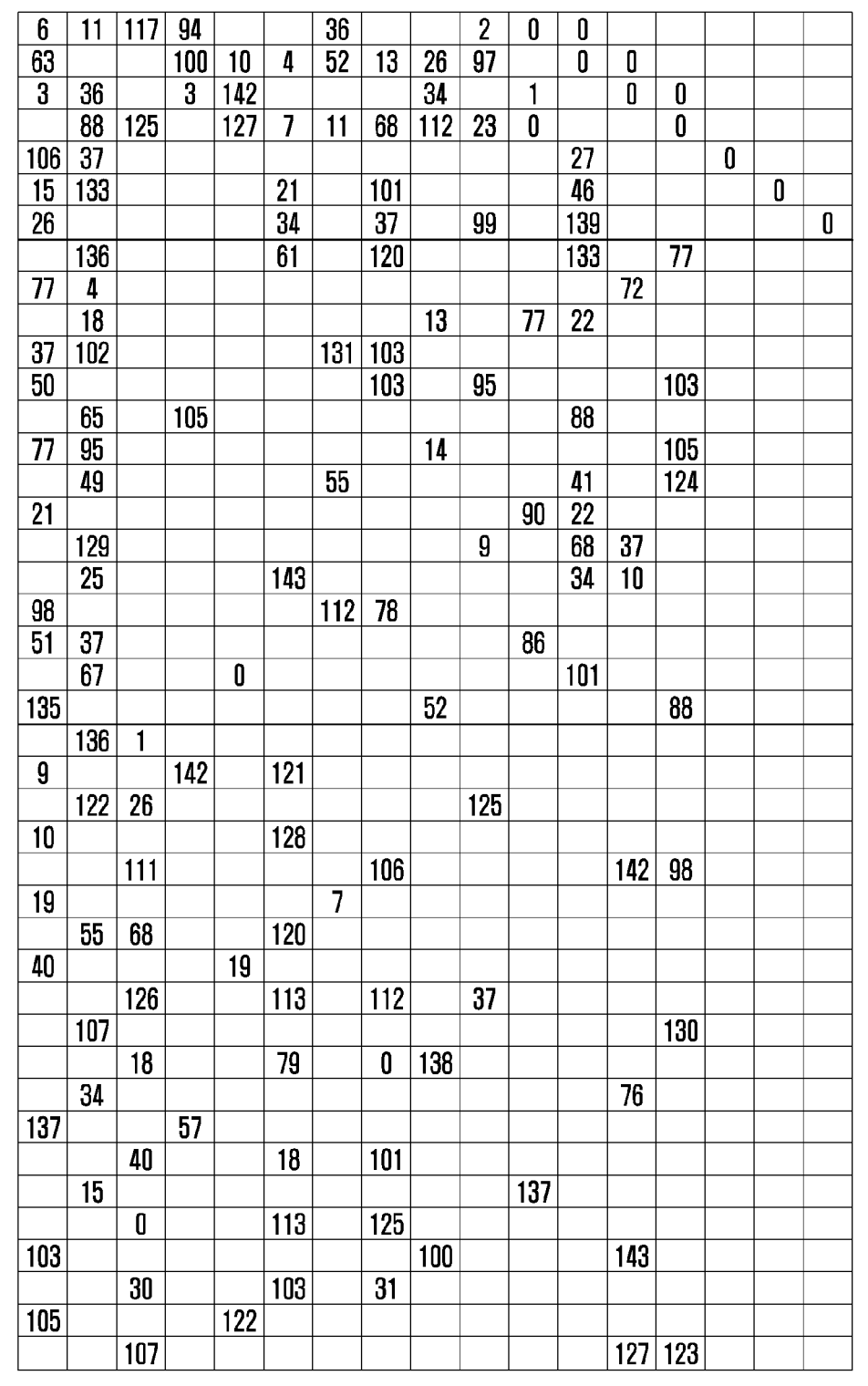

FIG. 29 is a diagram illustrating further another example of an LDPC code exponential matrix according to an embodiment of the present disclosure.

FIG. 30 is a diagram illustrating further another example of an LDPC code exponential matrix according to an embodiment of the present disclosure.

FIG. 31 is a diagram illustrating further another example of an LDPC code exponential matrix according to an embodiment of the present disclosure.

FIG. 32 is a diagram illustrating further another example of an LDPC code exponential matrix according to an embodiment of the present disclosure.

FIG. 33 is a diagram illustrating further another example of an LDPC code exponential matrix according to an embodiment of the present disclosure.

DETAILED DESCRIPTION

Figure 1:
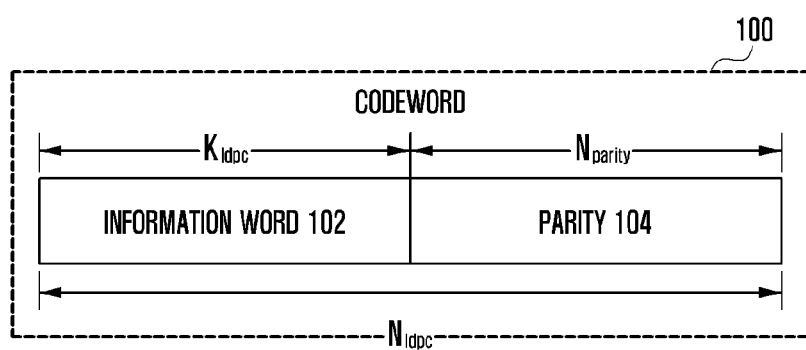
FIG. 1 is a diagram illustrating a structure of a systematic LDPC codeword.

FIGS. 1 through 33, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Hereinafter, embodiments of the present disclosure will be described in detail with reference to the accompanying drawings. In the following, the descriptions of techniques that are well known in the art and not directly related to the present disclosure are omitted. This is to clearly convey the subject matter of the present disclosure by omitting an unnecessary explanation. In addition, the terms used herein are defined in consideration of functionality and may be changed according to the intention of users, operators, or the like. Therefore, the definition should be based on the contents throughout this disclosure.

Also, as understood by a person skilled in the art, the subject matter of this disclosure may be applied to other systems having similar technical backgrounds without departing from the scope of the present disclosure.

The advantages and features of the present disclosure and the manner of achieving them will become apparent with reference to embodiments to be described in detail below with reference to the accompanying drawings. The present disclosure may, however, be embodied in many different forms and should not be construed as limited to embodiments set forth herein. Rather, these embodiments are provided to fully convey the subject matter of this disclosure to those skilled in the art. Like reference numerals refer to like elements throughout this disclosure.

A low density parity check (LDPC) code, first introduced by Gallager in the 1960s, has been long forgotten due to the complexity of implementation. However, as a turbo code proposed by Berrou, Glavieux, and Thitimaj shima in 1993 showed performance close to the channel capacity of Shannon, many interpretations about the performance and characteristics of the turbo code were made, and also many studies of channel encoding based on iterative decoding and graph were performed. Motivated by this, the LDPC code was studied again in the late 1990s. As a result, it was found that the LDCP code as well has performance close to the channel capacity of Shannon when iterative decoding based on a sum-product algorithm is applied on the Tanner graph corresponding to the LDPC code.

In general, the LDPC code is defined as a parity-check matrix and may be represented using a bipartite graph, which is commonly referred to as a Tanner graph.

FIG. 1 is a diagram illustrating a structure of a systematic LDPC codeword.

Referring to FIG. 1, LDPC encoding is performed on input of an information word 102 composed of $K_{ldpc}$ bits or symbols, so that a codeword 100 composed of $N_{ldpc}$ bits or symbols is generated. Hereinafter, for convenience of explanation, it is assumed that the codeword 100 composed of $N_{ldpc}$ bits is generated by receiving the information word 102 including $K_{ldpc}$ bits. That is, when the information word 102 of $K_{ldpc}$ input bits, $I=[i_0, i_1, i_2, \ldots, i_{K_{ldpc}-1}]$, is subjected to LDPC encoding, the codeword 100, $c=[c_0, c_1, c_2, \ldots, c_{N_{ldpc}-1}]$, is generated. That is, each of the information word and the codeword is a bit string composed of a plurality of bits, and thus an information word bit or a codeword bit means each bit constituting the information word or the codeword. Typically, when a codeword includes an information word, i.e., $C=[c_0, c_1, c_2, \ldots, c_{N_{ldpc}-1}]=[i_0, i_1, i_2, \ldots, i_{K_{ldpc}-1}, p_0, p_1, p_2, \ldots, p_{N_{ldpc}-K_{ldpc}-1}]$, this is referred to as a systematic code. Here, $P=[p_0, p_1, p_2, \ldots, p_{N_{ldpc}-K_{ldpc}-1}]$ is parity bits 104, and the number of parity bits may be represented as $N_{parity}=N_{ldpc}-K_{ldpc}$.

The LDPC code is a type of linear block code and includes a process of determining a codeword that satisfies the following Equation 1.

$$H \cdot c^T = \begin{bmatrix} h_1 & h_2 & h_3 & \cdots & h_{N_{ldpc}-1} \end{bmatrix} \cdot c^T \qquad \text{Equation 1}$$

$$= \sum_{i=0}^{N_{ldpc}} c_i \cdot h_i = 0$$

Here, $c=[c_0, c_1, c_2, \ldots, c_{N_{ldpc}-1}]$

In Equation 1, H denotes a parity check matrix, C denotes a codeword, $c_i$ denotes the i-th bit of a codeword, and $N_{ldpc}$ denotes an LDPC codeword length. Here, $h_i$ denotes the i-th column of the parity check matrix H.

The parity check matrix H is composed of $N_{ldpc}$ columns equal to the number of bits of the LDPC codeword. Equation 1 means that the sum of products of the i-th column $h_i$ of the parity check matrix and the i-th codeword bit $c_i$ is zero, thus meaning that the i-th column $h_i$ is related to the i-th codeword bit $c_i$.

Now, a graphical representation method of an LDPC code will be described with reference to FIG. 2.

Figure 2:
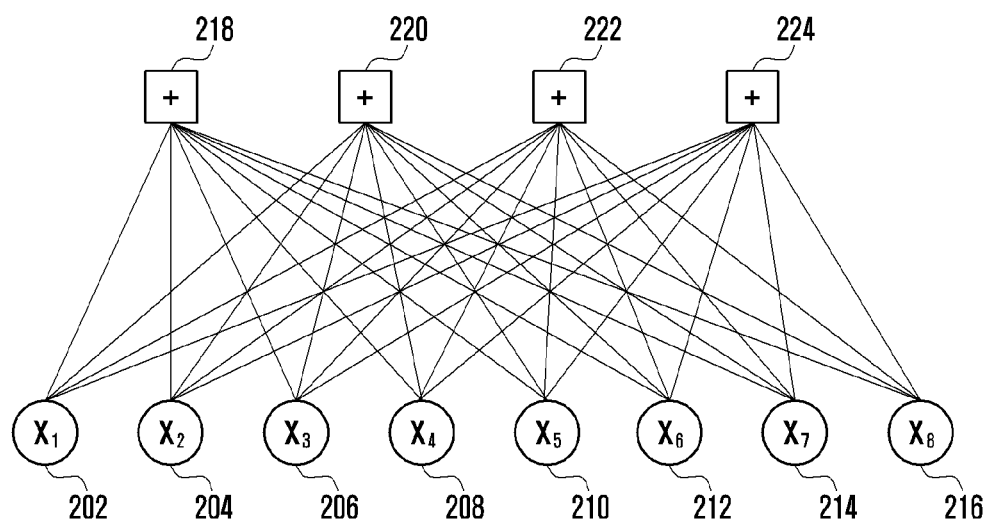
FIG. 2 is a diagram illustrating a graph representation method of an LDPC code.
Figure 3A:
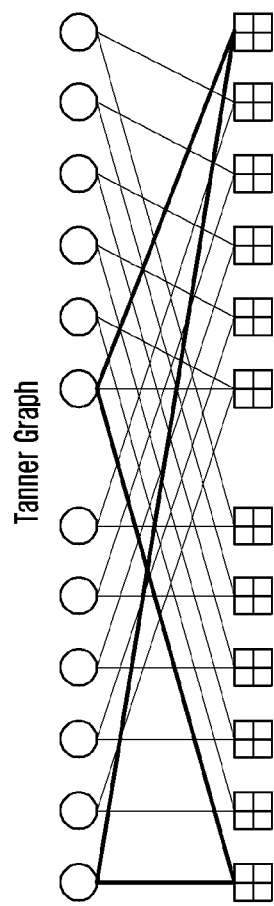
FIGS. 3A and 3B are diagrams illustrating cycle characteristics of a QC-LDPC code.
Figure 3A:
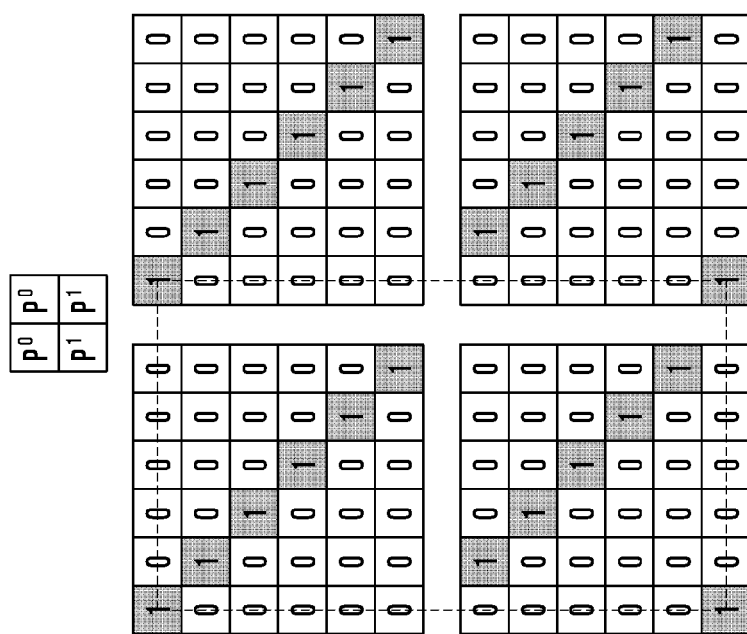
Figure 3B:
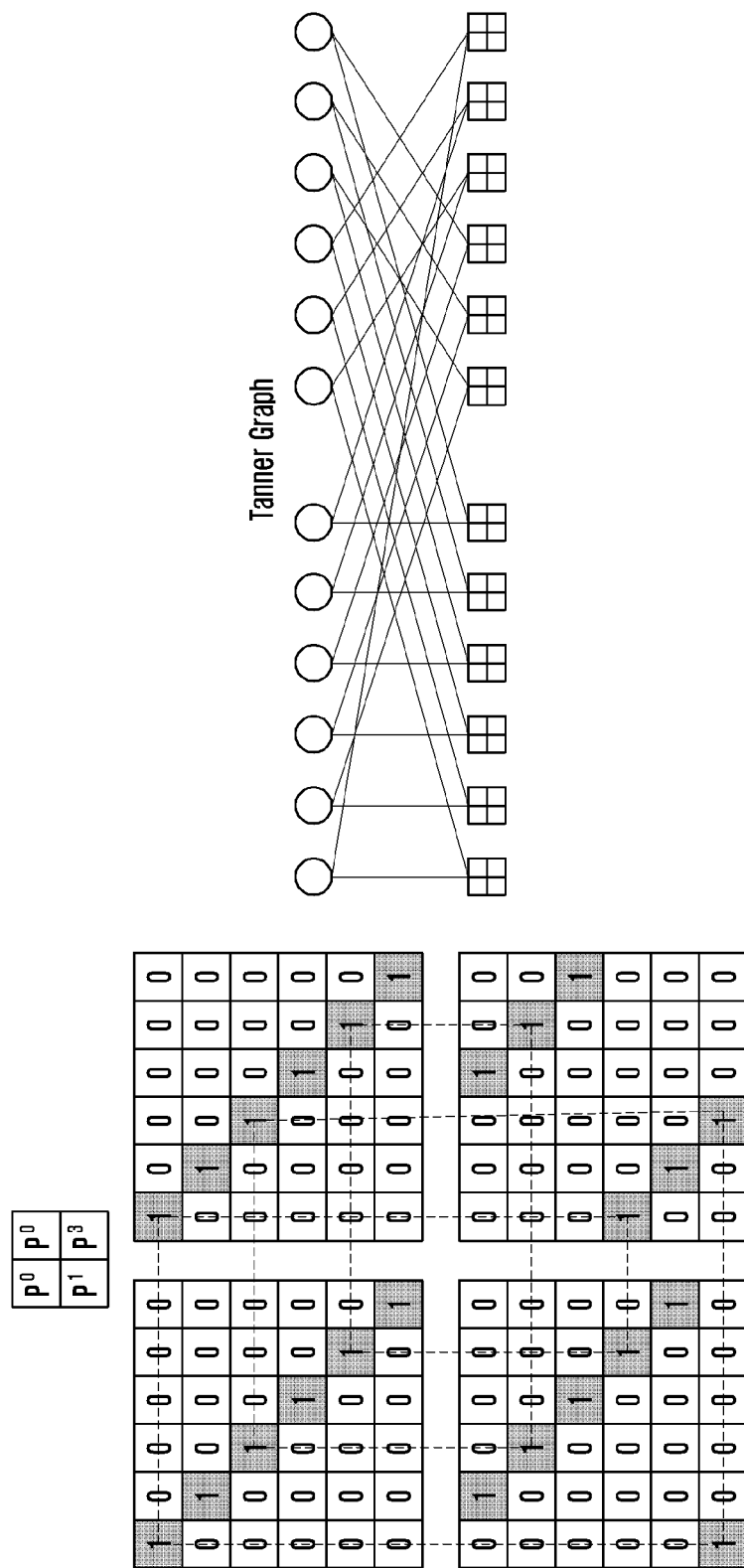

FIG. 2 shows an example of a parity check matrix $H_1$ of an LDPC code, composed of four rows and eight columns, and a Tanner graph thereof. Referring to FIG. 2, the parity check matrix $H_1$ having eight columns generates a codeword having a length of 8. A code generated through $H_1$ means an LDPC code, and each column corresponds to encoded 8 bits.

Referring to FIG. 2, the Tanner graph of the LDPC code for encoding and decoding based on the parity check matrix $H_1$ includes eight variable nodes, i.e., $x_1$ 202, $x_2$ 204, $x_3$ 206, $x_4$ 208, $x_5$ 210, $x_6$ 212, $x_7$ 214, and $x_8$ 216, and four check nodes 218, 220, 222, and 224. Here, the i-th column and the j-th row of the parity check matrix $H_1$ of the LDPC code correspond to the variable node $x_i$ and the j-th check node, respectively. The value of 1, that is, a value other than 0, at the intersection of the i-th column and the j-th row in the parity check matrix $H_1$ of the LDPC code means that there is an edge (or referred to as a segment) connecting the variable node $x_i$ and the j-th check node in the Tanner graph.

In the Tanner graph of the LDPC code, the degree of each of the variable node and the check node means the number of edges connected to each node, and this is equal to the number of non-zero entries (or referred to as non-zero elements) in the column or row corresponding to a relevant node in the parity check matrix of the LDPC code. For example, in FIG. 2, the degrees of the variable nodes 202, 204, 206, 208, 210, 212, 214, and 216 are 4, 3, 3, 3, 2, 2, 2, and 2, respectively, and the degrees of the check nodes 218, 220, 222, and 224 are 6, 5, 5, and 5, respectively. Also, in FIG. 2, the numbers of non-zero entries in the respective columns of the parity check matrix $H_1$ corresponding to the variable nodes are equal to the above degrees 4, 3, 3, 3, 2, 2, 2, and 2, respectively, and the numbers of non-zero entries in the respective rows of the parity check matrix $H_1$ corresponding to the check nodes are equal to the above degrees 6, 5, 5, and 5, respectively.

The LDPC code may be decoded using an iterative decoding algorithm based on a sum-product algorithm on the bipartite graph shown in FIG. 2. Here, the sum-product algorithm is a kind of message passing algorithm, which indicates an algorithm for exchanging messages through an edge on the bipartite graph and performing update by calculating an output message from messages inputted to the variable node or the check node.

Here, the value of the i-th encoded bit may be determined, based on a message of the i-th variable node. The value of the i-th encoded bit is available for both a hard decision and a soft decision. Therefore, the performance of the i-th bit $c_i$ of the LDPC codeword corresponds to the performance of the i-th variable node of the Tanner graph, and this may be determined according to the position and number of 1 s in the i-th column of the parity check matrix. That is, the performance of the $N_{ldpc}$ codeword bits of the codeword may depend on the position and number of 1 s of the parity check matrix. This means that the performance of the LDPC code is greatly affected by the parity check matrix. Therefore, a method for designing a good parity check matrix is desired to design the LDPC code with excellent performance.

In the communication or broadcasting systems, a quasi-cyclic LDPC code (hereinafter, a QC-LDPC code) using a parity check matrix of a quasi-cyclic form is used typically for easy implementation.

The QC-LDPC code is characterized by having a parity check matrix composed of zero matrices or circulant permutation matrices, which have a small square matrix form. Here, the permutation matrix means a matrix in which each row or column contains a single entry of 1 and the other entries of 0. The circulant permutation matrix means a matrix obtained by circularly shifting all entries of the identity matrix to the right.

Hereinafter, the QC-LDPC code will be described in detail.

First, a circulant permutation matrix, $P=(P_{i,j})$, having a size of L×L is defined as shown in Equation 2. Here, $P_{i,j}$ (0≤i, j<L) denotes an entry (or referred to as an element) of the i-th row and the j-th column in the matrix P.

$$P_{i,j} = \begin{cases} 1 & \text{if } i+1 \equiv j \bmod L \\ 0 & \text{otherwise.} \end{cases} \quad \text{Equation 2}$$

With respect to the permutation matrix P defined as above, $P^i$ (0≤i<L) is a circulant permutation matrix obtained by circularly shifting respective entries of the identity matrix rightward by i times.

A parity check matrix H of the simplest QC-LDPC code may be represented in the form of the following Equation 3.

$$H = \begin{bmatrix} P^{a_{11}} & P^{a_{12}} & \cdots & P^{a_{1n}} \\ P^{a_{21}} & P^{a_{22}} & \cdots & P^{a_{2n}} \\ \vdots & \vdots & \ddots & \vdots \\ P^{a_{m1}} & P^{a_{m2}} & \cdots & P^{a_{mn}} \end{bmatrix} \quad \text{Equation 3}$$

If $P^{-1}$ is defined as a zero matrix having a size of L×L, each exponent $a_{ij}$ of the circulant permutation matrix or the zero matrix in Equation 3 has one of values {−1, 0, 1, 2, . . . , L−1}. Also, the parity check matrix H of Equation 3 has a size of mL×nL because of having n column blocks and m row blocks.

If the parity check matrix of Equation 3 has a full rank, the size of information bits of a QC-LDPC code corresponding to the parity check matrix becomes (n−m)*L. For convenience, (n−m) column blocks corresponding to information bits are referred to as information word column blocks, and m column blocks corresponding to the remaining parity bits are referred to as parity column blocks.

Normally, a binary matrix having a size of m×n obtained by replacing the circulant permutation matrix and the zero matrix by 1 and 0, respectively, in the parity check matrix of Equation 3 is referred to as a mother matrix or base matrix M(H) of the parity check matrix H. In addition, an integer matrix having a size of m×n obtained as shown in Equation 4 by selecting exponents of the circulant permutation matrix and the zero matrix is referred to as an exponential matrix E(H) of the parity check matrix H.

$$E(H) = \begin{bmatrix} a_{11} & a_{12} & \cdots & a_{1n} \\ a_{21} & a_{22} & \cdots & a_{2n} \\ \vdots & \vdots & \ddots & \vdots \\ a_{m1} & a_{m2} & \cdots & a_{mn} \end{bmatrix}$$ Equation 4

As a result, one integer included in the exponential matrix corresponds to the circulant permutation matrix in the parity check matrix, so that the exponential matrix may be represented as an integer sequence for convenience. This sequence will be referred as an LDPC sequence or an LDPC code sequence to distinguish it from another sequence. In general, the parity check matrix may be represented not only as the exponential matrix but also as a sequence having the same characteristics algebraically. In this disclosure, the parity check matrix is represented as an exponential matrix or a sequence that indicates the positions of 1 s in the parity check matrix. However, because there are various sequence notation methods for distinguishing the positions of 1 s or 0 s included in the parity check matrix, it is possible to alternatively represent a variety of sequence forms that exhibit the same effect algebraically.

In addition, a transmitting/receiving apparatus of a device may directly generate the parity check matrix to perform LDPC encoding and decoding. However, depending on characteristics of implementation, the LDPC encoding and decoding may be performed using the exponential matrix or sequence having the same algebraic effect as the parity check matrix has. Therefore, although the encoding and decoding using the parity check matrix are described for convenience in this disclosure, the present disclosure may be implemented actually in a device through various methods capable of achieving the same effect as the parity check matrix does.

For reference, the same algebraic effect means that two or more different representations are completely identical or converted to each other logically or mathematically.

Although described in this disclosure is a case where the circulant permutation matrix corresponding to one block is single, the present disclosure may be equally applied to another case where a plurality of circulant permutation matrices are included in one block. For example, when the sum of two circulant permutation matrices $P^{a_{ij}^{(1)}}$, $P^{a_{ij}^{(2)}}$ is included in one position of the i-th row block and the j-th column block as shown in Equation 5, the exponential matrix may be expressed as shown in Equation 6. As seen from Equation 6, two integers are contained in a position of the i-th row and the j-th column that correspond to the above position containing the sum of circulant permutation matrices.

$$H = \begin{bmatrix} \ddots & \square & \square & \cdot^{\cdot^{\cdot}} \\ \square & P^{a_{ij}^{(1)}} + P^{a_{ij}^{(2)}} & \square & \square \\ \square & & \square & \square \\ \cdot^{\cdot^{\cdot}} & \square & \square & \ddots \end{bmatrix}$$ Equation 5

$$E(H) = \begin{bmatrix} \ddots & \square & \square & \cdot^{\cdot^{\cdot}} \\ \square & (a_{ij}^{(1)}, a_{ij}^{(2)}) & \square & \square \\ \square & & \square & \square \\ \cdot^{\cdot^{\cdot}} & \square & \square & \ddots \end{bmatrix}$$ Equation 6

Although the QC-LDPC code normally allows a plurality of circulant permutation matrices to correspond to one row/column block in the parity check matrix as described above, the present disclosure will describe a case where one circulant permutation matrix corresponds to one block. This is, however, exemplary only and is not to be construed as a limitation. For reference, a matrix having a size of L×L in which a plurality of circulant permutation matrices are overlapped in one row/column block is referred to as a circulant matrix or circulant.

Meanwhile, a mother matrix or a base matrix for the parity check matrix and the exponential matrix of Equations 5 and 6 means a binary matrix obtained by replacing the circulant permutation matrix and the zero matrix by 1 and 0, respectively, similarly to the definition used in Equation 3. Also, the sum of a plurality of circulant permutation matrices included in one block (i.e., a circulant matrix) is replaced simply by 1.

Because the performance of the LDPC code is determined according to the parity check matrix, it is desirable to design the parity check matrix for the LDPC code having excellent performance. Also, there is a desire for an LDPC encoding or decoding method capable of supporting various input lengths and coding rates.

Lifting refers to a method used not only for efficiently designing the QC-LDPC code but also for generating the parity check matrices or LDPC codewords of various lengths from a given exponential matrix. That is, the lifting may be applied to efficiently design a very large parity check matrix by setting an L value that determines the size of the circulant permutation matrix or the zero matrix from a given small mother matrix according to a specific rule, or is used to generate the parity check matrices or LDPC codewords having various lengths by applying an appropriate L value to a given exponential matrix or corresponding sequence.

A typical lifting method and the characteristics of the QC-LDPC code designed through lifting are hereinafter described with reference to the following reference, which is incorporated by reference in its entirety Reference [Myung2006]

S. Myung, K. Yang, and Y Kim, "Lifting Methods for Quasi-Cyclic LDPC Codes", IEEE Communications Letters. vol. 10, pp. 489-491, June 2006.

When an LDPC code $C_0$ is given, it is assumed that S QC-LDPC codes to be designed through the lifting method are $C_1, \ldots, C_S$, and that the size of a row block and a column block of a parity check matrix of each QC-LDPC code has a value of $L_k$. Here, $C_0$ corresponds to the smallest LDPC code having a mother matrix of $C_1, \ldots, C_S$ codes as a parity check matrix, and a value of $L_0$ corresponding to the size of a row block and a column block is 1. In addition, a parity check matrix $H_k$ of each code $C_k$ has an exponential matrix $E(H_k) = (e_{i,j}^{(k)})$ of a m×n size, and each exponent $e_{i,j}^{(k)}$ is selected as one of values $\{-1, 0, 1, 2, \ldots, L_k-1\}$.

The typical lifting method consists of steps $C_0 \rightarrow C_1 \rightarrow \ldots \rightarrow C_S$ and has characteristics that satisfy a condition $L_{k+1} = q_{k+1} L_k$ ($q_{k+1}$ is a positive integer, k=0, 1, ..., S−1). If a parity check matrix $H_S$ of $C_S$ is stored according to the characteristics of the lifting process, all the QC-LDPC codes $C_0, C_1, \ldots, C_S$ can be represented using the following Equation 7 according to the lifting method.

$$E(H_k) \equiv \left\lfloor \frac{L_k}{L_S} E(H_S) \right\rfloor \text{ or} \qquad \text{Equation 7}$$

$$E(H_k) \equiv E(H_S) \bmod L_k \qquad \text{Equation 8}$$

Not only a method of designing large QC-LDPC codes $C_1, \ldots, C_S$ from $C_0$ but also a method of designing small codes $C_i$ (i=k−1, k−2, . . . , 1, 0) from a large code $C_k$ by using a suitable technique such as Equation 7 or 8 is called lifting.

According to the lifting method of Equation 7 or 8, the $L_k$ corresponding to the size of row block or column block in the parity check matrix of each QC-LDPC code $C_k$ has a multiple relation with each other, and also an exponential matrix is selected by a specific manner. The typical lifting method improves the algebraic or graph characteristics of each parity check matrix designed through lifting, thus allowing an easy design of the QC-LDPC code with an improved error floor feature.

However, because respective $L_k$ values are in a multiple relation, there is a disadvantage that the length of each code is greatly limited. For example, when it is assumed that the minimum lifting scheme such as $L_{k+1}1=2\times L_k$ is applied to each $L_k$ value, the size of a parity check matrix of each QC-LDPC code may have a size of $2^k m \times 2^k n$. That is, when the lifting is applied in 10 steps (S=10), ten sizes of a parity check matrix may be generated. This means that it is possible to support the QC-LDPC codes having ten kinds of lengths.

For this reason, the typical lifting method is somewhat disadvantageous in designing the QC-LDPC code that supports various lengths. However, commonly used communication systems require a very high level of length compatibility in consideration of various types of data transmission. For this reason, the LDPC coding technique based on the typical lifting method has a problem that it is difficult to apply to communication systems.

In order to solve such a problem, the present disclosure uses the following lifting method.

Normally, the lifting may be considered to vary the values of entries in the exponential matrix of Equation 4 with respect to various L values in order to use it for LDPC encoding and decoding. For example, when the exponential matrix of Equation 4 is E=$(a_{i,j})$, and when the exponential matrix converted according to an L value is $E_L$=$(a_{i,j}^{(L)})$, a conversion equation such as Equation 9 may be applied in general.

$$a_{i,j}^{(L)} = \begin{cases} a_{i,j} & a_{i,j} < 0 \\ f(a_{i,j}, L) & a_{i,j} \geq 0 \end{cases} \text{ or} \qquad \text{Equation 9}$$

$$a_{i,j}^{(L)} = \begin{cases} a_{i,j} & a_{i,j} \leq 0 \\ f(a_{i,j}, L) & a_{i,j} > 0 \end{cases}$$

In Equation 9, f(x,L) may be defined in various forms. For example, definitions as shown in the following Equation 10 may be used.

$$f(x, L) = \bmod(x, 2^{\lfloor \log_2 L \rfloor}) \text{ or} \qquad \text{Equation 10}$$

-continued $$f(x, L) = \left\lfloor \frac{x}{2^{D-\lfloor \log_2 L \rfloor}} \right\rfloor \text{ or}$$

$$f(x, L) = \left\lfloor \frac{L}{D} x \right\rfloor$$

In Equation 10, mod(a,b) denotes a modulo-b operation for a, and D denotes a constant that is a predefined positive integer.

Figure 4:
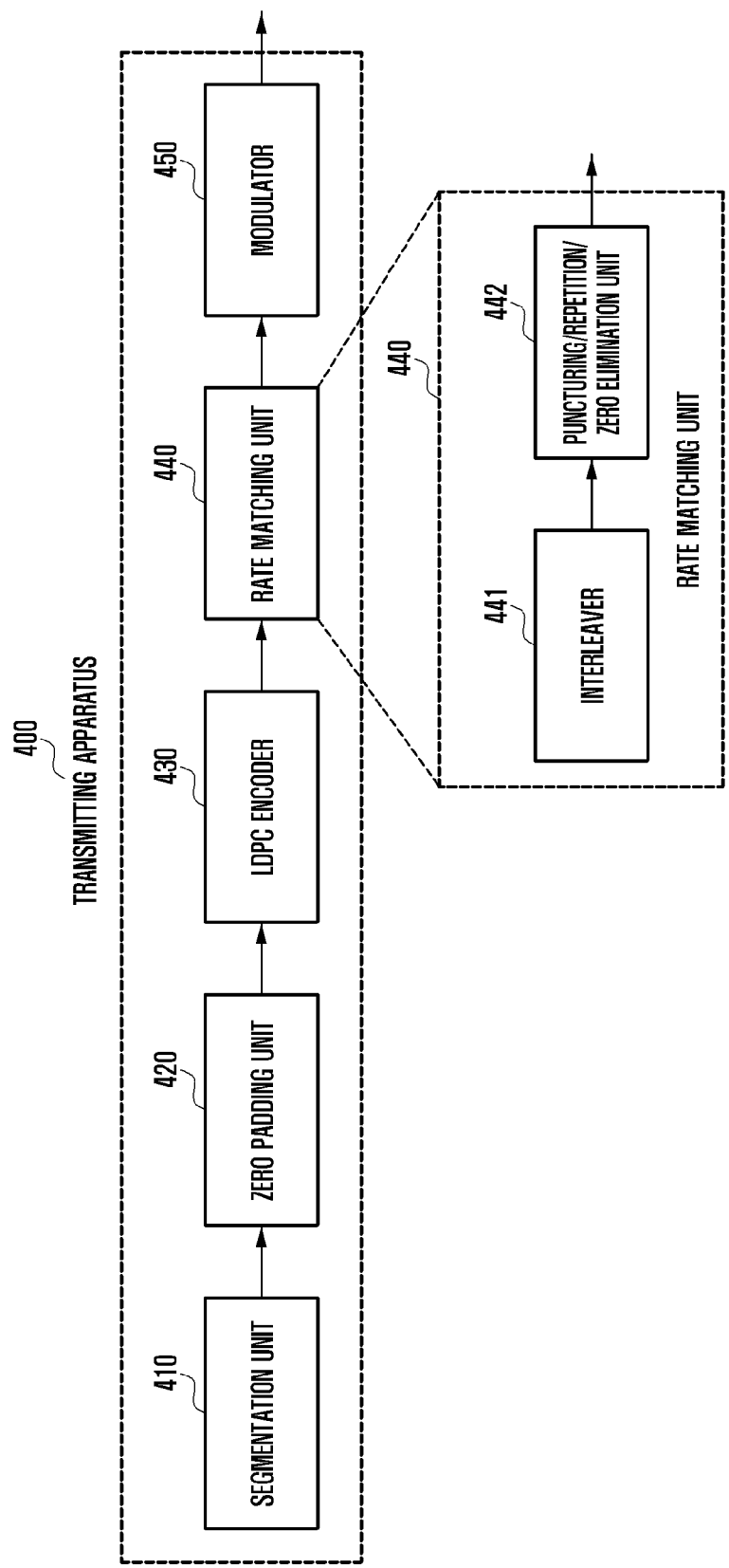
FIG. 4 is a block diagram illustrating a transmitting apparatus according to an embodiment of the present disclosure.

FIG. 4 is a block diagram illustrating a transmitting apparatus according to an embodiment of the present disclosure.

As shown in FIG. 4, in order to process variable-length input bits, the transmitting apparatus 400 may include a segmentation unit 410, a zero padding unit 420, an LDPC encoder 430, a rate matching unit 440, and a modulator 450. The rate matching unit 440 may include an interleaver 441 and a puncturing/repetition/zero elimination unit 442.

Elements shown in FIG. 4 are configured to perform encoding and modulation for variable-length input bits. These elements are, however, exemplary only, and some of them may be omitted or replaced or any other element may be added.

Meanwhile, the transmitting apparatus 400 may determine parameters (e.g., input bit length, modulation and code rate (ModCod), parameter for zero padding (or shortening), coding rate and/or codeword length of LDPC code, parameter for interleaving, parameter for repetition and puncturing, modulation scheme), and perform encoding on the basis of the determined parameters before transmission to a receiving apparatus 500.

The number of input bits is variable. Therefore, if the number of input bits is greater than a predetermined value, the input bits may be segmented to have a length equal to or smaller than the predetermined value. Also, each segmented block may correspond to one LDPC encoded block. If the number of input bits is equal to or smaller than the predetermined value, no segmentation is performed. In this case, the input bits may correspond to one LDPC encoded block.

The transmitting apparatus 400 may store various parameters used for encoding, interleaving, and modulation. The parameters used for encoding may be a coding rate of the LDPC code, a codeword length, and information about the parity check matrix. The parameters used for interleaving may be information about an interleaving rule, and the parameters used for modulation may be information about a modulation scheme. Further, information about puncturing may be a puncturing length, and information about repetition may be a repetition length. The information about the parity check matrix may include an exponent value of the circulant matrix when the parity matrix proposed in the present disclosure is used.

In this case, the respective elements constituting the transmitting apparatus 400 may perform an operation using the above-mentioned parameters.

Although not shown, the transmitting apparatus 400 may further include a controller (not shown) for controlling the operation of the transmitting apparatus 400.

Figure 5:
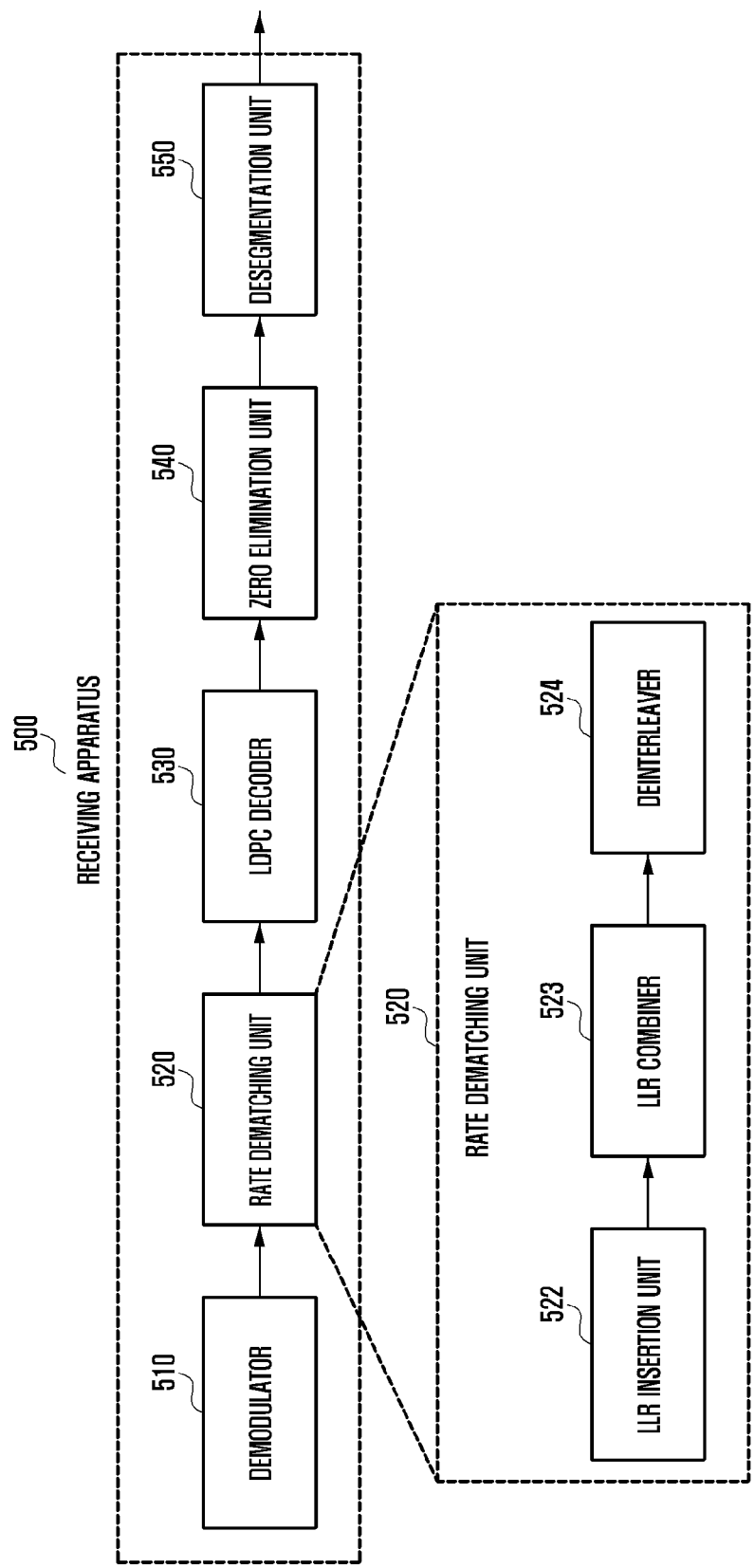
FIG. 5 is a block diagram illustrating a receiving apparatus according to an embodiment of the present disclosure.

FIG. 5 is a block diagram illustrating a receiving apparatus according to an embodiment of the present disclosure.

As shown in FIG. 5, in order to process variable-length information, the receiving apparatus 500 may include a demodulator 510, a rate dematching unit 520, an LDPC decoder 530, a zero elimination unit 540, and a desegmentation unit 550. The rate dematching unit 520 may include a log likelihood ratio (LLR) insertion unit 522, an LLR combiner 523, a deinterleaver 524, and the like.

Elements shown in FIG. 5 are configured to perform functions of the receiving apparatus. These elements are, however, exemplary only, and some of them may be omitted or replaced or any other element may be added.

The parity check matrix disclosed herein may be read using a memory, be given in advance in the transmitting apparatus or the receiving apparatus, or be directly generated by the transmitting apparatus or the receiving apparatus. In addition, the transmitting apparatus may store or generate a sequence or exponential matrix corresponding to the parity check matrix, and apply it to encoding. Similarly, the receiving apparatus may store or generate a sequence or exponential matrix corresponding to the parity check matrix, and apply it to decoding.

Hereinafter, a receiver operation will be described in detail with reference to FIG. 5.

The demodulator 510 demodulates a signal received from the transmitting apparatus 400.

Specifically, the demodulator 510, which is an element corresponding to the modulator 450 of the transmitting apparatus 400, demodulates a signal received from the transmitting apparatus 400 and then generates values corresponding to bits transmitted from the transmitting apparatus 400.

For this, the receiving apparatus 500 may previously store information about a modulation scheme used by the transmitting apparatus 400 depending on a mode. Therefore, depending on a mode, the demodulator 510 may demodulate a signal received from the transmitting apparatus 400 and generate values corresponding to LDPC codeword bits.

Meanwhile, a value corresponding to bits transmitted from the transmitting apparatus 400 may be a log likelihood ratio (LLR) value.

Specifically, the LLR value may be represented by the logarithm of the ratio of a probability that a bit transmitted from the transmitting apparatus 400 is zero, to a probability that the bit is one. Alternatively, the LLR value may be a bit value itself, or be a representative value determined according to an interval to which a probability that a bit transmitted from the transmitting apparatus 400 is 0 or 1 belongs.

The demodulator 510 further performs multiplexing (not shown) on the LLR value. Specifically, as an element corresponding to a bit deMUX (not shown) of the transmitting apparatus 400, the demodulator 510 may perform an operation corresponding to the bit deMUX.

For this, the receiving apparatus 500 may previously store information about parameters used for demultiplexing and block interleaving by the transmitting apparatus 400. Therefore, an MUX (not shown) may inversely perform the demultiplexing and block interleaving operation performed by the bit deMUX with respect to the LLR value corresponding to a cell word (i.e., information indicating a receiving symbol for the LDPC codeword as a vector value), and multiplex the LLR value corresponding to the cell word in a bit unit.

The rate dematching unit 520 may insert a certain LLR value into an LLR value output of the demodulator 510. That is, the rate dematching unit 520 may insert predetermined LLR values between LLR values outputted from the demodulator 510.

Specifically, the rate dematching unit 520 is an element corresponding to the rate matching unit 440 of the transmitting apparatus 400, and may perform operations corresponding to the interleaver 441 and the puncturing/repetition/zero elimination unit 442.

First, the rate dematching unit 520 may perform deinterleaving corresponding to the interleaver 441. LLR values corresponding to zero bits in positions where the zero bits have been padded in the LDPC codeword are inserted to output value of the deinterleaver 524. In this case, the LLR value corresponding to the padded zero bits, i.e., shortened zero bits, may be positive infinity ($\infty$) or negative infinity ($-\infty$). However, this is theoretical, and actually the LLR value corresponding to the padded zero bits may be the maximum or minimum value of LLR values used in the receiving apparatus 500.

For this, the receiving apparatus 500 may previously store information about parameters used for padding the zero bits by the transmitting apparatus 400. Therefore, the rate dematching unit 520 may identify the positions where the zero bits have been padded in the LDPC codeword, and then insert the LLR value corresponding to the shortened zero bits in the identified positions.

In addition, the LLR insertion unit 522 of the rate dematching unit 520 may insert an LLR value corresponding to punctured bits in positions of the punctured bits in the LDPC codeword. In this case, the LLR value corresponding to the punctured bits may be zero.

For this, the receiving apparatus 500 may previously store information about parameters used for puncturing by the transmitting apparatus 400. Therefore, the LLR insertion unit 522 may insert the corresponding LLR value in positions where the LDPC parity bits are punctured.

An LLR combiner 523 of the rate dematching unit 520 may combine (i.e., sum up) the LLR values outputted from the LLR insertion unit 522 and the demodulator 510. Specifically, the LLR combiner 523, which is an element corresponding to the puncturing/repetition/zero elimination unit 442 of the transmitting apparatus 400, may perform an operation corresponding to repetition. First, the LLR combiner 523 may combine an LLR value corresponding to repeated bits with other LLR value. Here, the other LLR value may be an LLR value for bits used as basis of generating the repeated bits by the transmitting apparatus 400, namely, for LDPC parity bits that have been selected for repetition.

That is, as described above, the transmitting apparatus 400 selects bits from LDPC parity bits, repeats the selected bits between the LDPC information bits and the LDPC parity bits, and transmits the repeated bits to the receiving apparatus 500.

Therefore, the LLR value for the LDPC parity bits may be composed of an LLR value for repeated LDPC parity bits and an LLR value for non-repeated LDPC parity bits (i.e., LDPC parity bits generated by encoding). Thus, the LLR combiner 523 may combine the LLR values with the same LDPC parity bits.

For this, the receiving apparatus 500 may previously store information about parameters used for repetition by the transmitting apparatus 400. Therefore, the LLR combiner 523 may identify an LLR value for the repeated LDPC parity bits and combine the identified LLR value with an LLR value for LDPC parity bits on which the repetition is based.

In addition, the LLR combiner 523 may combine an LLR value corresponding to retransmission or increment redundancy (IR) bits with other LLR value. Here, the other LLR value may be an LLR value for the bits selected for the generation of LDPC codeword bits on which the generation of the retransmission or IR bits is based in the transmitting apparatus 400.

That is, when a NACK occurs for HARQ, the transmitting apparatus 400 may transmit some or all of the codeword bits to the receiving apparatus 500.

Therefore, the LLR combiner 523 may combine an LLR value for bits received via retransmission or IR with another LLR value for LDPC codeword bits received via the previous frame.

For this, the receiving apparatus 500 may previously store information about parameters used for retransmission or IR bits generation by the transmitting apparatus 400. Therefore, the LLR combiner 523 may identify an LLR value for the number of retransmission or IR bits and combine the identified LLR value with an LLR value for the LDPC parity bits on which the generation of the retransmission bits is based.

A deinterleaver 524 of the rate dematching unit 520 may deinterleave an LLR value outputted from the LLR combiner 523.

Specifically, the deinterleaver 524 is an element corresponding to the interleaver 441 of the transmitting apparatus 400, and may perform an operation corresponding to the interleaver 441.

For this, the receiving apparatus 500 may previously store information about parameters used for interleaving by the transmitting apparatus 400. Therefore, the deinterleaver 524 may deinterleave an LLR value corresponding to LDPC codeword bits by inversely performing an interleaving operation performed by the interleaver 441 on the LLR values corresponding to the LDPC codeword bits.

The LDPC decoder 530 may perform LDPC decoding, based on the LLR value outputted from the rate dematching unit 520.

Specifically, the LDPC decoder 530 is an element corresponding to the LDPC encoder 430 of the transmitting apparatus 400, and may perform an operation corresponding to the LDPC encoder 430.

For this, the receiving apparatus 500 may previously store information about parameters used for LDPC encoding by the transmitting apparatus 400 depending on a mode. Therefore, depending on a mode, the LDPC decoder 530 may perform LDPC decoding based on the LLR value outputted from the rate dematching unit 520.

For example, the LDPC decoder 530 may perform LDPC decoding on the basis of the LLR value outputted from the rate dematching unit 520 in accordance with an iterative decoding scheme based on the sum-product algorithm, and output error-corrected bits according to LDPC decoding.

The zero elimination unit 540 may remove zero bits from the bits outputted from the LDPC decoder 530.

Specifically, the zero elimination unit 540 is an element corresponding to the zero padding unit 420 of the transmitting apparatus 400 and may perform an operation corresponding to the zero padding unit 420.

For this, the receiving apparatus 500 may previously store information about parameters used for padding zero bits by the transmitting apparatus 400. Therefore, the zero elimination unit 540 may remove the zero bits padded by the zero padding unit 420 from bits outputted from the LDPC decoder 530.

The desegmentation unit 550 is an element corresponding to the segmentation unit 410 of the transmitting apparatus 400 and may perform an operation corresponding to the segmentation unit 410.

For this, the receiving apparatus 500 may previously store information about parameters used for segmentation by the transmitting apparatus 400. Therefore, the desegmentation unit 550 may recover bits before segmentation by combining bits outputted from the zero elimination unit 540, that is, segments for variable-length input bits.

Meanwhile, the LDPC code may be decoded using the iterative decoding algorithm based on the sum-product algorithm on the bipartite graph as shown in FIG. 2. As mentioned above, the sum-product algorithm is a kind of a message passing algorithm.

Hereinafter, a message passing operation normally used in LDPC decoding will be described with reference to FIGS. 6A and 6B.

Figure 6A:
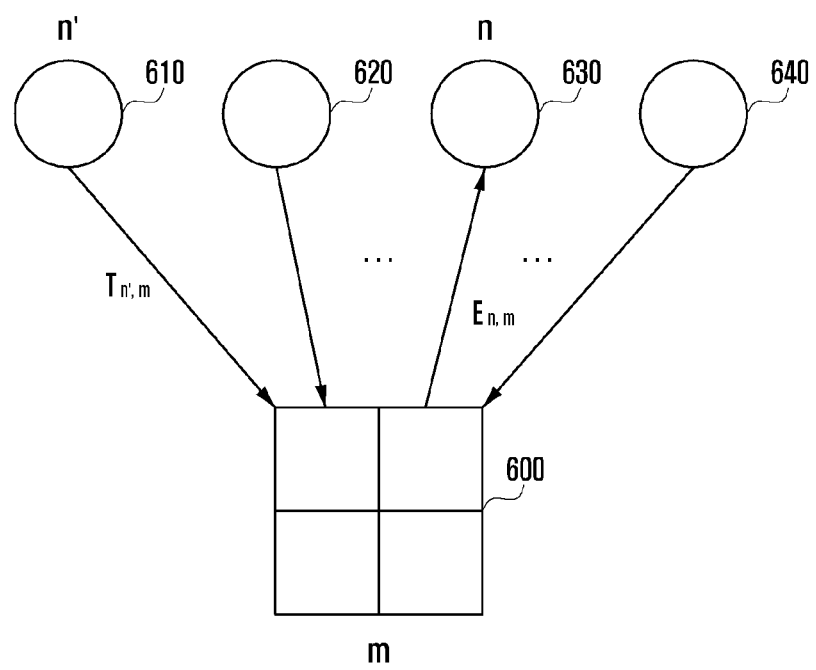
FIGS. 6A and 6B are message structure diagrams illustrating a message passing operation at a check node and a variable node for LDPC decoding.
Figure 6B:
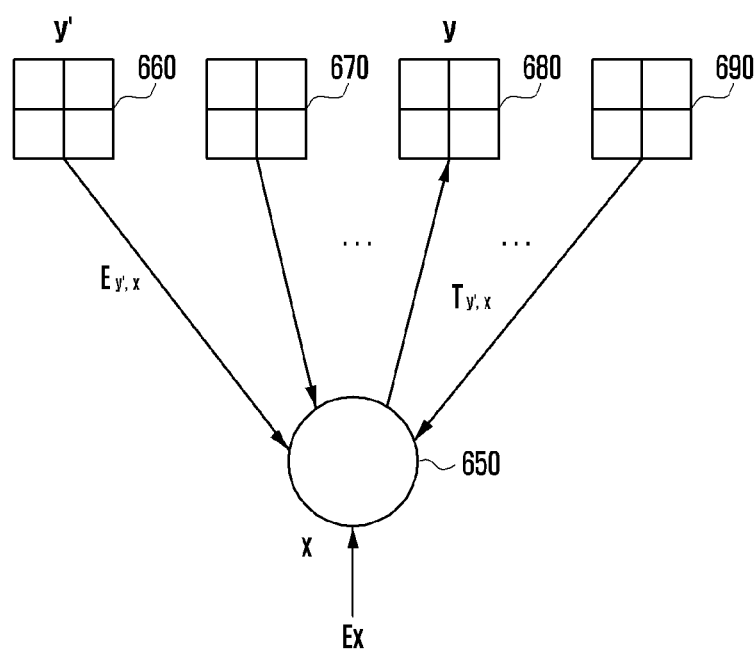

FIGS. 6A and 6B show a message passing operation at a check node and a variable node for LDPC decoding.

FIG. 6A shows a check node m 600 and a plurality of variable nodes 610, 620, 630, and 640 connected to the check node m 600. In addition, $T_{n',m}$ denotes a message passed from the variable node n' 610 to the check node m 600, and $E_{n,m}$ denotes a message passed from the check node m 600 to the variable node n 630. Here, a set of all variable nodes connected to the check node m 600 is defined as N(m), and a set obtained by excluding the variable node n 630 from N(m) is defined as N(m)\n.

In this case, a message update rule based on the sum-product algorithm may be expressed by Equation 11.

$$|E_{n,m}| = \Phi\left[\sum_{n' \in N(m)\backslash n} \Phi(|T_{n',m}|)\right] \quad \text{Equation 11}$$

$$\text{Sign}(E_{n,m}) = \prod_{n' \in N(m)\backslash n} \text{sign}(T_{n',m})$$

Here, $\text{Sign}(E_{n,m})$ denotes the sign of a message $E_{n,m}$, and $|E_{n,m}|$ denotes the magnitude of a message $E_{n,m}$. A function $\Phi(x)$ may be expressed by Equation 12 below.

$$\Phi(x) = -\log\left(\tanh\left(\frac{x}{2}\right)\right) \quad \text{Equation 12}$$

Meanwhile, FIG. 6B shows a variable node x 650 and a plurality of check nodes 660, 670, 680, and 690 connected to the variable node x 650. In this case, $E_{y',x}$ denotes a message passed from the check node y' 660 to the variable node x 650, and $T_{y,x}$ denotes a message passed from the variable node x 650 to the check node y 680. Here, a set of all check nodes connected to the variable node x 650 is defined as M(x), and a set obtained by excluding the check node y 680 from M(x) is defined as M(x)\y. In this case, a message update rule based on the sum-product algorithm may be expressed by Equation 13.

$$T_{y,x} = E_x + \sum_{y' \in M(x)\backslash y} E_{y',x} \quad \text{Equation 13}$$

Here, $E_x$ denotes the initial message value of the variable node x.

In case of determining the bit value of the node x, the following Equation 14 may be used.

$$P_x = E_x + \sum_{y' \in M(x)} E'_{y,x} \quad \text{Equation 14}$$

In this case, the encoding bit corresponding to the node x may be determined according to the $P_x$ value.

Because FIGS. 6A and 6B show a general decoding method, a detailed description will be omitted. In addition to the method shown in FIGS. 6A and 6B, other methods may be applied to determine the value of a message passed between the variable node and the check node. A related description is disclosed in Frank R. Kschischang, Brendan J. Frey, and Hans-Andrea Loeliger, "Factor Graphs and the Sum-Product Algorithm", IEEE TRANSACTIONS ON INFORMATION THEORY, Vol. 47, NO. 2, FEBRUARY 2001, pp 498-519.

Figure 7:
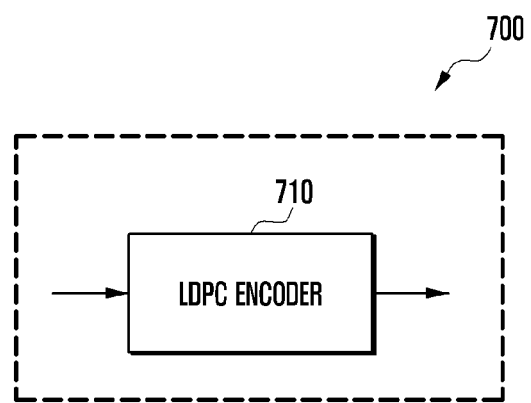
FIG. 7 is a block diagram illustrating an LDPC encoder according to an embodiment of the present disclosure.

FIG. 7 is a block diagram illustrating an LDPC encoder according to an embodiment of the present disclosure.

$K_{ldpc}$ bits may constitute $K_{ldpc}$ LDPC information bits $I=(i_0, i_1, \ldots, i_{K_{ldpc}-1})$ for an LDPC encoder 710. The LDPC encoder 710 may perform systematic LDPC encoding of $K_{ldpc}$ LDPC information bits and thereby generate LDPC codewords $\Lambda=(c_0, c_1, \ldots, c_{N_{ldpc}-1})=(i_0, i_1, \ldots, i_{K_{ldpc}-1}, p_0, p_1, \ldots, p_{N_{ldpc}-K_{ldpc}-1})$ composed of $N_{ldpc}$ bits.

As described above in Equation 1, a codeword is determined so that a product of the LDPC codeword and the parity check matrix becomes a zero vector.

Referring to FIG. 7, an encoding apparatus 700 includes an LDPC encoder 710. The LDPC encoder 710 may generate an LDPC codeword by performing LDPC encoding for input bits, based on a parity check matrix or a corresponding exponential matrix or sequence. In this case, the LDPC encoder 710 may perform the LDPC encoding by using a parity check matrix defined differently according to a coding rate (i.e., a coding rate of an LDPC code).

The encoding apparatus 700 may further include a memory (not shown) for storing a coding rate of an LDPC code, a codeword length, and information about a parity check matrix. Using such information, the LDPC encoder 710 may perform the LDPC encoding. The information about a parity check matrix may include information about an exponent value of a circulant matrix when a parity matrix proposed herein is used.

Figure 8:
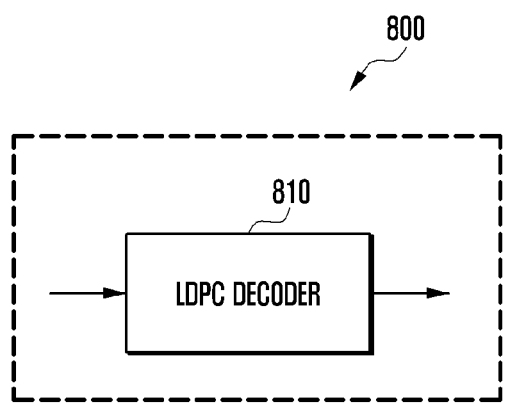
FIG. 8 is a block diagram illustrating an LDPC decoder according to an embodiment of the present disclosure.

FIG. 8 is a block diagram illustrating an LDPC decoder according to an embodiment of the present disclosure.

According to FIG. 8, a decoding apparatus 800 may include an LDPC decoder 810.

The LDPC decoder 810 performs LDPC decoding for an LDPC codeword, based on a parity check matrix or a corresponding exponential matrix or sequence.

For example, the LDPC decoder 810 may generate information word bits by passing a log likelihood ratio (LLR) value corresponding to LDPC codeword bits through an iterative decoding algorithm and then performing LDPC decoding.

Here, the LLR value is a channel value corresponding to the LDPC codeword bits, and may be expressed in various ways.

For example, the LLR value may be represented by the logarithm of the ratio of a probability that a bit transmitted from a transmitting side through a channel is zero, to a probability that the bit is one. Alternatively, the LLR value may be a bit value itself determined according to a hard decision, or be a representative value determined according to an interval to which a probability that a bit transmitted from the transmitting side is 0 or 1 belongs.

In this case, the transmitting side may generate the LDPC codeword by using the LDPC encoder 710 as shown in FIG. 7.

In addition, the LDPC decoder 810 may perform the LDPC decoding by using a parity check matrix defined differently according to a coding rate (i.e., a coding rate of an LDPC code).

Meanwhile, the decoding apparatus 800 may further include a memory (not shown) for storing a coding rate of an LDPC code, a codeword length, and information about a parity check matrix. Using such information, the LDPC decoder 810 may perform the LDPC decoding. However, this is exemplary only, and such information may be provided by the transmitting side.

Figure 9:
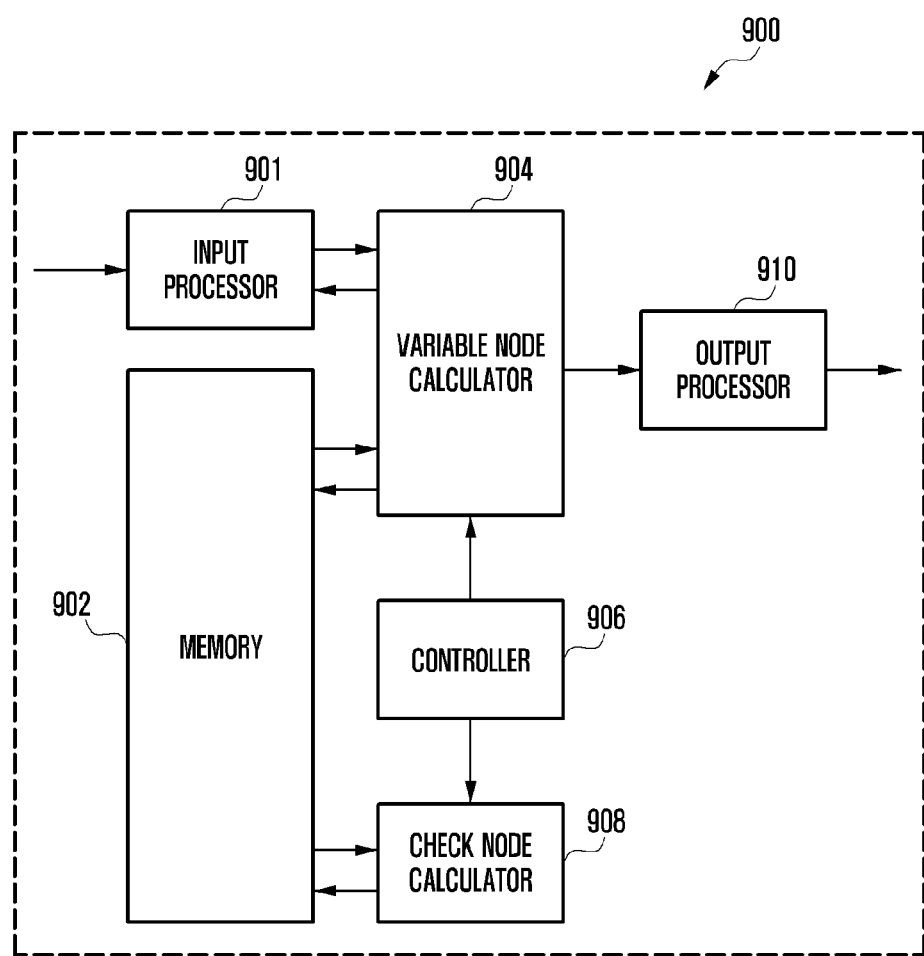
FIG. 9 is a block diagram illustrating a configuration of a decoding apparatus according to an embodiment of the present disclosure.

FIG. 9 is a block diagram illustrating a configuration of a decoding apparatus according to another embodiment of the present disclosure.

As described above, the LDPC decoder 810 may perform the LDPC decoding by using the iterative decoding algorithm. In this case, the LDPC decoder 810 may be configured as shown in FIG. 9. The iterative decoding algorithm is already known, and a detailed configuration as shown in FIG. 9 is exemplary only.

As shown in FIG. 9, the decoding apparatus 900 includes an input processor 901, a memory 902, a variable node calculator 904, a controller 906, a check node calculator 908, and an output processor 910.

The input processor 901 stores an input value. Specifically, the input processor 901 may store an LLR value of a signal received via a radio channel.

Based on a parity check matrix corresponding to a block size (i.e., a codeword length) and coding rate of the received signal, the controller 906 determines the number of values inputted to the variable node calculator 904, an address value thereof in the memory 902, the number of values inputted to the check node calculator 908, and an address value thereof in the memory 902.

The memory 902 stores input and output data of each of the variable node calculator 904 and the check node calculator 908.

The variable node calculator 904 receives data from the memory 902, based on information about the number and address of input data received from the controller 906, and performs a variable node operation. Then, based on information about the number and address of output data received from the controller 906, the variable node calculator 904 stores the result of the variable node operation in the memory 902. Also, based on data inputted from the input processor 901 and the memory 902, the variable node calculator 904 inputs the result of the variable node operation to the output processor 910. Here, the variable node operation is as described above with reference to FIGS. 6A and 6B.

The check node calculator 908 receives data from the memory 902, based on information about the number and address of input data received from the controller 906, and performs a check node operation. Then, based on information about the number and address of output data received from the controller 906, the check node calculator 908 stores the result of the check node operation in the memory 902. Here, the check node operation is as described above with reference to FIGS. 6A and 6B.

The output processor 910 performs a hard decision, based on data received from the variable node calculator 904, to determine whether information bits of a codeword are zero or one at a transmitting side. Then, the output processor 910 outputs the result of the hard decision, and this output value of the output processor 910 becomes a finally decoded value. In this case, the hard decision may be performed based on the sum of all message values (an initial message value and all message values inputted from a check node) inputted to one variable node in FIGS. 6A and 6B.

Figure 10:
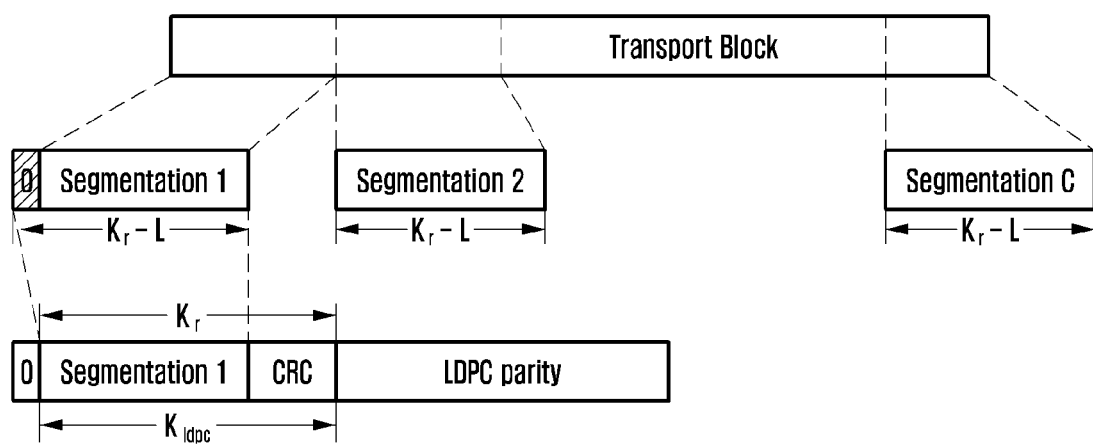
FIG. 10 is a diagram illustrating a structure of a transport block according to an embodiment of the present disclosure.

FIG. 10 is a diagram illustrating a structure of a transport block according to another embodiment of the present disclosure.

Referring to FIG. 10, <Null> bits may be added so that segmented lengths are equal to each other.

Also, <Null> bits may be added to match an information length of an LDPC code.

Described hereinbefore is the method for applying various block sizes, based on the QC-LDPC code in the communication or broadcasting systems that support LDPC codes of various lengths. Now, a method for further improving the encoding performance in the above method will be described.

Normally, in case of suitably converting and using a sequence with respect to various block sizes L from a single LDPC exponential matrix or sequence, like the lifting method described in Equations 9 and 10, there are many advantages in system implementation because it only needs to be implemented with one or a few sequence. However, it is very difficult to design an LDPC code having good performance for all block sizes as the number of types of block sizes to be supported increases.

In order to solve such a problem, an efficient design method of the QC LDPC code is proposed as follows. Proposed in this disclosure is a method for designing a parity check matrix having excellent performance in consideration of the lifting method of Equations 9 and 10 and the parity check matrix of the LDPC code or the trapping set characteristic on the Tanner graph. For convenience, although assuming the lifting based on $f(x,L) \mod(x, 2^{\lfloor \log_2 L \rfloor})$ of Equation 10, this disclosure is not limited thereto.

Now, a design method of a variable-length QC LDPC code will be described in detail.

A first step is to find a weight distribution (i.e., a distribution of is contained in a row or column of a matrix) of a base matrix by performing a density evolution analysis while changing a convergence rule of a density evolution and an iteration decoding number in determining a noise threshold for a decoding success of a channel code.

A second step is to set, when it is possible to improve the weight distribution obtained at the first step through the Hill Climbing method, the improved weight distribution as the weight distribution of a base matrix.

A third step is to obtain one base matrix, based on the weight distribution obtained at the second step. At this step, a method for obtaining the base matrix may be designed through various known techniques.

The lifting assumes $f(x,L) = \mod(x, 2^{\lfloor \log_2 L \rfloor})$ of Equation 10. That is, it is assumed that encoding and decoding are performed using the same exponential matrix for L values satisfying a range of $2 \leq L < 2^{k+1}$.

A fourth step is to maximize the girth (i.e., the smallest value of cycle lengths on the Tanner graph) in determining the exponential matrix according to the L values satisfying the above range, and then determine the exponential matrix from which trapping sets are removed maximally in a predetermined removal order. Here, the predetermined order of removing the trapping sets is as follows.

First priority: (4,0) trapping set
Second priority: (3,1) trapping set
Third priority: (2,2) trapping set
Fourth priority: (3,2) Trapping set
Fifth priority: (4,1) trapping set
Sixth priority: (4,2) trapping set A fifth step is to repeat the first to fourth steps given times, and then finally select a code having the best average performance according to the L value through a computation experiment for each obtained code. Here, the average performance may be defined in various ways. For example, it is possible to find the minimum signal-to-noise ratio (SNR) for achieving a block error rate (BLER) desired in the system while varying the L value, and then finally select a code having the smallest average SNR.

The above-described method of designing the variable-length QC LDPC code is exemplary only and may be modified according to requirements of a channel code. For example, the third step may be changed by considering the lifting method to be applied in the system. Also, at the fourth step, the order of removing the trapping sets may be changed according to the characteristics of a channel code desired in the system. Meanwhile, the above-described design method for the variable-length QC LDPC code may be also applied to a fixed length by removing the lifting process from the third and fourth steps.

For example, a code may be designed on the assumption that the number of information bits is set to a small number and that, in case of a low coding rate, some of codeword bits obtained after channel encoding are repetitively transmitted in consideration of both complexity and performance. In this case, at the first step in the above-discussed method of designing the variable-length QC LDPC code, the noise threshold is determined by increasing a part of the initial value for the density evolution analysis by the number of repetitive transmissions. Also, if the coding rate or length is fixed, the lifting process may be excluded from the third and fourth steps.

Meanwhile, since the density evolution analysis method and the features of the trapping set are well known in the art, a detailed description is omitted herein and replaced by the following references, which are incorporated by reference in their entirety:

Reference [RSU2001]:
T. J. Richardson, M. A. Shokrollahi, and R. L. Urbanke, "Design of capacity-approaching irregular low-density parity-check codes", IEEE Trans. Inf. Theory, vol. 47, no. 2, pp. 619-637, February 2001.

Reference [KaBa2012]:
M. Karimi and A. H. Banihashemi, "Efficient algorithm for finding dominant trapping sets of LDPC codes", IEEE Trans. Inf. Theory, vol. 58, no. 11, pp. 6942-6958, November 2012.

Embodiments of the exponential matrix or LDPC sequence of the parity check matrix designed through the above-described design method are shown in FIGS. 11 to 15.

Figure 11:
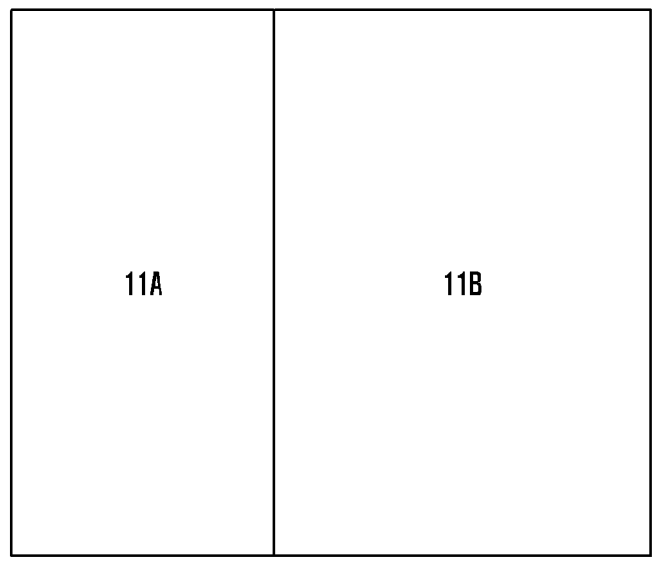
Figure 11B:
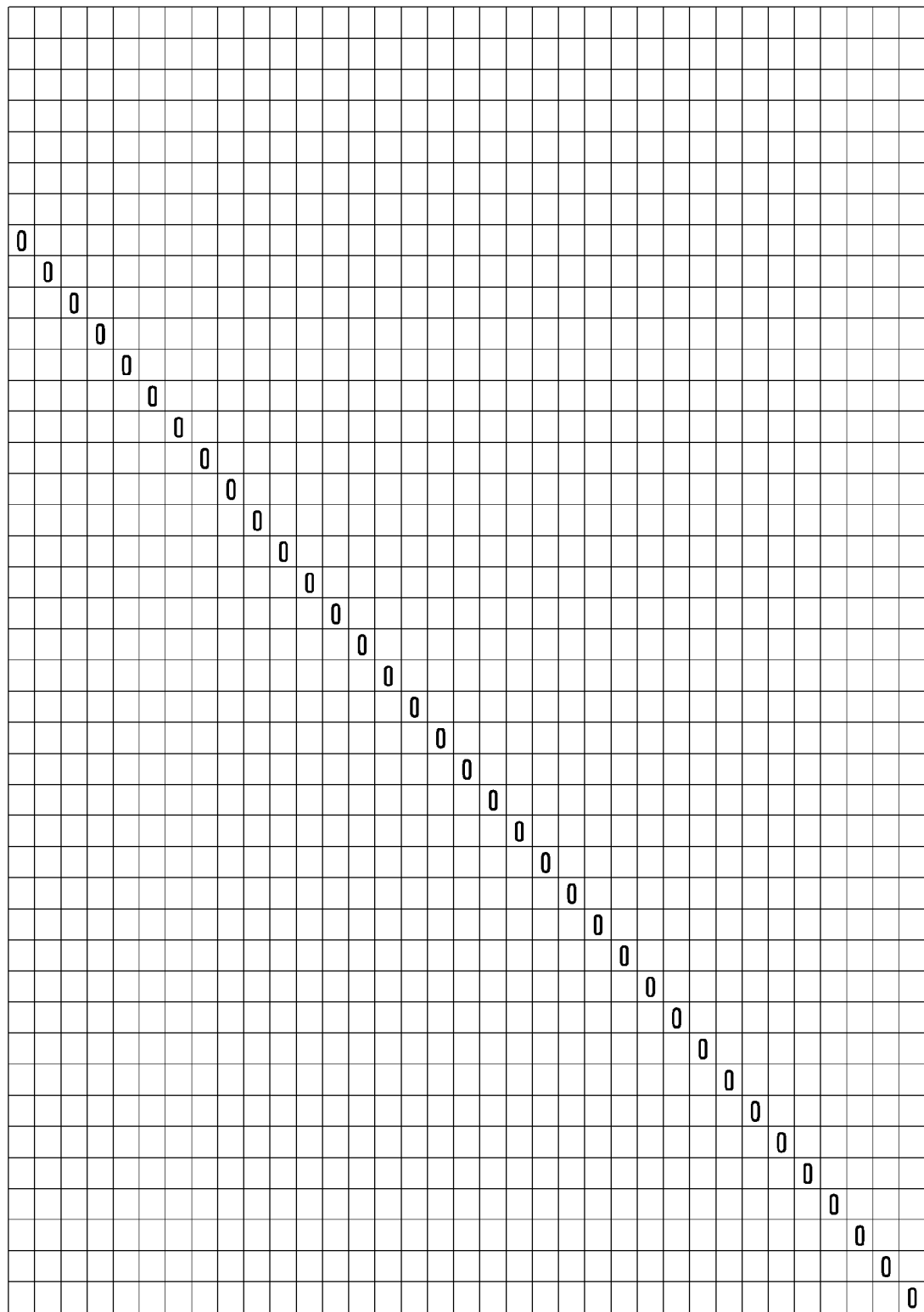

The parity check matrix shown in FIG. 11 is divided into two portions, which are enlarged in FIGS. 11A and 11B, respectively. Reference numerals denoting two portions in FIG. 11 indicate corresponding enlarged views of matrices. That is, a combination of FIGS. 11A and 11B is equal to one parity check matrix shown in FIG. 11. This is similarly applied to FIGS. 12 to 15. In the exponential matrices shown in FIGS. 11 to 15, each empty block corresponds to a zero matrix of L×L size.

One feature of the exponential matrix shown in FIG. 11 is that a partial matrix consisting of 7 upper rows and 17 front columns has a degree of 2 or more. Another feature of the exponential matrix shown in FIG. 11 is that all columns from the 18th column to the 52nd column have a degree of 1. That is, an exponential matrix having a size of 35×52 composed of rows from the 8th row to the 42nd row corresponds to a large number of single parity-check codes. As a result, the exponential matrix shown in FIG. 11 corresponds to an LDPC code having a parity check matrix consisting of 7 row blocks and 17 column blocks with a degree of 2 or more, and parity check matrices in the form of concatenation with a plurality of single check codes consisting of 35 row blocks and 52 column blocks.

The parity check matrix that applies a concatenation scheme with a single parity-check code is easy of expandability, thus being advantageous in applying the incremental redundancy (IR) technique. Because the IR technique is important for supporting the hybrid automatic repeat request (HARQ), the efficient and high-performance IR technique increases the efficiency of the HARQ system. The LDPC codes based on the parity check matrices may apply the efficient and high-performance IR technique by generating and transmitting a new parity using a portion expanded from a single parity-check code.

In the exponential matrix of FIG. 11, the front 10 columns correspond to information bits. Therefore, based on the size L of the circulant permutation matrix or circulant matrix in the parity check matrix, the information bits may be determined to have a size of 10 L. In general, information bit lengths other than 10 L may be supported through a shortening technique. In addition, the codeword bit length may be 52 L depending on the L value because there are 52 rows in the exponential matrix shown in FIG. 11. If the codeword bits length is not 52 L or if the coding rate is not 10/52, it can be supported by shortening and/or puncturing some of the information bits.

Although FIG. 11 is designed in consideration of cases where the following L values are used, this is exemplary only and is not to be construed as a limitation:

L={4, 5, 6, 7} {8, 9, 10, 11, 12, 13, 14, 15} {16, 18, 20, 22, 24, 26, 28, 30} {32, 36, 40, 44, 48, 52, 56, 60} {64, 72, 80, 88, 96, 104, 112, 120} {128, 144, 160, 176, 192, 208, 224, 240} {256}

The exponential matrices shown in FIGS. 12 to 15 are fixed to L=16 and also fixed to a code bit number of 880.

Figure 12:
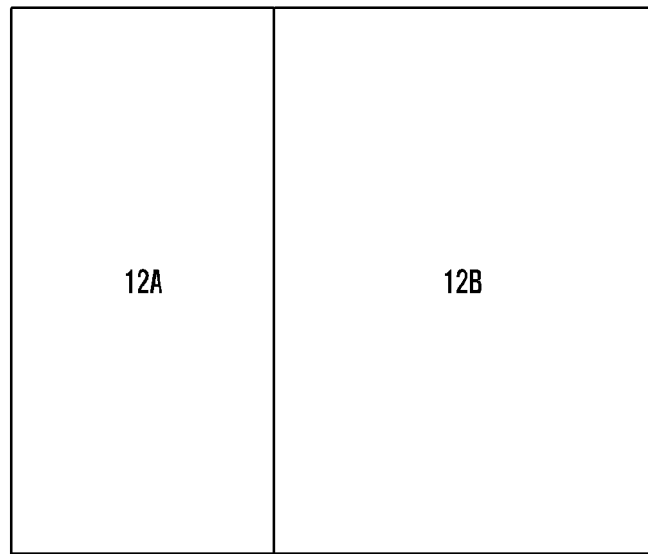
Figure 12B:
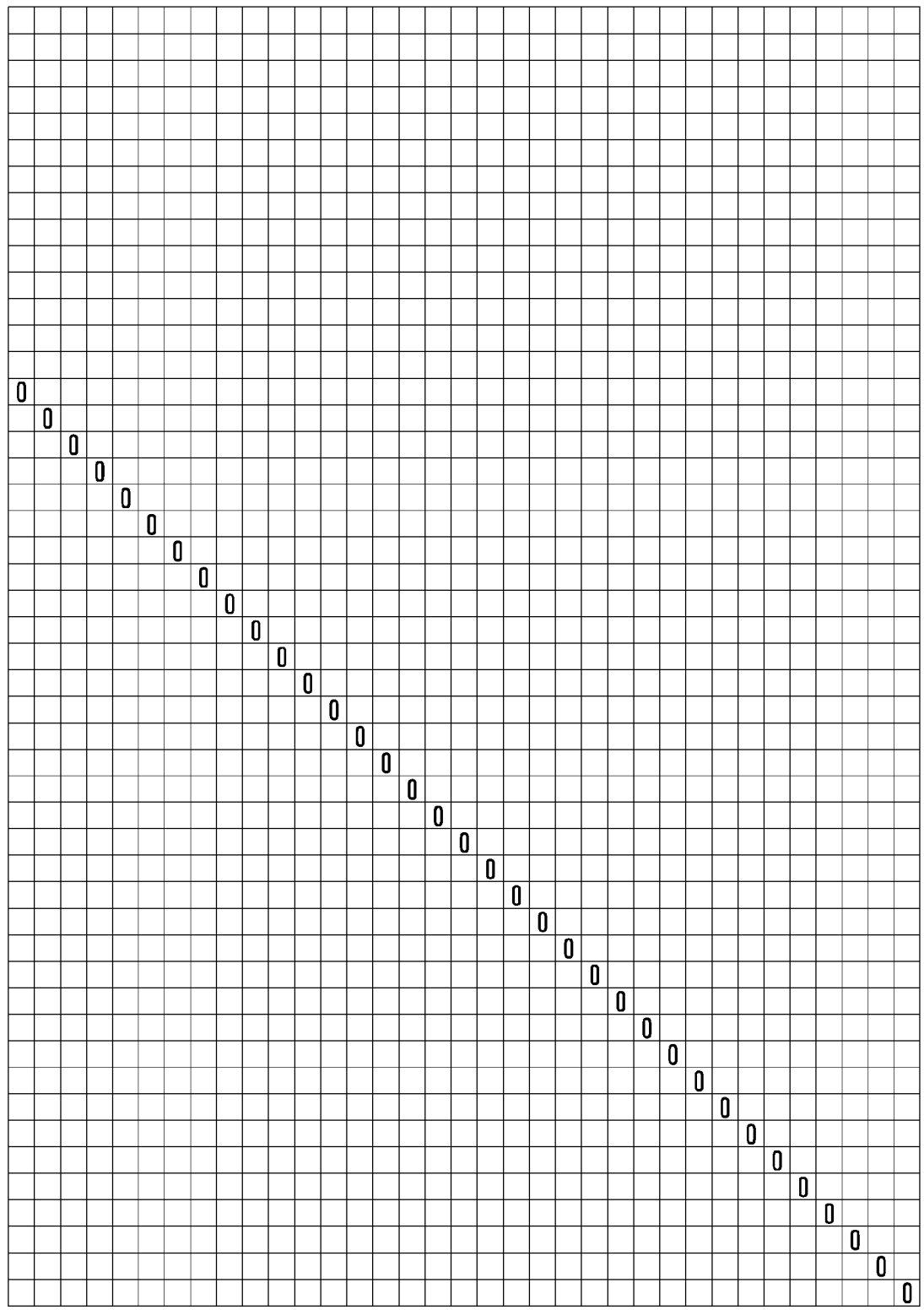
Figure 13:
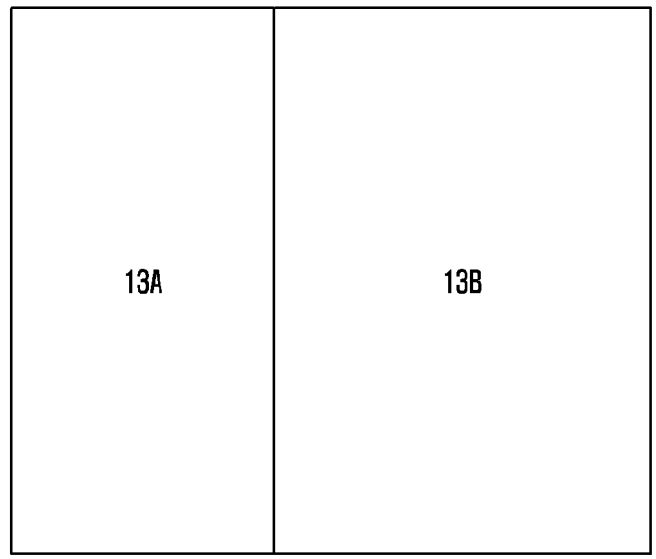
Figure 13B:
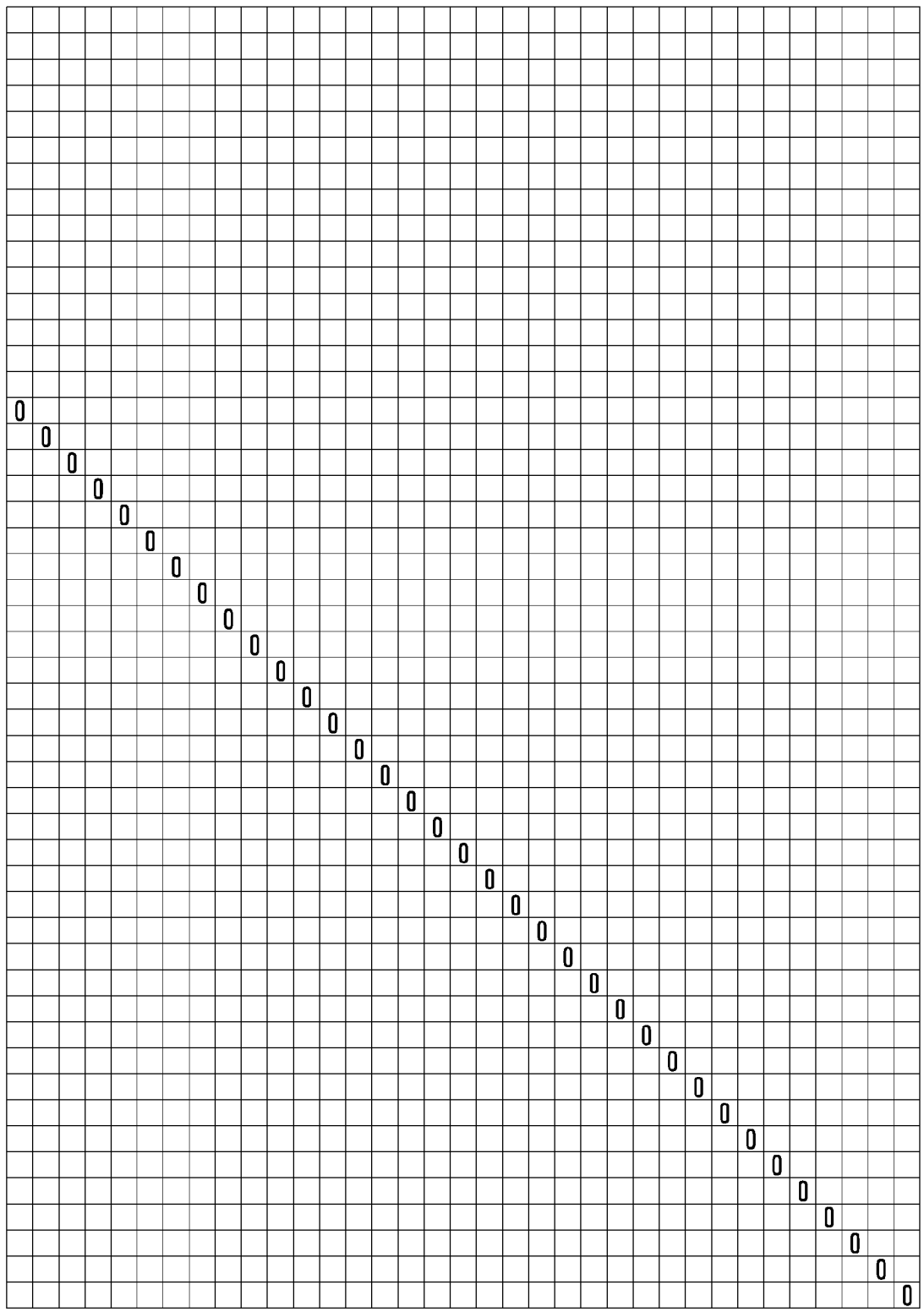
Figure 14:
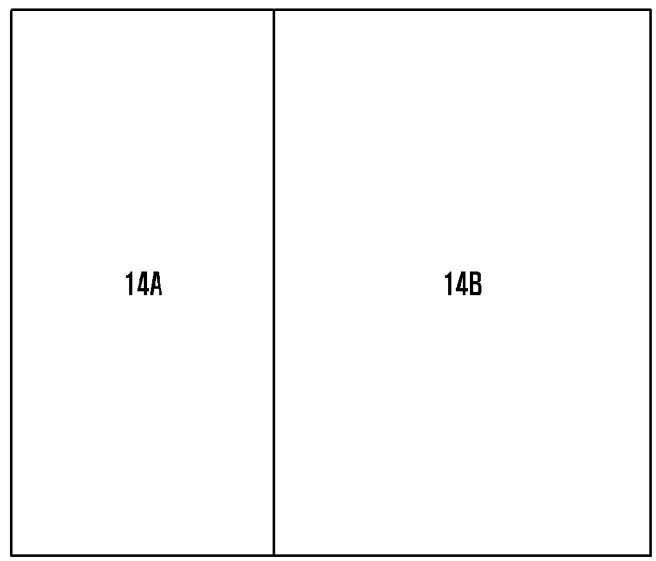
Figure 14A:
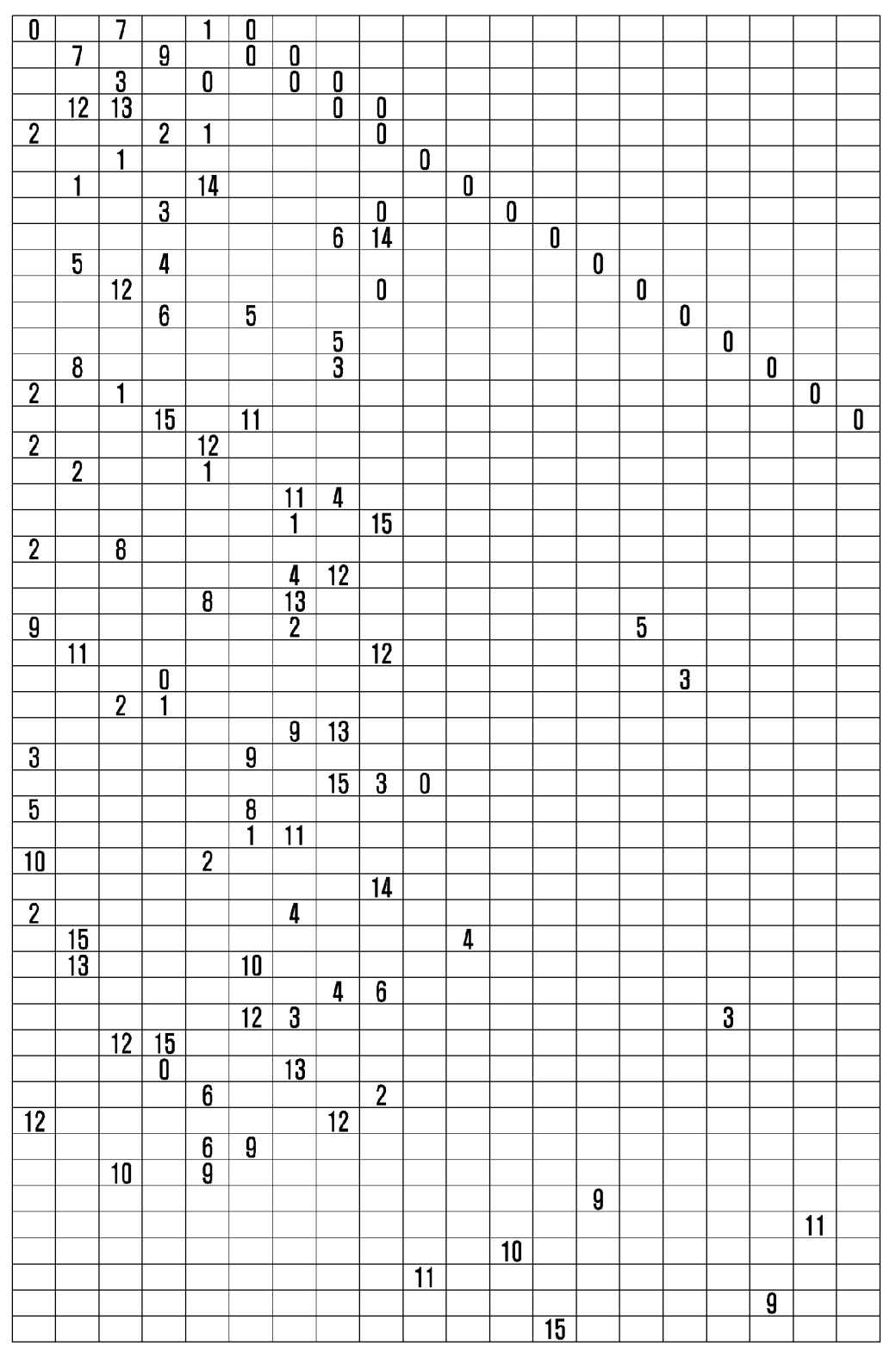
Figure 14B:
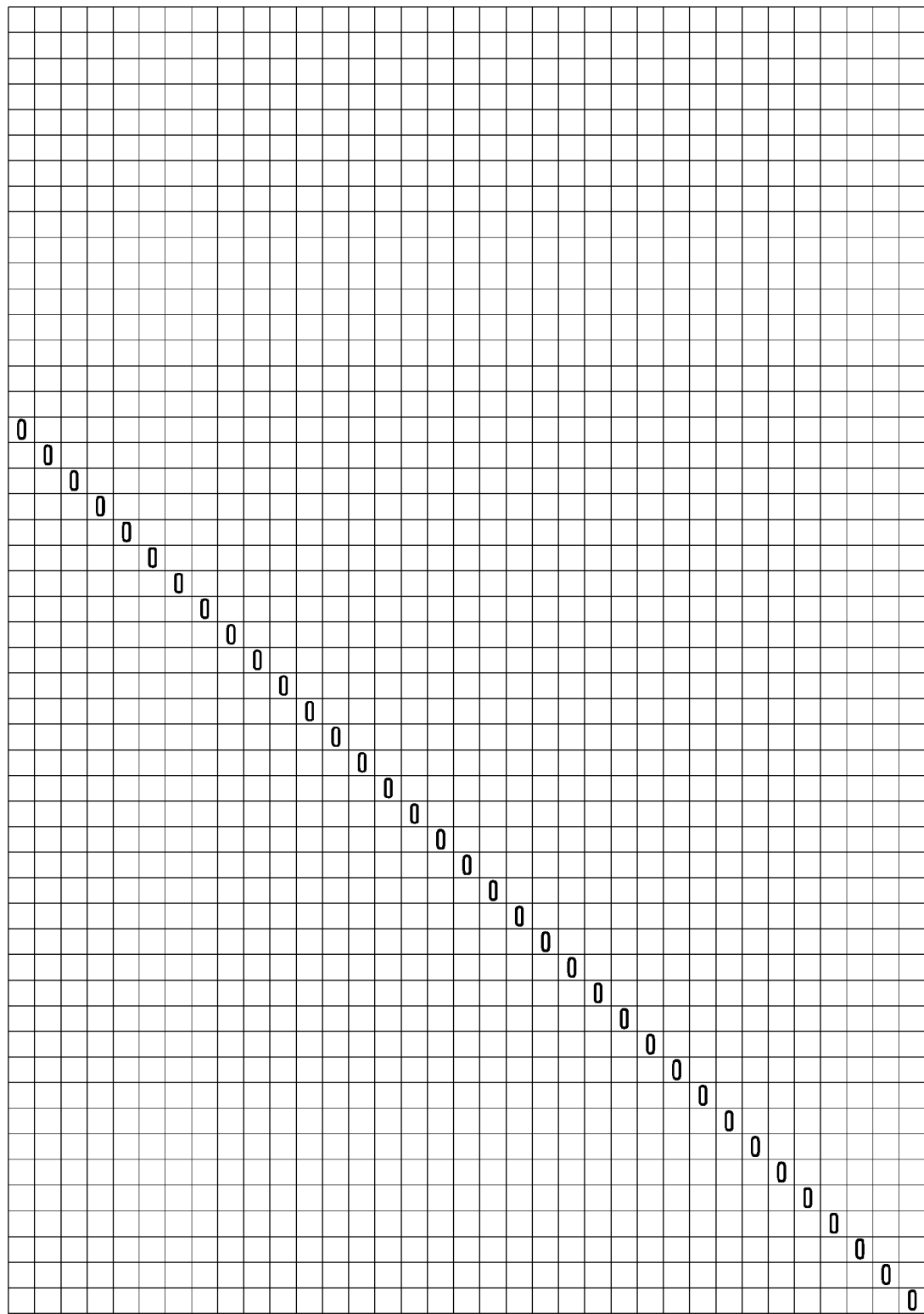
Figure 15:
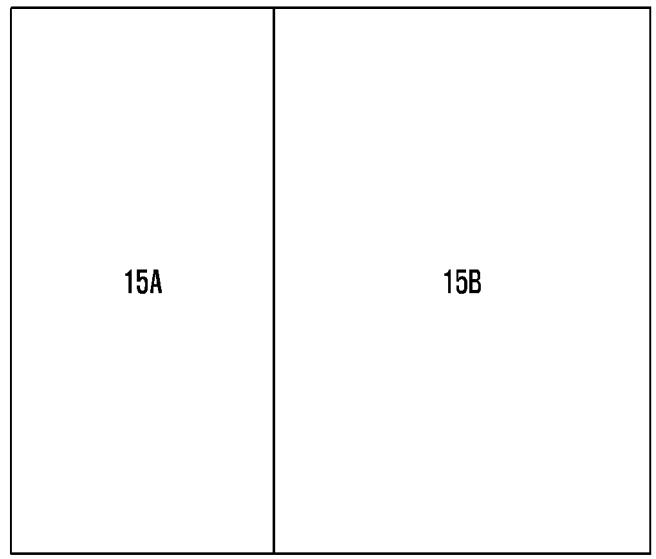
Figure 15B:
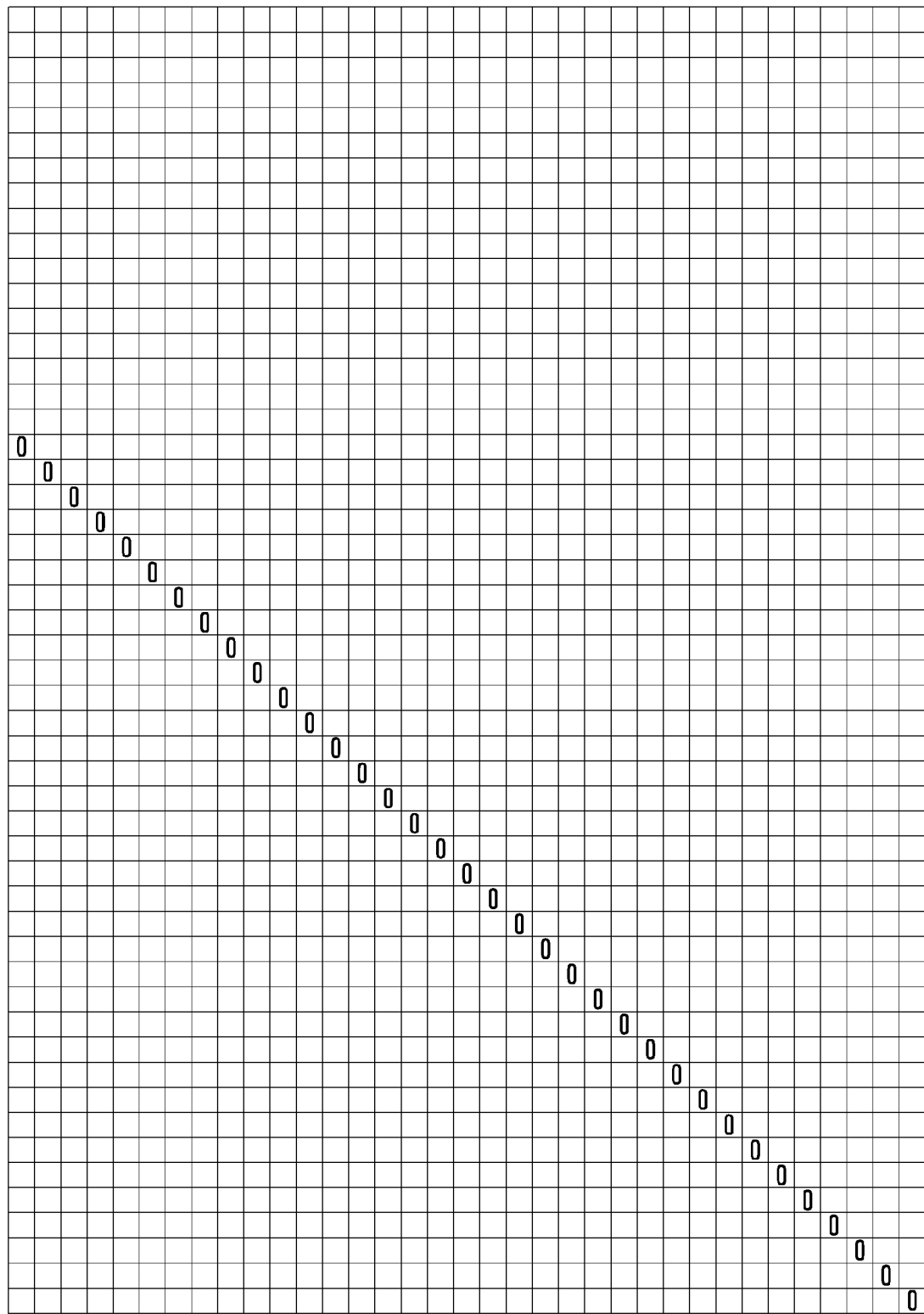

In FIG. 12, the front 6 columns of the exponential matrix correspond to the information bits. Similarly, the front 5 columns of the exponential matrix in FIG. 13, the front 4 columns of the exponential matrix in FIG. 14, and the front 3 columns correspond to the information bits. Therefore, based on the size L=16 of the circulant permutation matrix or circulant matrix in the parity check matrix, the information bits may be determined to have a size of 96, 80, 64, or 48. In general, information bit lengths other than 96, 80, 64, or 48 may be supported through a shortening technique. If the codeword bit length is not 880, it can be supported by shortening and/or puncturing some of the information bits.

As another embodiment, a method for applying a plurality of exponential matrices or LDPC sequences on a given single base matrix is proposed. That is, there is one base matrix, and an exponential matrix or sequence of LDPC codes is found on the base matrix. Then, by applying the lifting to meet a block size included in each block size group from the exponential matrix or sequence, it is possible to perform variable-length LDPC encoding and decoding. In other words, with respect to exponential matrices or sequences of a plurality of different LDPC codes, the base matrices of the corresponding parity check matrices are equal to each other. Although, in this scheme, entries or numbers constituting the exponential matrix or LDPC sequence of the LDPC codes may have different values, the corresponding entries or numbers have features of coinciding in positions. As described above, the exponential matrices or LDPC sequences means exponents of the circulant permutation matrix, i.e., a kind of circulant permutation values for bits, and it is easy to know the positions of bits corresponding to the circulant permutation matrix by setting the positions of entries or numbers to be equal to each other.

First, a block size Z to be supported is divided into a plurality of block size groups (or sets) as shown in the following Equation 15. Note that the block size Z is a value corresponding to the size Z×Z of a circulant permutation matrix or circulant matrix in the parity check matrix of the LDPC code.

$$Z1 = \{12, 24, 48, 96, 192\}$$
$$Z2 = \{11, 22, 44, 88, 176\}$$
$$Z3 = \{10, 20, 40, 80, 160\}$$
$$Z4 = \{9, 18, 36, 72, 144\}$$
$$Z5 = \{8, 16, 32, 64, 128, 256\}$$
$$Z6 = \{15, 30, 60, 120, 240\}$$
$$Z7 = \{14, 28, 56, 112, 224\}$$
$$Z8 = \{13, 26, 52, 104, 208\}$$

Equation 15

The block size groups of Equation 15 have features of different granularities and the same ratio of neighboring block sizes. That is, the block sizes included in one group are in the relation of divisors or multiples. When the exponential matrix corresponding to the p-th (p=1, 2, . . . , 8) group is $E_p(e_{i,j}^{(p)})$, and when the exponential matrix corresponding to a Z value included in the p-th group is $E_p(Z)=(e_{i,j}(Z))$, it is assumed that the sequence conversion method as shown in Equation 9 is applied using $f_p(x,Z)=x(\bmod Z)$. That is, for example, when the block size Z is determined as Z=28, each entry $e_{i,j}(28)$ of the exponential matrix $E_7(28)=(e_{i,j}(28))$ for Z=28 with respect to the exponential matrix $E_7=(e_{i,j}^{(7)})$ corresponding to the 7th block size group that includes Z=28 may be obtained as shown in Equation 16.

$$e_{i,j}(28) = \begin{cases} e_{i,j}^{(7)} & e_{i,j}^{(7)} \leq 0 \\ e_{i,j}^{(7)}(\bmod 28) & e_{i,j}^{(7)} > 0 \end{cases}$$

$$e_{i,j}(28) = \begin{cases} e_{i,j}^{(7)} & e_{i,j}^{(7)} < 0 \\ e_{i,j}^{(7)}(\bmod 28) & e_{i,j}^{(7)} \geq 0 \end{cases}$$

Equation 16

The conversion as shown in Equation 16 may be simply expressed as shown in Equation 17.

$$E_p(Z)=E_p(\bmod Z), Z \in Z_p$$

Equation 17

The base matrix and the exponential matrix (or LDPC sequence) of the LDPC code designed in consideration of the above Equations 15 to 17 are shown in FIGS. 16 to 24. Although it is described above that the lifting or exponentiation matrix conversion method of Equation 9, 16, or 17 is applied to the entire exponential matrix corresponding to the parity check matrix, it is also possible to partially apply to the exponential matrix. For example, a partial matrix corresponding to a parity bit of a parity check matrix usually has a special structure for efficient encoding. In this case, the encoding method or the complexity may change due to lifting. Therefore, in order to maintain the same encoding method or complexity, no lifting may be applied to a part of an exponential matrix for a partial matrix corresponding to parity in a parity check matrix, or the lifting other than a lifting scheme applied to an exponential matrix for a partial matrix corresponding to an information bit may be applied. That is, in the exponential matrix, a lifting scheme applied to a sequence corresponding to information bits and a lifting scheme applied to a sequence corresponding to a parity bit may be set differently. Also, by applying no lifting to the entire or part of a sequence corresponding to a parity bit, a fixed value may be used without a sequence conversion.

Embodiments of the base matrix or exponential matrix corresponding to the parity check matrix of the LDPC code designed using the QC LDPC code design method proposed based on Equations 15 to 17 are shown sequentially in FIGS. 16 to 24. In the base matrix and exponential matrix as shown in FIGS. 16 to 24, empty blocks denote portions corresponding to a zero matrix of Z×Z size. In some cases, empty blocks in the base matrix of FIG. 16 may be represented by zero, and empty blocks in the exponential matrix of FIGS. 17 to 24 may be represented by a specific value such as −1. The exponential matrices of the LDPC codes shown in FIGS. 17 to 24 have the same base matrix.

FIGS. 16 to 24 are diagrams showing a base matrix or LDPC exponential matrix of a 42×52 size. Also, in each exponential matrix, a partial matrix formed of upper 5 rows and front 15 columns does not have a column of degree 1. That is, this means that the parity check matrix that can be generated by applying lifting to the above partial matrix does not have a column or column block having a degree of 1.

Figure 16:
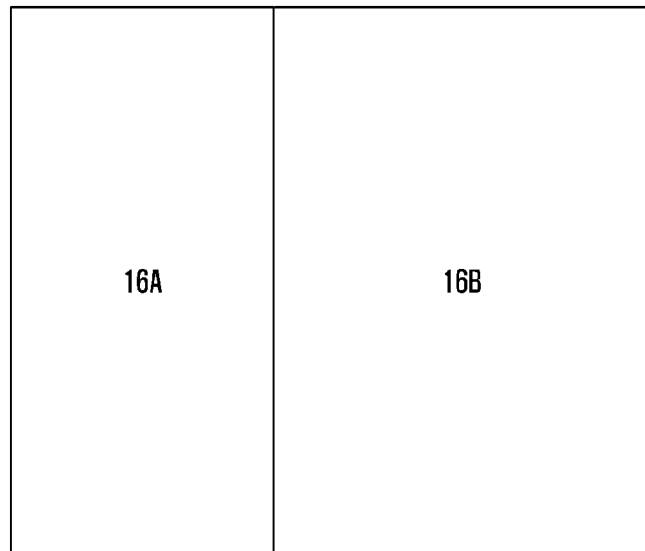
Figure 16A:
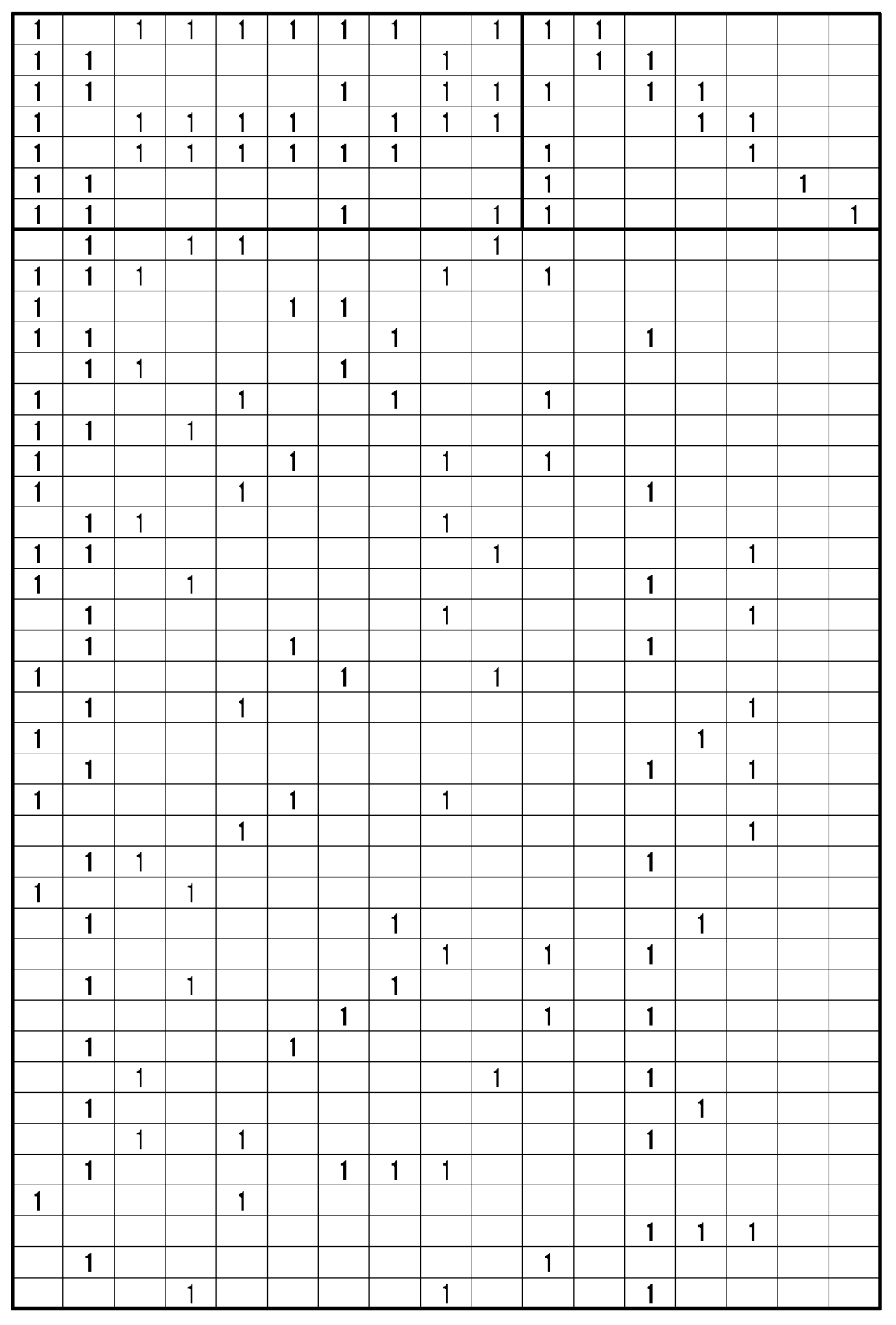
Figure 16B:
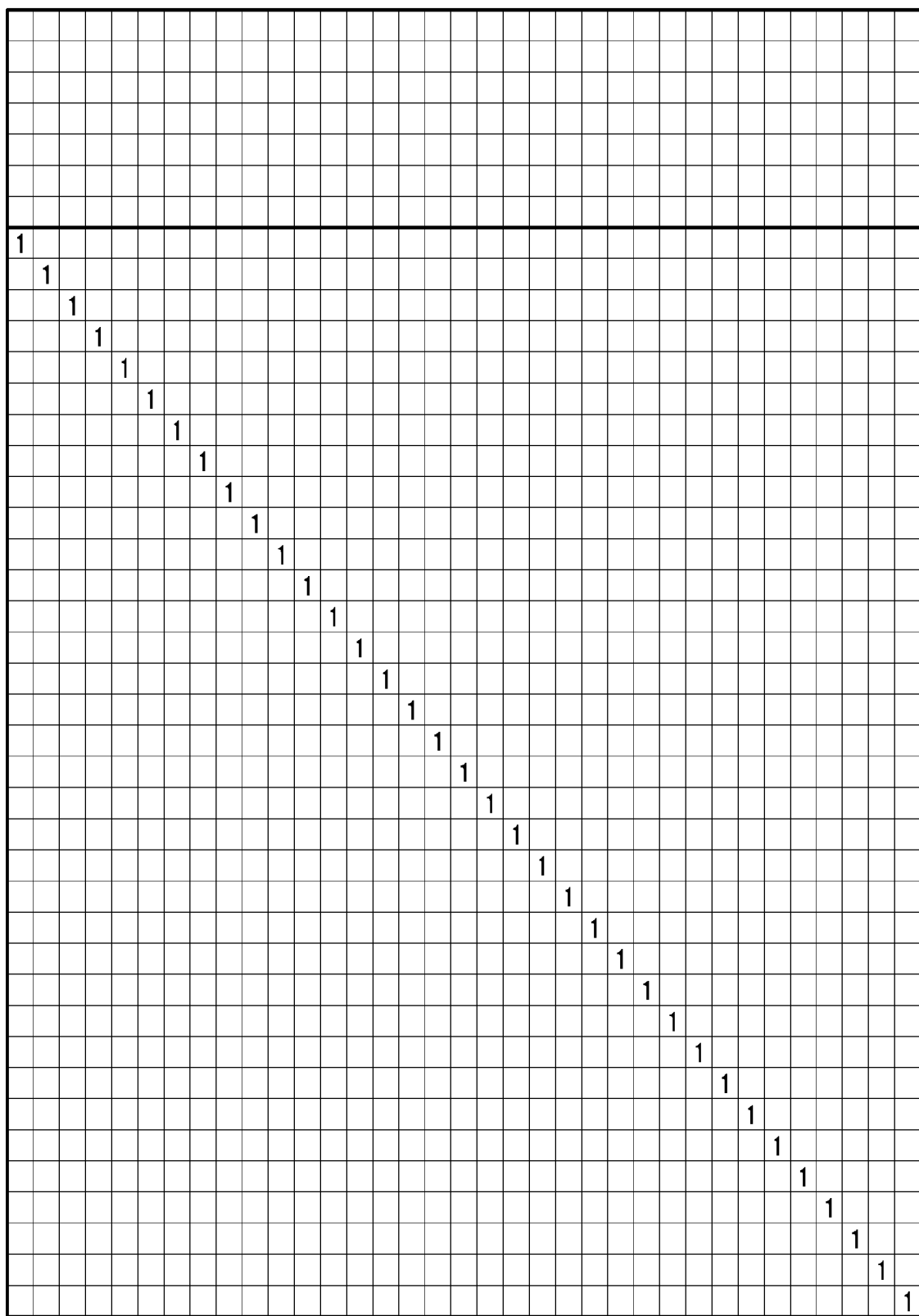

In addition, FIGS. 16A and 16B are enlarged views showing respective portions divided from a base matrix shown in FIG. 16. Reference numerals denoting two portions in FIG. 16 indicate corresponding enlarged views of matrices. Therefore, a combination of FIGS. 16A and 16B is equal to one base matrix shown in FIG. 16.

Figure 17:
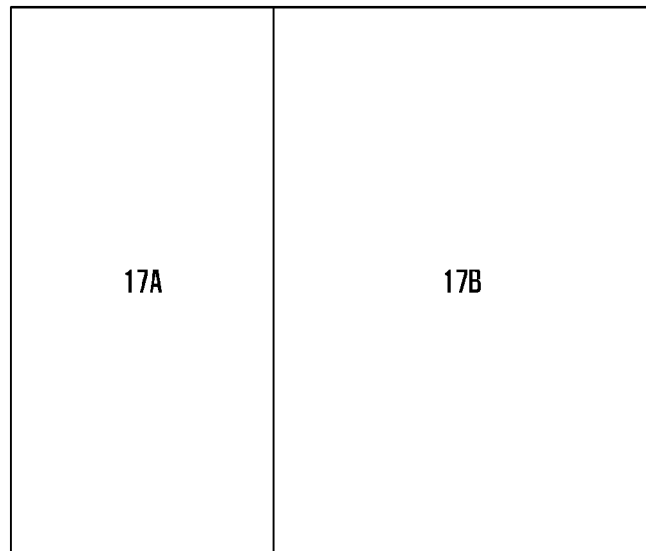
Figure 17B:
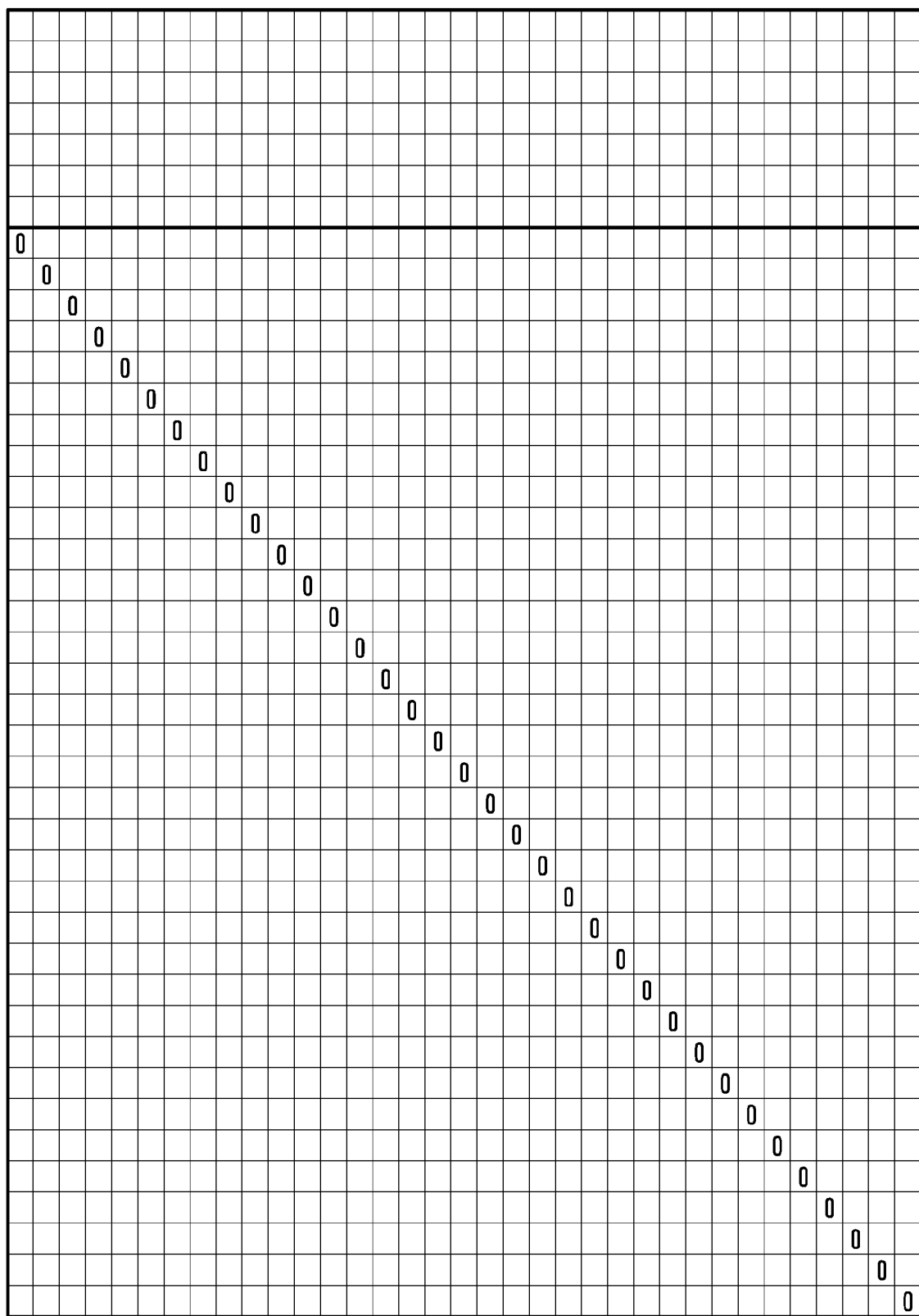
Figure 18:
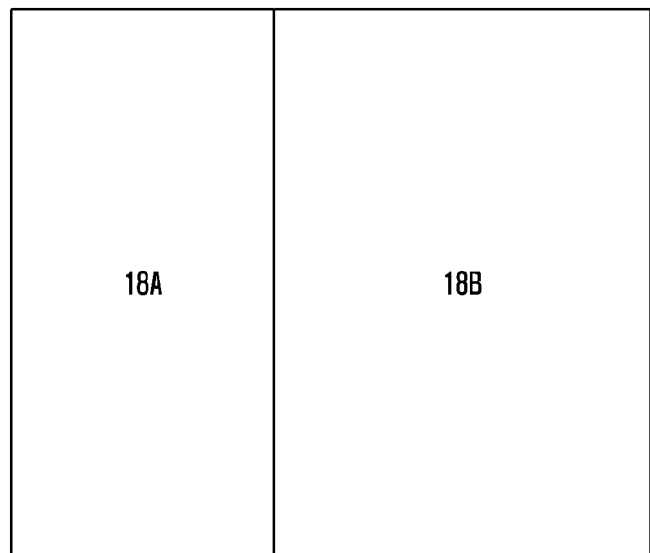
Figure 18B:
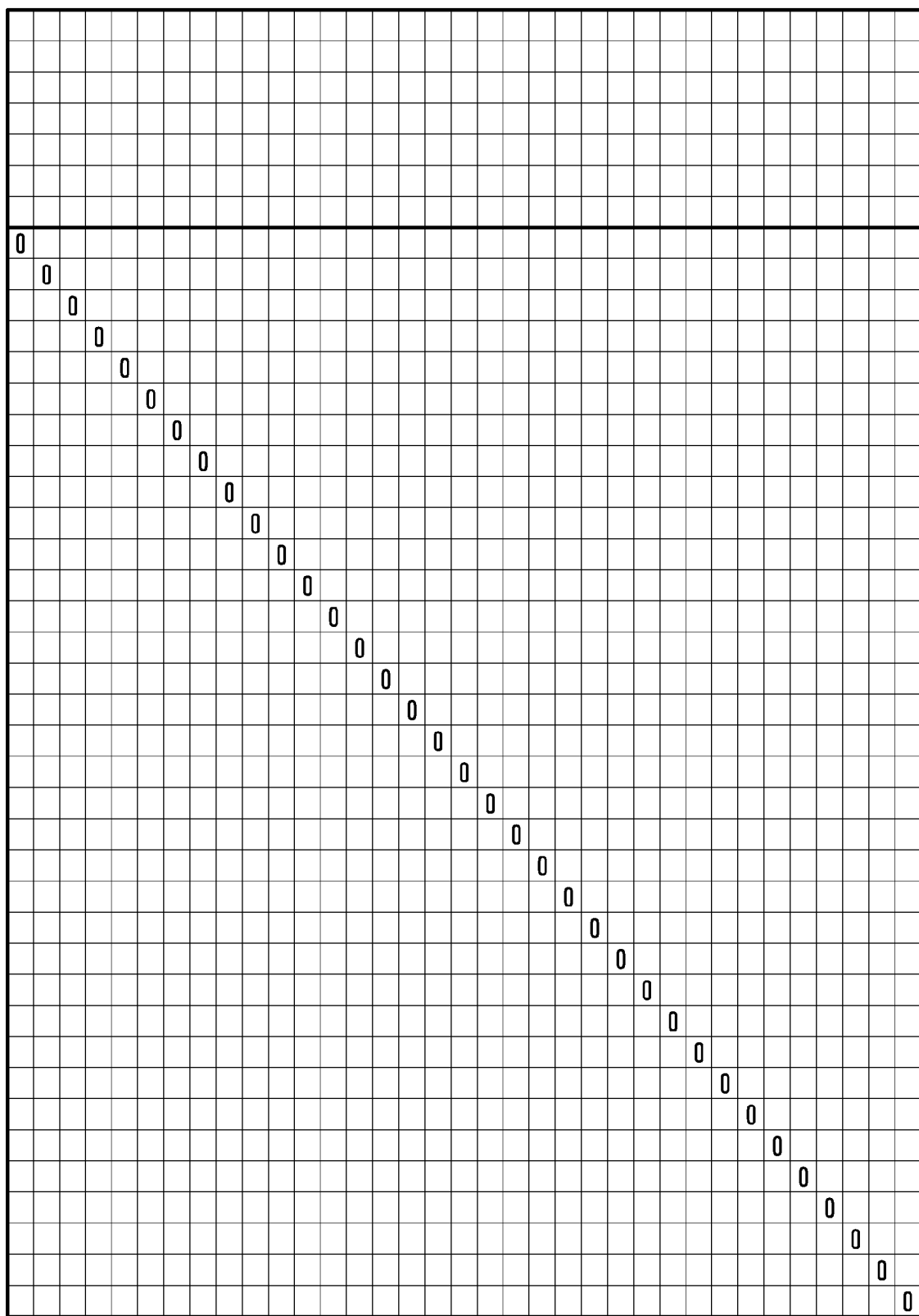
Figure 19:
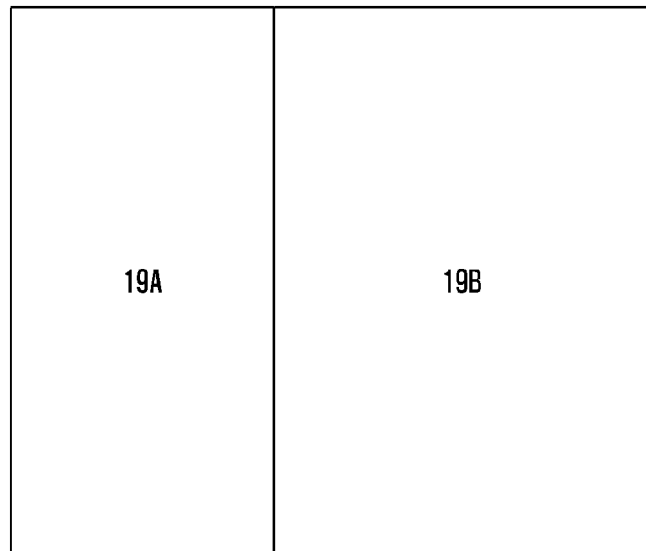
Figure 19B:
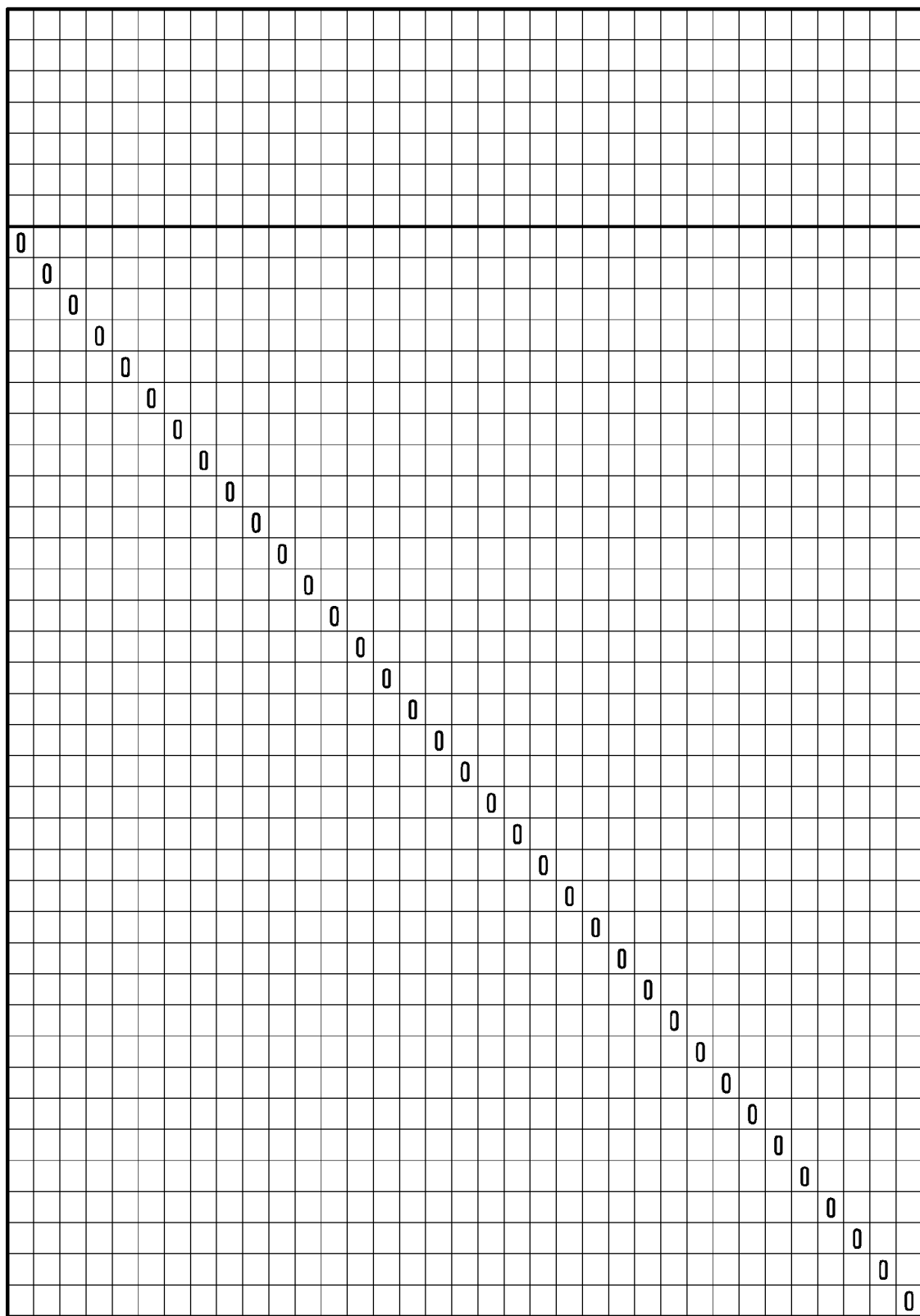
Figure 20:
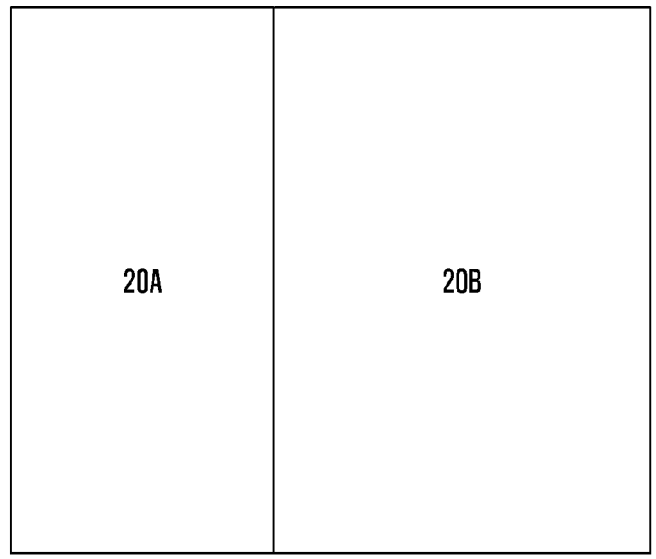
Figure 20B:
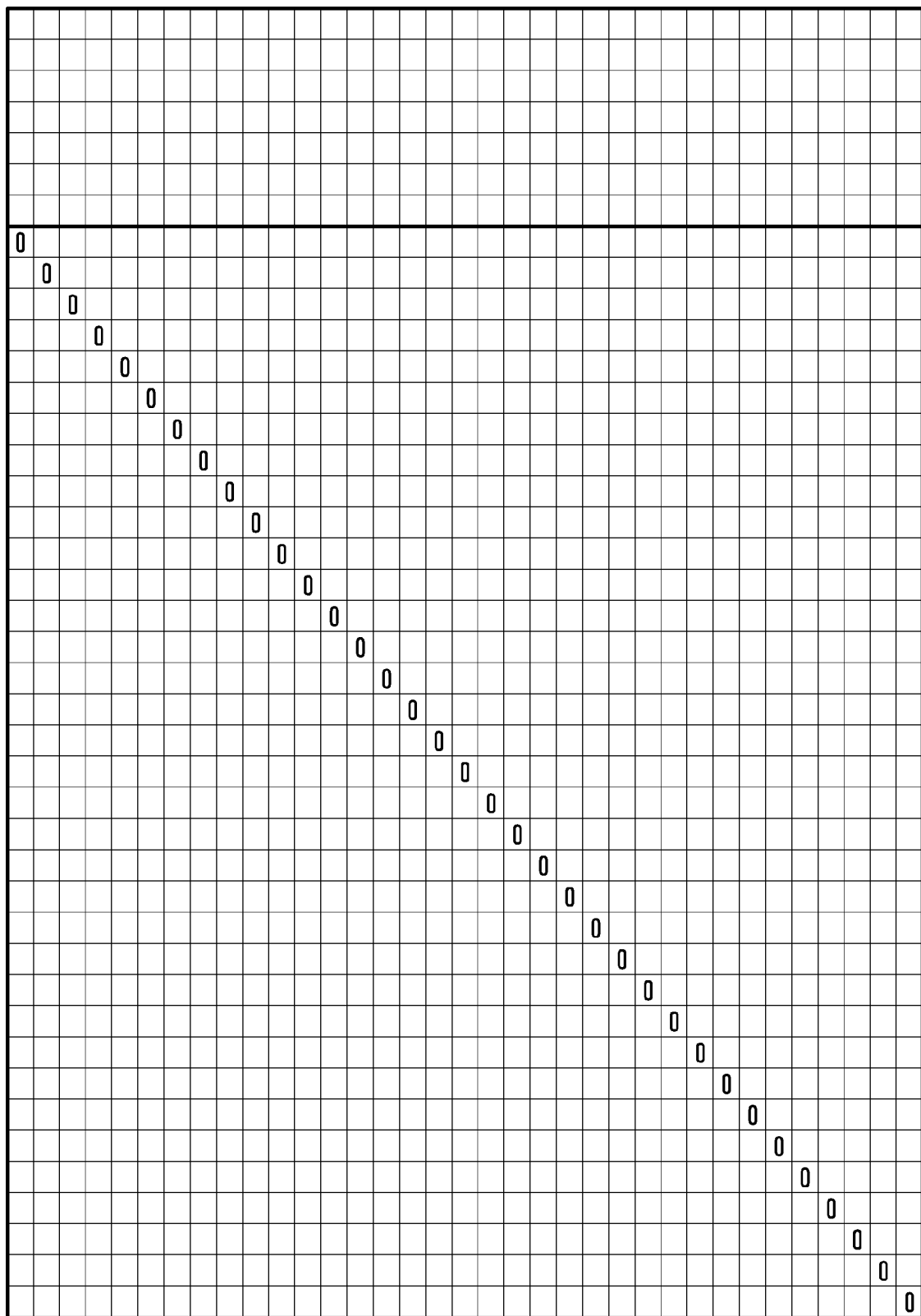
Figure 21:
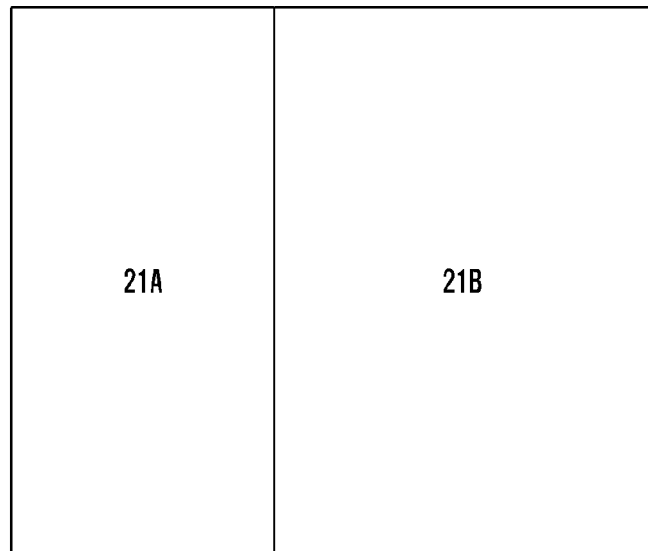
Figure 21B:
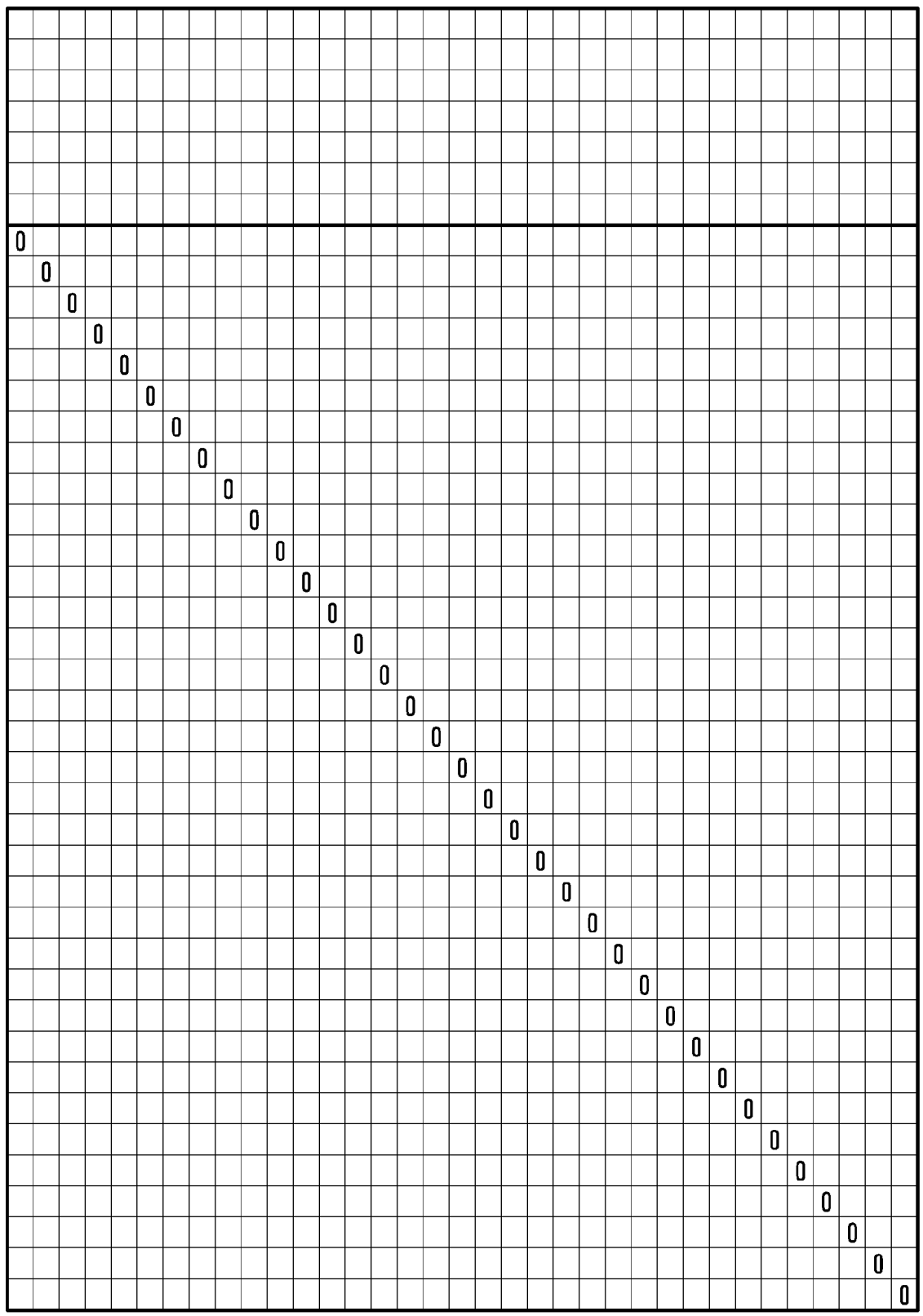
Figure 22:
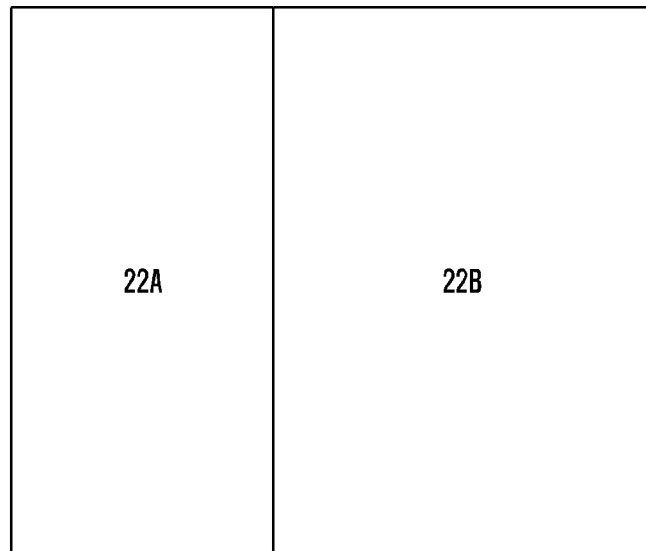
Figure 22B:
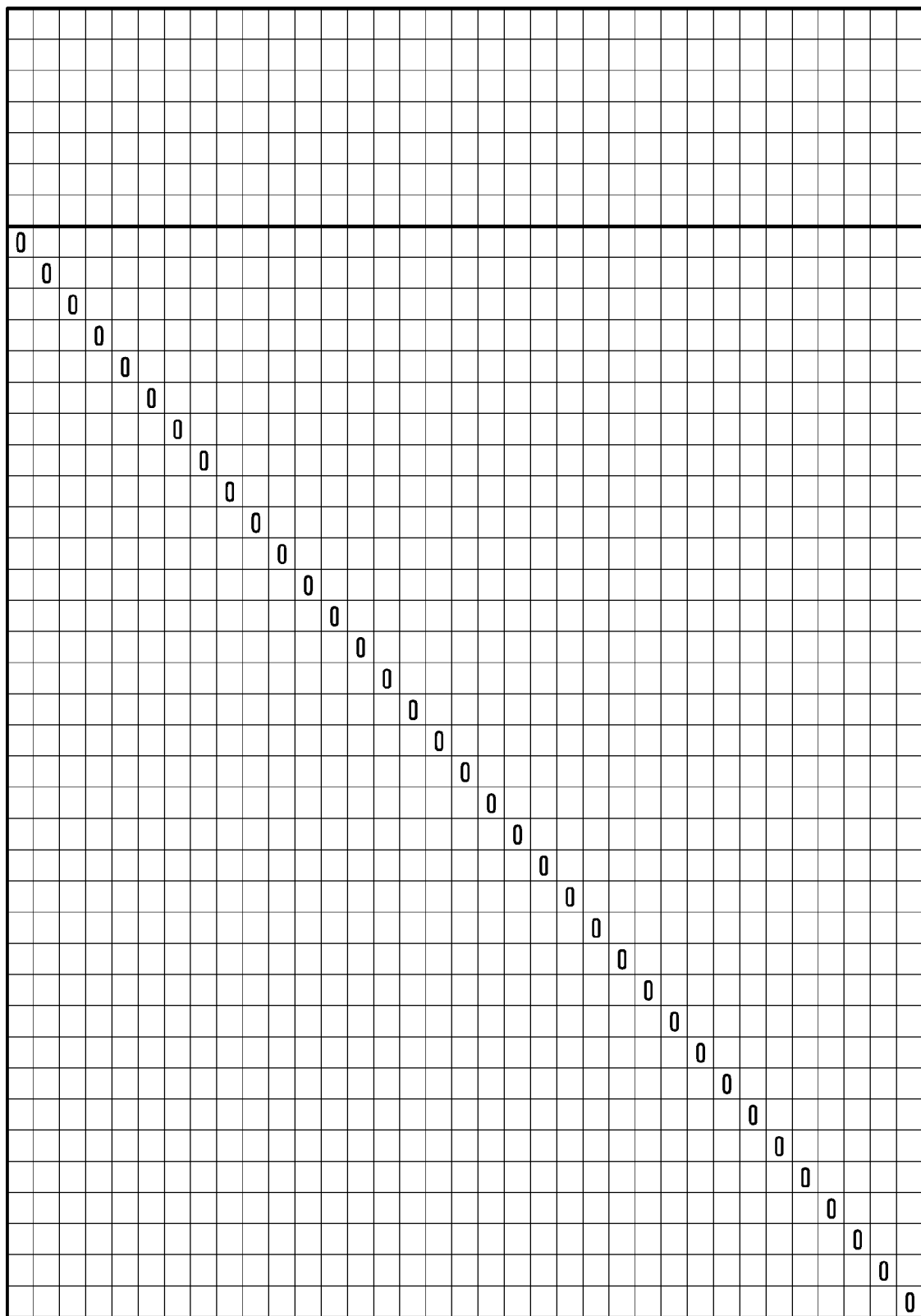
Figure 23:
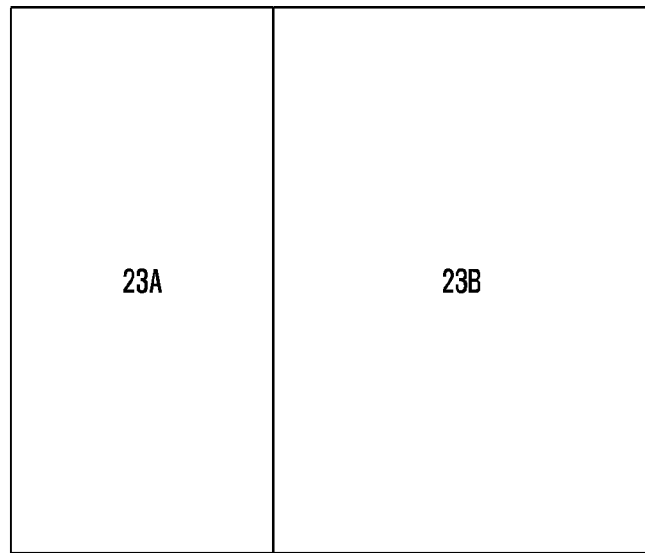
Figure 23B:
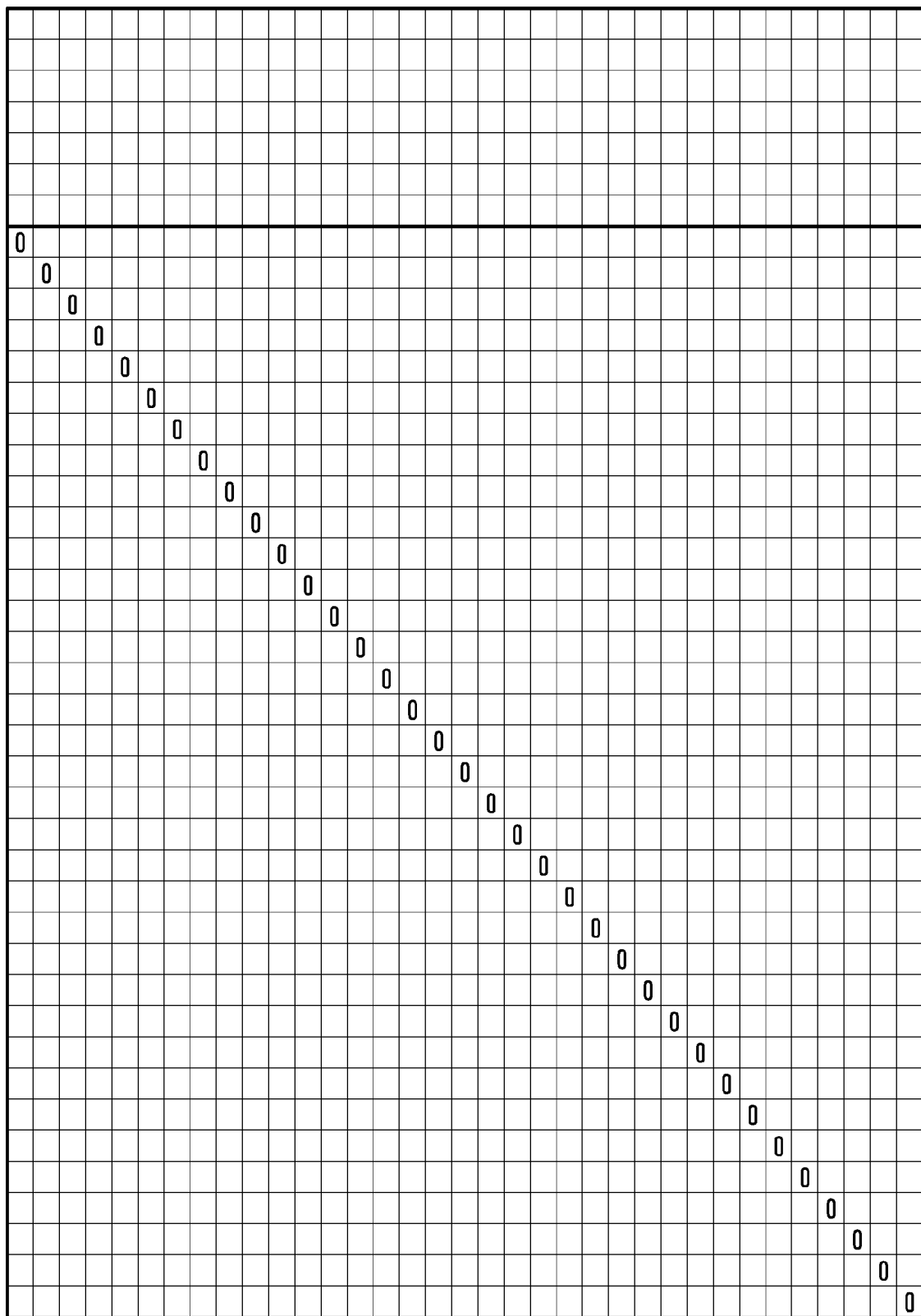
Figure 24:
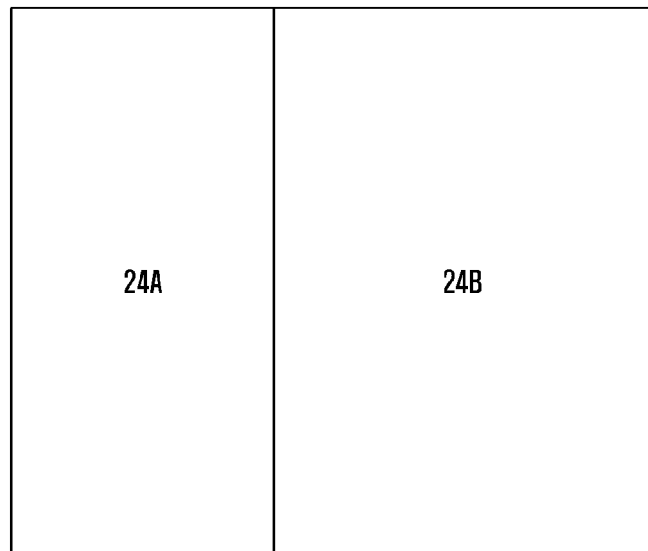
Figure 24B:
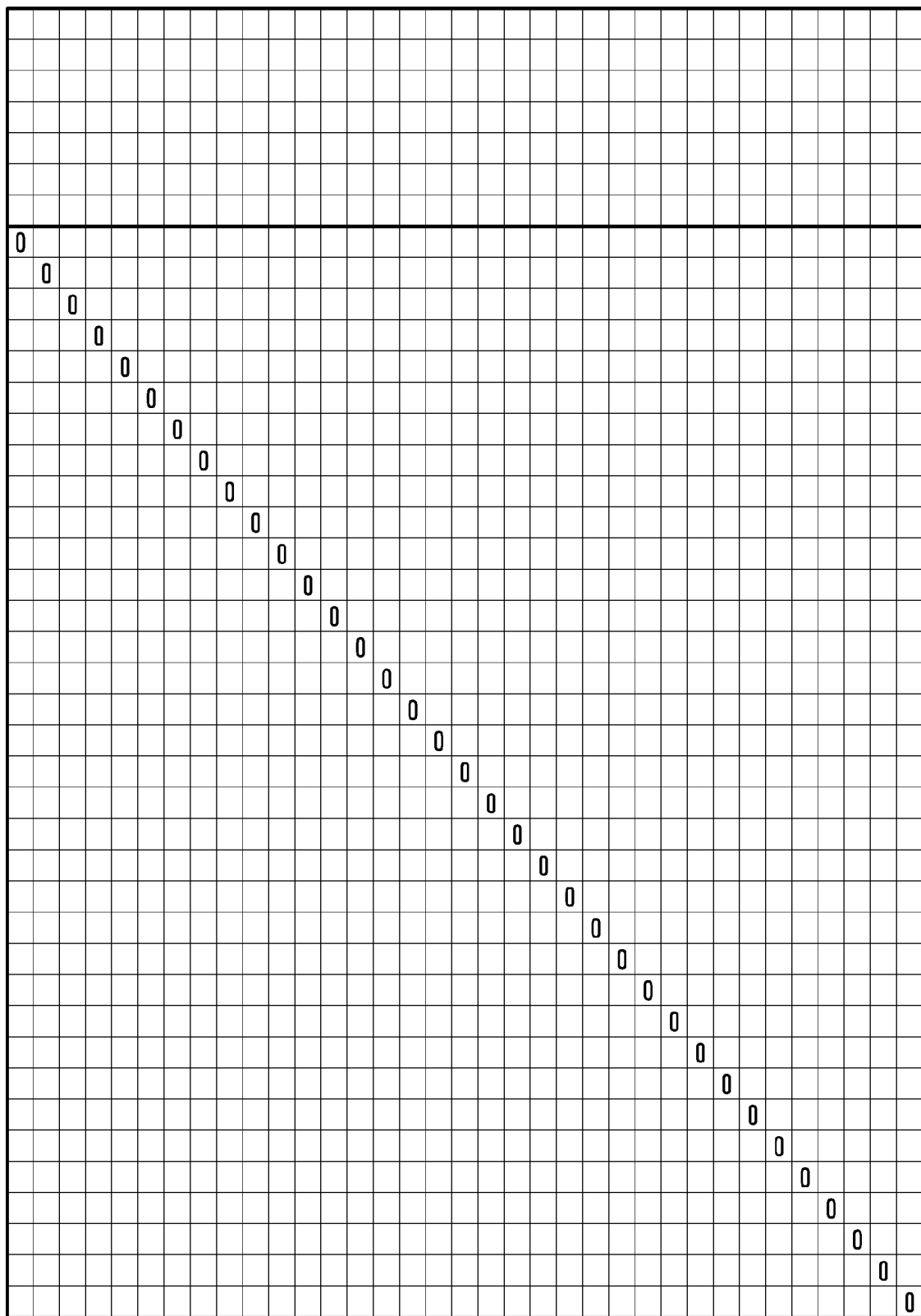
Figure 26B:
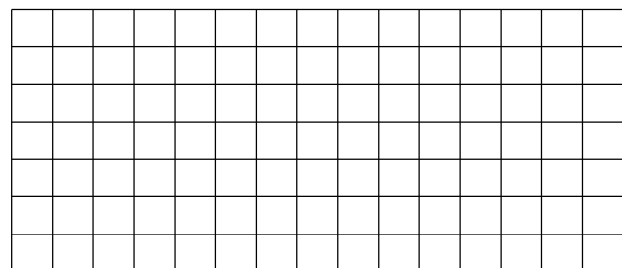
Figure 26C:
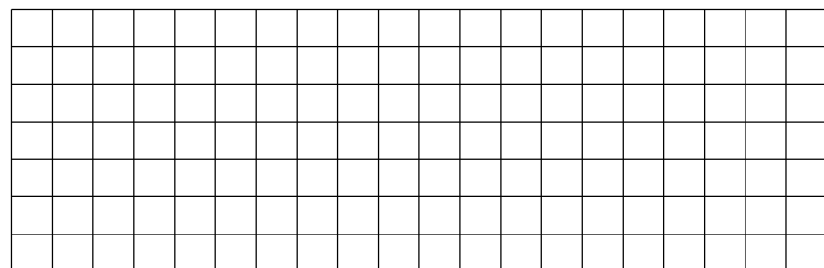
Figure 26E:
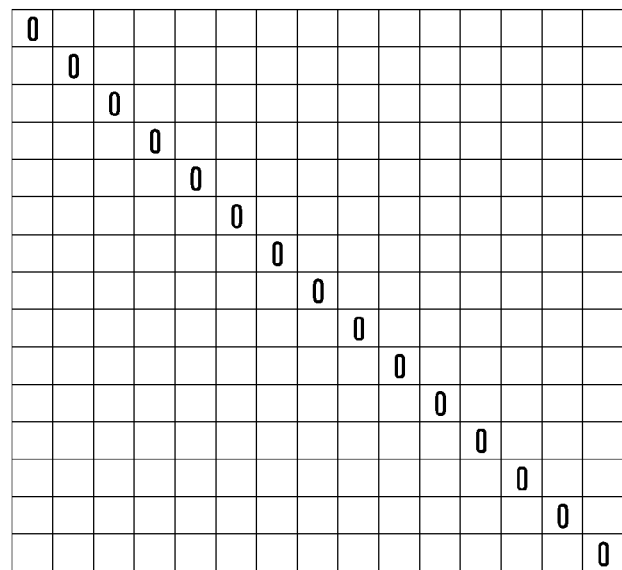
Figure 26F:
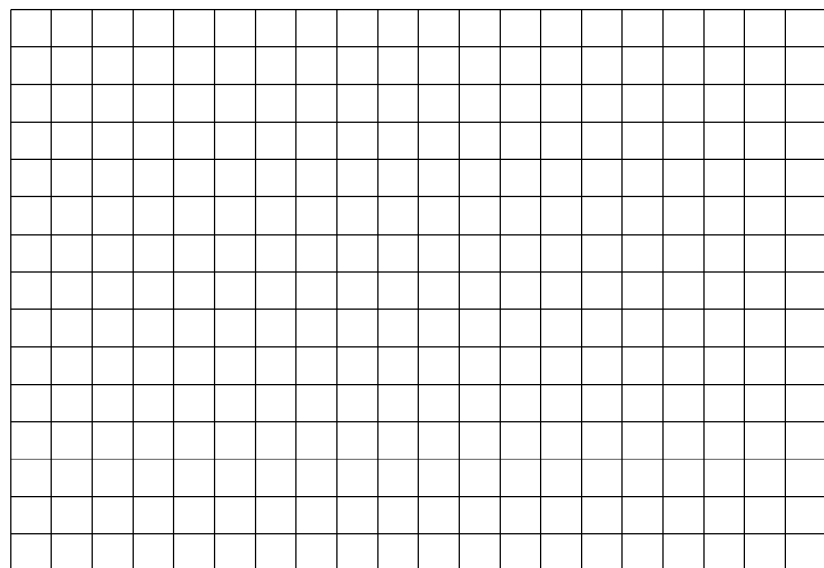
Figure 26H:
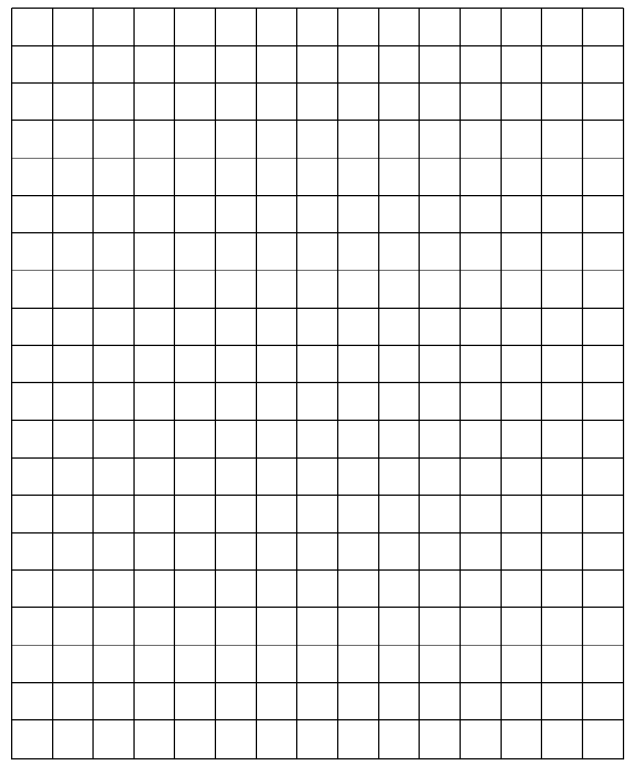
Figure 26I:
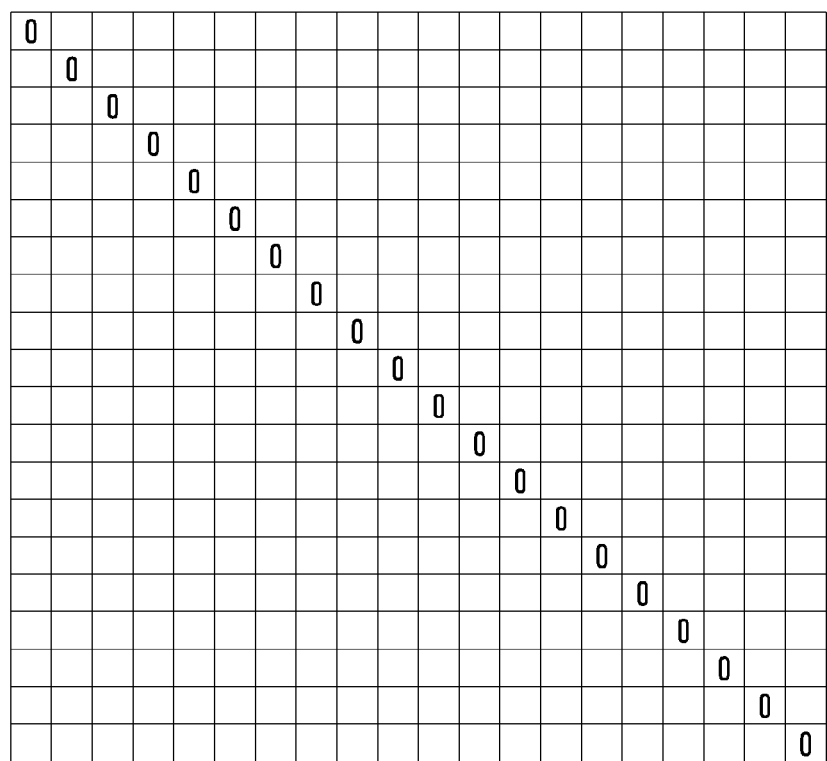

Also, FIGS. 17A and 17B are enlarged views showing respective portions divided from an exponential matrix shown in FIG. 17. Reference numerals denoting two portions in FIG. 17 indicate corresponding enlarged views of matrices. Therefore, a combination of FIGS. 17A and 17B is equal to one exponential matrix (or one LDPC sequence) shown in FIG. 17. This is similarly applied to FIGS. 18 to 24.

Another feature of the exponential matrices as shown in FIGS. 17 to 24 is that all columns from the 16th column to the 52nd column have a degree of 1. That is, the base matrix or exponential matrix of a 37×52 size composed of rows from the 6th row to the 42nd row in the exponential matrices corresponds to a single parity-check code.

The exponential matrices shown in FIGS. 17 to 24 correspond to the LDPC codes designed in consideration of the block size groups defined in Equation 15. However, depending on the requirements of the system, it is not necessary to support all block sizes included in the block size group. Therefore, the exponential matrices shown in FIGS. 17 to 24 may support block sizes corresponding to the block size groups (or sets) defined in Equation 15, and further at least support block sizes corresponding to subsets of each group (or set).

In addition, depending on systems, the base matrix and the exponential matrix as shown in FIGS. 16 to 24 may be used as they are, or only a part thereof may be used. For example, in the base matrix and the exponential matrix as shown in FIGS. 16 to 24, a new exponential matrix may be generated to apply LDPC encoding and decoding by concatenating a 7×17 partial matrix, composed of upper 7 rows and front 17 columns, with another exponential matrix of a 35×52 size.

Similarly, in the base matrix and the exponential matrix as shown in FIGS. 16 to 24, a new exponential matrix may be generated to perform LDPC encoding and decoding by concatenating a 35×52 size partial matrix composed of rows from the 8th row to the last row and columns from the 1st column to the 52nd column with another partial matrix of a 7×17 size.

Normally, a partial matrix formed by appropriately selecting rows and columns in the base matrix of FIG. 16 may be applied as a new base matrix to perform the LDPC encoding and decoding. Likewise, a partial matrix formed by appropriately selecting row blocks and column blocks in the exponential matrix of FIGS. 17 to 24 may be applied as a new exponential matrix to perform the LDPC encoding and decoding.

In addition, the coding rate of the LDPC codes may be adjusted by differently applying puncturing of codeword bits according to the coding rate. When parity bits corresponding to a column of degree 1 are punctured in the LDPC codes based on the base matrix or exponential matrix shown in FIGS. 16 to 24, the LDPC decoder may perform decoding without using the corresponding portions in the parity check matrix. Therefore, there is an advantage of reducing the decoding complexity. However, in case of considering the coding performance, there is a method for improving the performance of the LDPC codes by adjusting the puncturing order of parity bits or the transmission order of generated LDPC codeword.

For example, when information bits corresponding to front two columns of the base matrix or exponential matrix corresponding to FIGS. 16 to 24 are punctured and when all parity bits having a degree of 1 and corresponding to columns from the 18th column to the 52nd column are punctured, the LDPC codeword with a coding rate of 10/15 can be transmitted. Normally, the performance may be further improved by appropriately applying rate matching after generating the LDPC codeword by using the base matrix and exponential matrix corresponding to FIGS. 16 to 24. Of course, it is possible to apply to the LDPC encoding and decoding by appropriately rearranging the order of columns in the base matrix or exponential matrix in consideration of the rate matching.

Typically, the LDPC encoding process includes determining an input bit size (or a code block size) to which LDPC encoding will be applied, determining a block size (Z) to which the LDPC encoding will be applied, determining a suitable LDPC exponential matrix or sequence, and then performing the LDPC encoding based on the determined block size (Z) and the determined exponential matrix or LDPC sequence. At this time, the LDPC exponential matrix or sequence may be applied to the LDPC encoding without conversion, or be appropriately converted according to the block size (Z).

Similarly, the LDPC decoding process includes determining an input bit size (or a code block size) for a transmitted LDPC codeword, determining a block size (Z) to which LDPC decoding will be applied, determining a suitable LDPC exponential matrix or sequence, and performing the LDPC decoding based on the determined block size (Z) and the determined exponential matrix or LDPC sequence. At this time, the LDPC exponential matrix or sequence may be applied to the LDPC decoding without conversion, or be appropriately converted according to the block size (Z).

The base matrix shown in FIG. 16 may be expressed in various forms. For example, it is possible to express the base matrix by using a sequence as shown in the following Equations 18 to 21.

Equation 18 represents the positions of an entry 1 in each row of a partial matrix having a 42×52 size in the base matrix of FIG. 16. For example, in Equation 18, the second value 6 of the second sequence means that an entry 1 exists at the sixth column of the second row in the base matrix. In this example, the starting order of entries in a sequence and a matrix is counted from zero.

The expression 19 represents the positions of an entry 1 in each column of a partial matrix having a 42×52 size in the base matrix of FIG. 16. For example, in Equation 19, the third value 10 of the fourth sequence means that an entry 1 exists at the tenth row of the third column in the base matrix. In this example as well, the starting order of entries in a sequence and a matrix is counted from zero.

0 2 3 4 5 6 7 9 10 11  Equation 18

0 1 8 11 12

0 1 6 8 9 10 12 13

0 2 3 4 5 7 8 9 13 14

0 2 3 4 5 6 7 10 14

0 1 10 15

0 1 6 9 10 16

1 3 4 9 17

0 1 2 8 10 18

0 5 6 19

0 1 7 12 20

1 2 6 21

0 4 7 10 22

0 1 3 23

0 5 8 10 24

0 4 12 25

1 2 8 26

0 1 9 14 27

0 3 12 28

1 8 14 29

1 5 12 30

0 6 9 31

1 4 14 32

0 13 33

1 12 14 34

0 5 8 35

4 14 36

1 2 12 37

0 3 38

1 7 13 39

8 10 12 40

-continued 1 3 7 41

6 10 12 42

1 5 43

2 9 12 44

1 13 45

2 4 12 46

1 6 7 8 47

0 4 48

12 13 14 49

1 10 50

3 8 12 51

0 3 4 7 13 18 28 31 41  Equation 19

0 3 4 7 12 15 22 26 36 38

0 3 4 9 14 20 25 33

0 2 4 6 9 11 21 32 37

0 3 4 10 12 29 31 37

1 2 3 8 14 16 19 25 30 37 41

0 2 3 6 7 17 21 34

0 2 4 5 6 8 12 14 30 32 40

0 1

1 2 10 15 18 20 24 27 30 32 34 36 41

2 3 23 29 35 39

3 4 17 19 22 24 26 39

5

6

7

8

9

10

11

12

13

14

15

16

17

18

19

20

21

22

23
24
25
26
27
28
29
30
31
32
33
34
35
36
37
38
39
40
41

If there is a specific rule for the position of the column of degree 1 in the base matrix of FIG. 16, information about the corresponding position may be omitted as shown in Equations 20 and 21. Of course, it is assumed that the transmitting apparatus and the receiving apparatus know such a specific rule.

If a part of the base matrix or exponential matrix has a certain rule, the base matrix or exponential matrix may be expressed more simply. For example, in case where column blocks from the 15th column block to the last column block have a diagonal structure like the base matrix or exponential matrix shown in FIGS. 16 to 24, the positions of entries and their exponent values are omitted on the assumption that this rule is known.

For example, the following Equations 20 and 21 are obtained by omitting, from the above Equations 18 and 19, the positions of an entry 1 from the 15th column block to the last column block.

$$
\begin{array}{l}
0\ 2\ 3\ 4\ 5\ 6\ 7\ 9\ 10\ 11 \\
0\ 1\ 8\ 11\ 12 \\
0\ 1\ 6\ 8\ 9\ 10\ 12\ 13 \\
0\ 2\ 3\ 4\ 5\ 7\ 8\ 9\ 13\ 14 \\
0\ 2\ 3\ 4\ 5\ 6\ 7\ 10\ 14 \\
0\ 1\ 10 \\
0\ 1\ 6\ 9\ 10 \\
1\ 3\ 4\ 9 \\
0\ 1\ 2\ 8\ 10 \\
0\ 5\ 6
\end{array}
\quad \text{Equation 20}
$$

0 1 7 12
1 2 6
0 4 7 10
0 1 3
0 5 8 10
0 4 12
1 2 8
0 1 9 14
0 3 12
1 8 14
1 5 12
0 6 9
1 4 14
0 13
1 12 14
0 5 8
4 14
1 2 12
0 3
1 7 13
8 10 12
1 3 7
6 10 12
1 5
2 9 12
1 13
2 4 12
1 6 7 8
0 4
12 13 14
1 10
3 8 12

$$
\begin{array}{l}
0\ 3\ 4\ 7\ 13\ 18\ 28\ 31\ 41 \\
0\ 3\ 4\ 7\ 12\ 15\ 22\ 26\ 36\ 38 \\
0\ 3\ 4\ 9\ 14\ 20\ 25\ 33 \\
0\ 2\ 4\ 6\ 9\ 11\ 21\ 32\ 37 \\
0\ 3\ 4\ 10\ 12\ 29\ 31\ 37 \\
1\ 2\ 3\ 8\ 14\ 16\ 19\ 25\ 30\ 37\ 41 \\
0\ 2\ 3\ 6\ 7\ 17\ 21\ 34 \\
0\ 2\ 4\ 5\ 6\ 8\ 12\ 14\ 30\ 32\ 40 \\
0\ 1
\end{array}
\quad \text{Equation 21}
$$

1 2 10 15 18 20 24 27 30 32 34 36 39 41

2 3 23 29 35 39

3 4 17 19 22 24 26 39

The following Equation 22 represents each entry value in each row of an exponential matrix having a 42×52 size as shown in FIG. 17. For example, in Equation 22, the second value 56 of the second sequence means that the value of the second entry in the second row of the exponential matrix is 56. Further considering FIG. 16 and Equation 18, this means that the exponent of a circulant permutation matrix corresponding to the second row block and the sixth column block in a parity check matrix is 56.

If a part of the exponential matrix has a certain rule, the exponential matrix may be expressed more simply. For example, in case where column blocks from the 15th column block to the last column block have a diagonal structure like the exponential matrix shown in FIGS. 17 to 24, the exponent values thereof are omitted on the assumption that this rule is known.

For example, the following Equation 23 is an example in which the exponent value 0 is omitted from the 15th column block to the last column block.

$$
\begin{array}{l}
157\ 77\ 187\ 94\ 180\ 112\ 163\ 155\ 1\ 0 \\
10\ 24\ 17\ 0\ 0 \\
24\ 104\ 56\ 88\ 46\ 0\ 0\ 0 \\
69\ 11\ 14\ 92\ 53\ 88\ 66\ 26\ 0\ 0 \\
18\ 102\ 173\ 45\ 112\ 168\ 45\ 1\ 0 \\
157\ 101\ 135\ 0 \\
188\ 91\ 185\ 98\ 175\ 0 \\
79\ 24\ 86\ 107\ 0 \\
150\ 36\ 129\ 107\ 106\ 0 \\
110\ 76\ 189\ 0 \\
147\ 16\ 151\ 186\ 0 \\
24\ 64\ 100\ 0 \\
74\ 185\ 67\ 89\ 0 \\
88\ 58\ 181\ 0 \\
29\ 47\ 63\ 34\ 0 \\
189\ 172\ 85\ 0 \\
73\ 21\ 145\ 0 \\
125\ 112\ 120\ 37\ 0 \\
3\ 10\ 98\ 0 \\
9\ 154\ 58\ 0 \\
136\ 84\ 5\ 0 \\
118\ 89\ 147\ 0 \\
98\ 100\ 161\ 0 \\
37\ 143\ 0 \\
131\ 138\ 157\ 0 \\
118\ 41\ 87\ 0 \\
188\ 146\ 0 \\
190\ 15\ 12\ 0 \\
190\ 15\ 12\ 0 \\
112\ 180\ 0 \\
41\ 191\ 76\ 0 \\
139\ 33\ 132\ 0 \\
110\ 8\ 127\ 0 \\
102\ 4\ 69\ 0 \\
150\ 92\ 0 \\
82\ 146\ 14\ 0 \\
51\ 41\ 0 \\
154\ 83\ 48\ 0 \\
61\ 2\ 165\ 81\ 0 \\
151\ 132\ 0 \\
63\ 152\ 86\ 0 \\
0\ 151\ 0 \\
79\ 144\ 33\ 0 \\
\end{array}
\qquad \text{Equation 22}
$$

$$
\begin{array}{l}
157\ 77\ 187\ 94\ 180\ 112\ 163\ 155\ 1\ 0 \\
10\ 24\ 17\ 0\ 0 \\
24\ 104\ 56\ 88\ 46\ 0\ 0\ 0 \\
69\ 11\ 14\ 92\ 53\ 88\ 66\ 26\ 0\ 0 \\
18\ 102\ 173\ 45\ 112\ 168\ 45\ 1\ 0 \\
157\ 101\ 135 \\
188\ 91\ 185\ 98\ 175 \\
79\ 24\ 86\ 107 \\
150\ 36\ 129\ 107\ 106 \\
110\ 76\ 189 \\
147\ 16\ 151\ 186 \\
24\ 64\ 100 \\
74\ 185\ 67\ 89 \\
88\ 58\ 181 \\
29\ 47\ 63\ 34 \\
189\ 172\ 85 \\
73\ 21\ 145 \\
125\ 112\ 120\ 37 \\
3\ 10\ 98 \\
9\ 154\ 58 \\
136\ 84\ 5 \\
118\ 89\ 147 \\
98\ 100\ 161 \\
37\ 143 \\
\end{array}
\qquad \text{Equation 23}
$$

-continued

```
131 138 157
118 41 87
188 146
190 15 12
112 180
41 191 76
139 33 132
110 8 127
102 4 69
150 92
82 146 14
51 41
154 83 48
61 2 165 81
151 132
63 152 86
0 151
79 144 33
```

As described above, the base matrix and the exponential matrix may be expressed in various ways. If permutation of column or row is applied, the same expression is possible by appropriately changing the positions of sequences or of numbers in the sequence in Equations 18 to 23.

Figure 25:
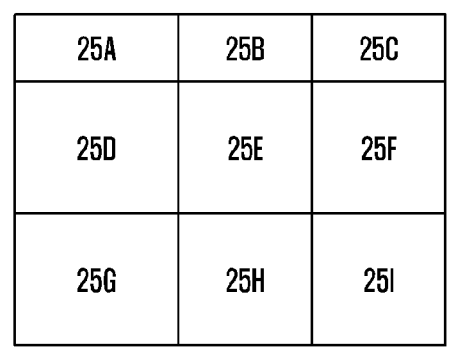

Now, examples of designing the base matrix and the exponential matrix through the design method proposed herein will be described with reference to FIGS. 25 to 33. The base matrix and the exponential matrix of FIGS. 25 to 33 are generated on condition that a partial matrix composed of upper 22 rows and front 32 columns and thus having a 22×32 size is already fixed. That is, when FIGS. 25A to 25F are given, the base matrix of FIG. 25 is obtained as an extended form by designing FIGS. 25G to 25I through the design method proposed herein.

Similarly, the exponential matrices shown in FIGS. 26 to 33 are obtained through an extended design similar to that of FIG. 25. In this way, even when a part of the base matrix or exponential matrix is previously fixed as a specific matrix or sequence, it is possible to design an extended base matrix or exponential matrix through the method proposed herein.

The base matrix or exponential matrix of FIGS. 25 to 33 has a size of 42×52, and empty blocks of the exponential matrix typically correspond to a zero matrix of a Z×Z size and may be expressed by a specific value such as −1.

Basically, each of the base matrices and exponential matrices is designed in consideration of conditions and methods as shown in Equations 15 to 17. However, this is exemplary only and is not to be construed as a limitation. For example, it is possible to support block size (Z) values included in block size groups of Equation 15 and also support block size groups as shown in Equation 24. In addition, it is possible to use a block size value included in any subset of Equation 24 and also add a suitable value to block size groups (or sets) of Equation 15 or 24.

$$Z1' = \{3, 6, 12, 24, 48, 96, 192, 384\} \quad \text{Equation 24}$$
$$Z2' = \{11, 22, 44, 88, 176, 352\}$$
$$Z3' = \{5, 10, 20, 40, 80, 160, 320\}$$
$$Z4' = \{9, 18, 36, 72, 144, 288\}$$
$$Z5' = \{2, 4, 8, 16, 32, 64, 128, 256\}$$
$$Z6' = \{15, 30, 60, 120, 240\}$$
$$Z7' = \{7, 14, 28, 56, 112, 224\}$$
$$Z8' = \{13, 26, 52, 104, 208\}$$

FIGS. 26 to 33 show embodiments of an exponential matrix corresponding to a parity check matrix of a QC LDPC code designed based on Equations 15 to 17 or Equation 24. The exponential matrices of the LDPC codes shown in FIGS. 26 to 33 have the same base matrix, which is characterized as shown in FIG. 25.

FIGS. 25A to 25I are enlarged views showing respective portions divided from the base matrix shown in FIG. 25. Reference numerals denoting respective portions in FIG. 25 indicate corresponding enlarged views of matrices. Therefore, a combination of FIGS. 25A to 25I forms one base matrix shown in FIG. 25.

FIGS. 26A to 26I are enlarged views showing respective portions divided from the exponential matrix shown in FIG. 26. Reference numerals denoting respective portions in FIG. 26 indicate corresponding enlarged views of matrices. Therefore, a combination of FIGS. 26A to 26I forms one exponential matrix shown in FIG. 26.

FIGS. 27 to 33 show portions A, D, and G of FIG. 26. In FIGS. 27 to 33, the other portions B, C, E, F, H, and I are the same as those of FIG. 26, that is, the same as shown in FIGS. 26B, 26C, 26E, 26F, 26H, and 26I. Therefore, by combining the A, D, and G portions shown in each of FIGS. 27 to 33 with FIGS. 26A, 26B, 26C, 26E, 26F, 26H, and 26I, the exponential matrix may be formed.

The base matrix and the exponential matrix of FIGS. 25 to 33 are generated, based on a partial matrix composed of upper 22 rows and front 32 columns and thus having a 22×32 size. That is, even when a part of the base matrix or exponential matrix is previously fixed as a specific matrix or sequence, it is possible to design an extended base matrix or exponential matrix through the method proposed herein.

The base matrix and the exponential matrix shown in FIGS. 25 to 33 may be expressed in various forms. For example, expression using a sequence as shown in the following Equation 25 is possible. Equation 24 represents the positions of an entry 1 in each row of the base matrix of FIG. 25.

```
0 1 2 3 6 9 10 11                 Equation 25
0 3 4 5 6 7 8 9 11 12
0 1 3 4 8 10 12 13
1 2 4 5 6 7 8 9 10 13
0 1 11 14
0 1 5 7 11 15
0 5 7 9 11 16
```

-continued 1 5 7 11 13 17
0 1 12 18
1 8 10 11 19
0 1 6 7 20
0 7 9 13 21
1 3 11 22
0 1 8 13 23
1 6 11 13 24
0 10 11 25
1 9 11 12 26
1 5 11 12 27
0 6 7 28
0 1 10 29
1 4 11 30
0 8 13 31
1 2 32
0 3 5 33
1 2 9 34
0 5 35
2 7 12 13 36
0 6 37
1 2 5 38

-continued 0 4 39
2 5 7 9 40
1 13 41
2 5 7 8 42
1 12 43
0 3 44
2 5 7 8 42
1 12 43
0 3 44
2 5 7 45
1 10 46
2 5 7 47
0 8 12 48
2 5 7 49
0 4 50
2 12 13 51

Equation 26 shows the positions of an entry 1 in each column of the base matrix of FIG. 25.

0 1 2 4 5 6 8 10 11 13 15 18 19 21 23 25 27 29 34 40         Equation 26
0 2 3 4 5 7 8 9 10 12 13 14 16 17 19 20 22 24 28 31 33 36
0 3 22 24 26 28 30 32 35 37 39 41
0 1 2 12 23 34
1 2 3 20 29 40
1 3 5 6 7 17 23 25 28 30 32 35 37 39
0 1 3 10 14 18 27
1 3 5 6 7 10 11 18 26 30 32 35 37 39
1 2 3 9 13 21 32 38
0 1 3 6 11 16 24 30
0 2 3 9 15 19 36
0 1 4 5 6 7 9 12 14 15 16 17 20
1 2 8 16 17 26 33 38 41
2 3 7 11 13 14 21 26 31 41
4
5
6
7
8
9

-continued 10
11
12
13
14
15
16
17
18
19
20
21
22
23
24
25
26
27
28
29
30
31
32
33
34
35
36
37
38
39
40
41

If a certain rule can be found for a part of the base matrix, the base matrix may be expressed more simply. For example, in case where columns from the 15th column to the last column have a diagonal structure like the base matrix shown in FIG. 25, the positions of entries or their exponent values may be omitted on the assumption that the transmitting and receiving apparatuses know this rule.

For reference, by appropriately shortening a part of information bits and puncturing a part of codeword bits with respect to the LDPC code that can be generated based on the base matrix or exponential matrix shown in FIGS. 25 to 33, it is possible to support the LDPC encoding and decoding with various coding rates and various lengths. For example, various information word lengths (or code block lengths) and various coding rates can be supported by applying shortening to a part of information bits in the base matrix and exponential matrix shown in FIGS. 25 to 33, then puncturing information bits corresponding to the first two columns, and puncturing a part of parity.

In addition, when a variable information word length or a variable coding rate is supported using the shortening or zero-padding of the LDPC code, the code performance may be improved according to the order or method of shortening. If the shortening order is already set, the encoding performance may be improved by rearranging the entire or a part of the given base matrix. Also, the performance may be improved by appropriately determining a block size or a size of a column block, to which the shortening is to be applied, with respect to a specific information word length (or code block length).

For example, when front ten columns in FIGS. 25 to 33 correspond to information word bits (or code blocks), and when the number of columns to be used for LDPC encoding is $K_b$, better performance can be obtained by applying an appropriate rule for shortening as given below and thereby determining the values of $K_b$ and a block size (Z).

```
    if(CBS>640)
      K_b=10;
    elseif(CBS>=5 76)
      K_b=9;
    elseif(CBS>=200)
      K_b=8;
    else
      if(CBS is member of [48, 96, 176, 184, 192])
        K_b=7;
      else
        K_b=6;
      end
    end
```

In the above, CBS denotes an information word length or a code block length. When the value of $K_b$ is determined in the above, the block size (Z) value can be determined as the minimum value that satisfies $Z \times K_b \geq CBS$. For example, $K_b$ and the block size are determined as shown in Equation 27.

$$CBS = 40 => K_b = 6 => Z = 7$$
$$CBS = 48 => K_b = 7 => Z = 7$$
$$CBS = 56 => K_b = 6 => Z = 10$$
$$CBS = 64 => K_b = 6 => Z = 11$$
$$CBS = 72 => K_b = 6 => Z = 12$$
$$CBS = 80 => K_b = 6 => Z = 14$$
$$CBS = 200 => K_b = 8 => Z = 26$$
$$CBS = 640 => K_b = 9 => Z = 72$$
$$CBS = 1024 => K_b = 10 => Z = 104$$

Equation 27

Depending on systems, the base matrix or the exponential matrix as shown in FIGS. 25 to 33 may be used as it is, or only a part thereof may be used. For example, in the base matrix or the exponential matrix as shown in FIGS. 25 to 33, a new exponential matrix or exponential matrix may be generated by concatenating with a 22×32 LDPC base matrix or exponential matrix other than a 22×32 partial matrix composed of upper 22 rows and front 32 columns, and be used for LDPC encoding and decoding methods and apparatuses. For example, using 20 matrices as shown in Equation 28 from Equation 25, a new base matrix may be generated by concatenating with another base matrix.

$$\begin{array}{l}
1\ 2\ 32 \\
0\ 3\ 5\ 33 \\
1\ 2\ 9\ 34 \\
0\ 5\ 35 \\
2\ 7\ 12\ 13\ 36 \\
0\ 6\ 37 \\
1\ 2\ 5\ 38 \\
0\ 4\ 39 \\
2\ 5\ 7\ 9\ 40
\end{array}$$

Equation 28

$$\begin{array}{l}
1\ 13\ 41 \\
2\ 5\ 7\ 8\ 42 \\
1\ 12\ 43 \\
0\ 3\ 44 \\
2\ 5\ 7\ 45 \\
1\ 12\ 43 \\
0\ 3\ 44 \\
2\ 5\ 7\ 45 \\
1\ 10\ 46 \\
2\ 5\ 7\ 47 \\
0\ 8\ 12\ 48 \\
2\ 5\ 7\ 49 \\
0\ 4\ 50 \\
2\ 12\ 13\ 51
\end{array}$$

-continued

As another example, by concatenating upper 32 sequences, as shown in Equation 29, from Equation 25 with other 10 LDPC base matrices or LDPC sequences, a new base matrix may be generated and applied to the LDPC encoding and decoding. For reference, as shown in Equation 29, the partial matrix of the base matrix defined by selecting upper 32 sequences from Equation 25 is the same as the partial matrix of the base matrix defined by selecting upper 32 rows in FIG. 25.

In case of defining a new base matrix by using a sequence corresponding to a partial matrix (or part of sequence) of an LDPC base matrix (or sequence) corresponding to FIG. 25 or Equation 25 as shown in Equations 28 and 29, it is also possible to generate a new exponential matrix by using a portion corresponding to the partial matrix (or part of sequence) in an LDPC exponential matrix corresponding to FIGS. 26 to 33.

$$\begin{array}{l}
0\ 1\ 2\ 3\ 6\ 9\ 10\ 11 \\
0\ 3\ 4\ 5\ 6\ 7\ 8\ 9\ 11\ 12 \\
0\ 1\ 3\ 4\ 8\ 10\ 12\ 13 \\
1\ 2\ 4\ 8\ 10\ 12\ 13 \\
0\ 1\ 11\ 14 \\
0\ 1\ 5\ 7\ 11\ 15 \\
0\ 5\ 7\ 9\ 11\ 16 \\
1\ 5\ 7\ 11\ 13\ 17 \\
0\ 1\ 12\ 18 \\
1\ 8\ 10\ 11\ 19 \\
0\ 1\ 6\ 7\ 20 \\
0\ 7\ 9\ 13\ 21 \\
1\ 3\ 11\ 22 \\
0\ 1\ 8\ 13\ 23 \\
1\ 6\ 11\ 13\ 24 \\
0\ 10\ 11\ 25
\end{array}$$

Equation 29

-continued 1 9 11 12 26

1 5 11 12 27

0 6 7 28

0 1 10 29

1 4 11 30

0 8 13 31

1 2 32

0 3 5 33

1 2 9 34

0 5 35

2 7 12 13 36

0 6 37

1 2 5 38

0 4 39

2 5 7 9 40

1 13 41

In general, a partial matrix formed by appropriately selecting rows and columns in the base matrix and exponential matrix of FIGS. 25 to 33 may be applied as a new base matrix and exponential matrix and used for a method and apparatus of LDPC encoding and decoding.

While the present disclosure has been particularly shown and described with reference to exemplary embodiments thereof, it is clearly understood that the same is by way of illustration and example only and is not to be taken in conjunction with the present disclosure. It will be understood by those skilled in the art that various changes in form and details may be made therein without departing from the subject matter and scope of the present disclosure.

Although the present disclosure has been described with various embodiments, various changes and modifications may be suggested to one skilled in the art. It is intended that the present disclosure encompass such changes and modifications as fall within the scope of the appended claims.

What is claimed is:

1. A method performed by a transmitter in a communication system or a broadcasting system, the method comprising:
    identifying, by at least one processor, a block size Z;
    identifying, by the at least one processor, a first matrix based on a base matrix and the block size Z; and
    performing, by the at least one processor, an encoding procedure based on the first matrix,
    wherein a column index corresponds to a non-zero element in a row of the base matrix, and a plurality of rows of the base matrix have following values as column indices:
        0, 1, 2, 3, 6, 9, 10, and 11 for a row of the plurality of rows,
        0, 3, 4, 5, 6, 7, 8, 9, 11, and 12 for a row of the plurality of rows,
        0, 1, 3, 4, 8, 10, 12, and 13 for a row of the plurality of rows,
        1, 2, 4, 5, 6, 7, 8, 9, 10, and 13 for a row of the plurality of rows,
        0, 1, 11, and 14 for a row of the plurality of rows,
        0, 1, 5, 7, 11, and 15 for a row of the plurality of rows,
        0, 5, 7, 9, 11, and 16 for a row of the plurality of rows,
        1, 5, 7, 11, 13, and 17 for a row of the plurality of rows,
        0, 1, 12, and 18 for a row of the plurality of rows,
        1, 8, 10, 11, and 19 for a row of the plurality of rows,
        0, 1, 6, 7, and 20 for a row of the plurality of rows,
        0, 7, 9, 13, and 21 for a row of the plurality of rows,
        1, 3, 11, and 22 for a row of the plurality of rows,
        0, 1, 8, 13, and 23 for a row of the plurality of rows,
        1, 6, 11, 13, and 24 for a row of the plurality of rows,
        0, 10, 11, and 25 for a row of the plurality of rows,
        1, 9, 11, 12, and 26 for a row of the plurality of rows,
        1, 5, 11, 12, and 27 for a row of the plurality of rows,
        0, 6, 7, and 28 for a row of the plurality of rows,
        0, 1, 10, and 29 for a row of the plurality of rows,
        1, 4, 11, and 30 for a row of the plurality of rows,
        0, 8, 13, and 31 for a row of the plurality of rows,
        1, 2, and 32 for a row of the plurality of rows,
        0, 3, 5, and 33 for a row of the plurality of rows,
        1, 2, 9, and 34 for a row of the plurality of rows,
        0, 5, and 35 for a row of the plurality of rows,
        2, 7, 12, 13, and 36 for a row of the plurality of rows,
        0, 6, and 37 for a row of the plurality of rows,
        1, 2, 5, and 38 for a row of the plurality of rows,
        0, 4, and 39 for a row of the plurality of rows,
        2, 5, 7, 9, and 40 for a row of the plurality of rows, and
        1, 13, and 41 for a row of the plurality of rows.

2. The method of claim 1, wherein the block size Z is identified based on a size of a bit sequence to be encoded.

3. The method of claim 1, wherein the block size Z is selected based on a following block size groups:
    $Z1'=\{3, 6, 12, 24, 48, 96, 192, 384\}$
    $Z2'=\{11, 22, 44, 88, 176, 352\}$
    $Z3'=\{5, 10, 20, 40, 80, 160, 320\}$
    $Z4'=\{9, 18, 36, 72, 144, 288\}$
    $Z5'=\{2, 4, 8, 16, 32, 64, 128, 256\}$
    $Z6'=\{15, 30, 60, 120, 240\}$
    $Z7'=\{7, 14, 28, 56, 112, 224\}$
    $Z8'=\{13, 26, 52, 104, 208\}$.

4. The method of claim 1, wherein the first matrix is identified based on a value of 1 in the base matrix being replaced by a second matrix.

5. The method of claim 4, wherein the second matrix is identified by circularly shifting an identity matrix based on a value identified by applying a modulo operation of the block size Z to an element of a predetermined matrix.

6. The method of claim 1, wherein the base matrix corresponds to 42 rows and 52 columns.

7. A method performed by a receiver in a communication system or a broadcasting system, the method comprising:
    identifying, by at least one processor, a block size Z;
    identifying, by the at least one processor, a first matrix based on a base matrix and the block size Z; and
    performing, by the at least one processor, a decoding procedure based on the first matrix,
    wherein a column index corresponds to a non-zero element in a row of the base matrix, and a plurality of rows of the base matrix have following values as column indices:
        0, 1, 2, 3, 6, 9, 10, and 11 for a row of the plurality of rows,
        0, 3, 4, 5, 6, 7, 8, 9, 11, and 12 for a row of the plurality of rows,
        0, 1, 3, 4, 8, 10, 12, and 13 for a row of the plurality of rows,
        1, 2, 4, 5, 6, 7, 8, 9, 10, and 13 for a row of the plurality of rows, 0, 1, 11, and 14 for a row of the plurality of rows,
0, 1, 5, 7, 11, and 15 for a row of the plurality of rows,
0, 5, 7, 9, 11, and 16 for a row of the plurality of rows,
1, 5, 7, 11, 13, and 17 for a row of the plurality of rows,
0, 1, 12, and 18 for a row of the plurality of rows,
1, 8, 10, 11, and 19 for a row of the plurality of rows,
0, 1, 6, 7, and 20 for a row of the plurality of rows,
0, 7, 9, 13, and 21 for a row of the plurality of rows,
1, 3, 11, and 22 for a row of the plurality of rows,
0, 1, 8, 13, and 23 for a row of the plurality of rows,
1, 6, 11, 13, and 24 for a row of the plurality of rows,
0, 10, 11, and 25 for a row of the plurality of rows,
1, 9, 11, 12, and 26 for a row of the plurality of rows,
1, 5, 11, 12, and 27 for a row of the plurality of rows,
0, 6, 7, and 28 for a row of the plurality of rows,
0, 1, 10, and 29 for a row of the plurality of rows,
1, 4, 11, and 30 for a row of the plurality of rows,
0, 8, 13, and 31 for a row of the plurality of rows,
1, 2, and 32 for a row of the plurality of rows,
0, 3, 5, and 33 for a row of the plurality of rows,
1, 2, 9, and 34 for a row of the plurality of rows,
0, 5, and 35 for a row of the plurality of rows,
2, 7, 12, 13, and 36 for a row of the plurality of rows,
0, 6, and 37 for a row of the plurality of rows,
1, 2, 5, and 38 for a row of the plurality of rows,
0, 4, and 39 for a row of the plurality of rows,
2, 5, 7, 9, and 40 for a row of the plurality of rows, and
1, 13, and 41 for a row of the plurality of rows.

8. The method of claim 7, wherein the block size Z is identified based on a size of a bit sequence which is encoded.

9. The method of claim 7, wherein the block size Z is selected based on a following block size groups:
Z1'={3, 6, 12, 24, 48, 96, 192, 384}
Z2'={11, 22, 44, 88, 176, 352}
Z3'={5, 10, 20, 40, 80, 160, 320}
Z4'={9, 18, 36, 72, 144, 288}
Z5'={2, 4, 8, 16, 32, 64, 128, 256}
Z6'={15, 30, 60, 120, 240}
Z7'={7, 14, 28, 56, 112, 224}
Z8'={13, 26, 52, 104, 208}.

10. The method of claim 7, wherein the first matrix is identified based on a value of 1 in the base matrix being replaced by a second matrix.

11. The method of claim 10, wherein the second matrix is identified by circularly shifting an identity matrix based on a value identified by applying a modulo operation of the block size Z to an element of a predetermined matrix.

12. The method of claim 7, wherein the base matrix corresponds to 42 rows and 52 columns.

13. A transmitter in a communication system or a broadcasting system, the transmitter comprising:
a transceiver; and
at least one processor coupled with the transceiver and configured to identify a block size Z, identify a first matrix based on a base matrix and the block size Z, and perform an encoding procedure based on the first matrix,
wherein a column index corresponds to a non-zero element in a row of the base matrix, and a plurality of rows of the base matrix have following values as column indices:
0, 1, 2, 3, 6, 9, 10, and 11 for a row of the plurality of rows,
0, 3, 4, 5, 6, 7, 8, 9, 11, and 12 for a row of the plurality of rows,
0, 1, 3, 4, 8, 10, 12, and 13 for a row of the plurality of rows,
1, 2, 4, 5, 6, 7, 8, 9, 10, and 13 for a row of the plurality of rows,
0, 1, 11, and 14 for a row of the plurality of rows,
0, 1, 5, 7, 11, and 15 for a row of the plurality of rows,
0, 5, 7, 9, 11, and 16 for a row of the plurality of rows,
1, 5, 7, 11, 13, and 17 for a row of the plurality of rows,
0, 1, 12, and 18 for a row of the plurality of rows,
1, 8, 10, 11, and 19 for a row of the plurality of rows,
0, 1, 6, 7, and 20 for a row of the plurality of rows,
0, 7, 9, 13, and 21 for a row of the plurality of rows,
1, 3, 11, and 22 for a row of the plurality of rows,
0, 1, 8, 13, and 23 for a row of the plurality of rows,
1, 6, 11, 13, and 24 for a row of the plurality of rows,
0, 10, 11, and 25 for a row of the plurality of rows,
1, 9, 11, 12, and 26 for a row of the plurality of rows,
1, 5, 11, 12, and 27 for a row of the plurality of rows,
0, 6, 7, and 28 for a row of the plurality of rows,
0, 1, 10, and 29 for a row of the plurality of rows,
1, 4, 11, and 30 for a row of the plurality of rows,
0, 8, 13, and 31 for a row of the plurality of rows,
1, 2, and 32 for a row of the plurality of rows,
0, 3, 5, and 33 for a row of the plurality of rows,
1, 2, 9, and 34 for a row of the plurality of rows,
0, 5, and 35 for a row of the plurality of rows,
2, 7, 12, 13, and 36 for a row of the plurality of rows,
0, 6, and 37 for a row of the plurality of rows,
1, 2, 5, and 38 for a row of the plurality of rows,
0, 4, and 39 for a row of the plurality of rows,
2, 5, 7, 9, and 40 for a row of the plurality of rows, and
1, 13, and 41 for a row of the plurality of rows.

14. The transmitter of claim 13, wherein the block size Z is identified based on a size of a bit sequence to be encoded.

15. The transmitter of claim 13, wherein the block size Z is selected based on a following block size groups:
Z1'={3, 6, 12, 24, 48, 96, 192, 384}
Z2'={11, 22, 44, 88, 176, 352}
Z3'={5, 10, 20, 40, 80, 160, 320}
Z4'={9, 18, 36, 72, 144, 288}
Z5'={2, 4, 8, 16, 32, 64, 128, 256}
Z6'={15, 30, 60, 120, 240}
Z7'={7, 14, 28, 56, 112, 224}
Z8'={13, 26, 52, 104, 208}.

16. The transmitter of claim 13, wherein the first matrix is identified based on a value of 1 in the base matrix being replaced by a second matrix.

17. The transmitter of claim 16, wherein the second matrix is identified by circularly shifting an identity matrix based on a value identified by applying a modulo operation of the block size Z to an element of a predetermined matrix.

18. The transmitter of claim 13, wherein the base matrix corresponds to 42 rows and 52 columns.

19. A receiver in a communication system or a broadcasting system, the receiver comprising:
a transceiver; and
at least one processor coupled with the transceiver and configured to identify a block size Z, identify a first matrix based on a base matrix and the block size Z, and perform a decoding procedure based on the first matrix,
wherein a column index corresponds to a non-zero element in a row of the base matrix, and a plurality of rows of the base matrix have following values as column indices:
0, 1, 2, 3, 6, 9, 10, and 11 for a row of the plurality of rows,
0, 3, 4, 5, 6, 7, 8, 9, 11, and 12 for a row of the plurality of rows, 0, 1, 3, 4, 8, 10, 12, and 13 for a row of the plurality of rows,
1, 2, 4, 5, 6, 7, 8, 9, 10, and 13 for a row of the plurality of rows,
0, 1, 11, and 14 for a row of the plurality of rows,
0, 1, 5, 7, 11, and 15 for a row of the plurality of rows,
0, 5, 7, 9, 11, and 16 for a row of the plurality of rows,
1, 5, 7, 11, 13, and 17 for a row of the plurality of rows,
0, 1, 12, and 18 for a row of the plurality of rows,
1, 8, 10, 11, and 19 for a row of the plurality of rows,
0, 1, 6, 7, and 20 for a row of the plurality of rows,
0, 7, 9, 13, and 21 for a row of the plurality of rows,
1, 3, 11, and 22 for a row of the plurality of rows,
0, 1, 8, 13, and 23 for a row of the plurality of rows,
1, 6, 11, 13, and 24 for a row of the plurality of rows,
0, 10, 11, and 25 for a row of the plurality of rows,
1, 9, 11, 12, and 26 for a row of the plurality of rows,
1, 5, 11, 12, and 27 for a row of the plurality of rows,
0, 6, 7, and 28 for a row of the plurality of rows,
0, 1, 10, and 29 for a row of the plurality of rows,
1, 4, 11, and 30 for a row of the plurality of rows,
0, 8, 13, and 31 for a row of the plurality of rows,
1, 2, and 32 for a row of the plurality of rows,
0, 3, 5, and 33 for a row of the plurality of rows,
1, 2, 9, and 34 for a row of the plurality of rows,
0, 5, and 35 for a row of the plurality of rows,
2, 7, 12, 13, and 36 for a row of the plurality of rows,
0, 6, and 37 for a row of the plurality of rows,
1, 2, 5, and 38 for a row of the plurality of rows,
0, 4, and 39 for a row of the plurality of rows,
2, 5, 7, 9, and 40 for a row of the plurality of rows, and
1, 13, and 41 for a row of the plurality of rows.

20. The receiver of claim 19, wherein the block size Z is identified based on a size of a bit sequence which is encoded.

21. The receiver of claim 19, wherein the block size Z is selected based on a following block size groups:
$Z1'=\{3, 6, 12, 24, 48, 96, 192, 384\}$
$Z2'=\{11, 22, 44, 88, 176, 352\}$
$Z3'=\{5, 10, 20, 40, 80, 160, 320\}$
$Z4'=\{9, 18, 36, 72, 144, 288\}$
$Z5'=\{2, 4, 8, 16, 32, 64, 128, 256\}$
$Z6'=\{15, 30, 60, 120, 240\}$
$Z7'=\{7, 14, 28, 56, 112, 224\}$
$Z8'=\{13, 26, 52, 104, 208\}$.

22. The receiver of claim 19, wherein the first matrix is identified based on a value of 1 in the base matrix being replaced by a second matrix.

23. The receiver of claim 22, wherein the second matrix is identified by circularly shifting an identity matrix based on a value identified by applying a modulo operation of the block size Z to an element of a predetermined matrix.

24. The receiver of claim 19, wherein the base matrix corresponds to 42 rows and 52 columns.

* * * * *